United States Patent
Kawai et al.

(10) Patent No.: US 8,193,091 B2
(45) Date of Patent: Jun. 5, 2012

(54) RESIN ENCAPSULATED SEMICONDUCTOR DEVICE AND METHOD FOR MANUFACTURING THE SAME

(75) Inventors: Fumihiko Kawai, Kyoto (JP); Toshiyuki Fukuda, Nagaokakyo (JP); Masanori Minamio, Takatsuki (JP); Noboru Takeuchi, Kyoto (JP); Shuichi Ogata, Takatsuki (JP); Katsushi Tara, Kyoto (JP); Tadayoshi Nakatsuka, Suita (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/173,900

(22) Filed: Jun. 19, 2002

(65) Prior Publication Data

US 2003/0127711 A1 Jul. 10, 2003

(30) Foreign Application Priority Data

Jan. 9, 2002 (JP) .................................. 2002-002771

(51) Int. Cl.
*H01L 23/495* (2006.01)
(52) U.S. Cl. ......... 438/666; 438/667; 438/668; 438/669
(58) Field of Classification Search ........... 257/666–669
See application file for complete search history.

(56) References Cited

U.S. PATENT DOCUMENTS

| | | | | |
|---|---|---|---|---|
| 4,862,246 A | * | 8/1989 | Masuda et al. ................. | 257/666 |
| 4,943,843 A | * | 7/1990 | Okinaga et al. ................. | 257/666 |
| 5,229,846 A | * | 7/1993 | Kozuka .......................... | 257/678 |
| 5,289,344 A | * | 2/1994 | Gagnon et al. ................. | 361/712 |
| 5,294,827 A | * | 3/1994 | McShane ....................... | 257/666 |
| 5,338,974 A | * | 8/1994 | Wisherd et al. ................ | 257/691 |
| 5,389,739 A | * | 2/1995 | Mills .............................. | 174/52.4 |
| 5,554,885 A | * | 9/1996 | Yamasaki et al. .............. | 257/666 |
| 5,557,144 A | * | 9/1996 | Rosenstock et al. ........... | 257/668 |
| 5,559,366 A | * | 9/1996 | Fogal et al. .................... | 257/666 |
| 5,631,809 A | * | 5/1997 | Takagi et al. ................... | 361/820 |
| 5,668,033 A | * | 9/1997 | Ohara et al. .................... | 438/113 |
| 5,742,096 A | * | 4/1998 | Lee ................................ | 257/666 |
| 5,808,354 A | * | 9/1998 | Lee et al. ....................... | 257/666 |
| 5,814,877 A | * | 9/1998 | Diffenderfer et al. ......... | 257/666 |

(Continued)

FOREIGN PATENT DOCUMENTS

EP 1 005 085 A2 5/2000

(Continued)

OTHER PUBLICATIONS

English translation of Japanese Notice of Reasons for Rejection issued in Japanese Patent Application No. JP 2006-148106 dated May 12, 2009.

*Primary Examiner* — James Mitchell
(74) *Attorney, Agent, or Firm* — McDermott Will & Emery LLP

(57) ABSTRACT

The present invention includes a die pad; signal leads, ground connection leads connected to the die pad; a semiconductor chip including electrode pads for grounding; metal thin wires, and an encapsulating resin for encapsulating the die pad and the semiconductor chip and encapsulating the signal leads and the ground connection lead such that lower portions of the signal leads and the ground connection lead are exposed as external terminals. The ground connection lead is connected to the electrode pad for grounding, so that the resin-encapsulated semiconductor device is electrically stabilized. Furthermore, interference between high frequency signals passing through the signal leads can be suppressed by the die pad and the ground connection leads.

20 Claims, 47 Drawing Sheets

U.S. PATENT DOCUMENTS

| | | | | |
|---|---|---|---|---|
| 5,859,387 A | * | 1/1999 | Gagnon | 174/52.2 |
| 5,898,216 A | * | 4/1999 | Steffen | 257/679 |
| 5,942,794 A | * | 8/1999 | Okumura et al. | 257/666 |
| 6,025,640 A | * | 2/2000 | Yagi et al. | 257/666 |
| 6,081,029 A | * | 6/2000 | Yamaguchi | 257/718 |
| 6,130,115 A | * | 10/2000 | Okumura et al. | 438/124 |
| 6,177,718 B1 | * | 1/2001 | Kozono | 257/666 |
| 6,197,615 B1 | * | 3/2001 | Song et al. | 438/111 |
| 6,208,023 B1 | * | 3/2001 | Nakayama et al. | 257/696 |
| 6,255,742 B1 | * | 7/2001 | Inaba | 257/796 |
| 6,291,274 B1 | * | 9/2001 | Oida et al. | 438/123 |
| 6,338,984 B2 | * | 1/2002 | Minamio et al. | 438/123 |
| 6,380,048 B1 | * | 4/2002 | Boon et al. | 438/456 |
| 6,442,990 B1 | * | 9/2002 | Komatsu et al. | 72/334 |
| 6,483,030 B1 | * | 11/2002 | Glenn et al. | 174/52.4 |
| RE38,043 E | * | 3/2003 | Shinohara et al. | 257/666 |
| 6,627,981 B2 | * | 9/2003 | Shibata | 257/678 |
| 6,633,077 B2 | * | 10/2003 | Ogata et al. | 257/676 |
| 6,642,609 B1 | * | 11/2003 | Minamio et al. | 257/666 |
| 6,696,749 B1 | * | 2/2004 | Hung et al. | 257/669 |
| 6,710,431 B2 | * | 3/2004 | Shibata | 257/669 |
| 6,713,849 B2 | * | 3/2004 | Hasebe et al. | 257/667 |
| 6,825,062 B2 | * | 11/2004 | Yee et al. | 438/106 |
| 6,967,125 B2 | * | 11/2005 | Fee et al. | 438/112 |
| 7,067,908 B2 | * | 6/2006 | Jang | 257/684 |
| 7,215,012 B2 | * | 5/2007 | Harnden et al. | 257/676 |
| 2001/0045630 A1 | * | 11/2001 | Ikenaga et al. | 257/676 |
| 2002/0000327 A1 | * | 1/2002 | Juso et al. | 174/250 |
| 2002/0024122 A1 | * | 2/2002 | Jung et al. | 257/666 |
| 2002/0024127 A1 | * | 2/2002 | Sakuraba et al. | 257/686 |
| 2002/0027297 A1 | * | 3/2002 | Ikenaga et al. | 257/784 |
| 2002/0031869 A1 | * | 3/2002 | Minamio et al. | 438/127 |
| 2002/0041011 A1 | * | 4/2002 | Shibata | 257/667 |
| 2002/0047185 A1 | * | 4/2002 | Carter et al. | 257/666 |
| 2002/0047187 A1 | * | 4/2002 | Nakajima et al. | 257/666 |
| 2002/0048851 A1 | * | 4/2002 | Ikenaga et al. | 438/113 |
| 2002/0084518 A1 | * | 7/2002 | Hasebe et al. | 257/676 |
| 2002/0177256 A1 | * | 11/2002 | Lee | 438/111 |
| 2002/0197826 A1 | * | 12/2002 | Kim et al. | 438/460 |
| 2003/0038358 A1 | * | 2/2003 | Chiu et al. | 257/687 |
| 2003/0164554 A1 | * | 9/2003 | Fee et al. | 257/787 |

FOREIGN PATENT DOCUMENTS

| | | | |
|---|---|---|---|
| EP | 1 032 037 A2 | | 8/2000 |
| GB | 0503769 | * | 9/1992 |
| JP | 358124256 | * | 7/1983 |
| JP | 361008960 | * | 1/1986 |
| JP | 361085847 | * | 5/1986 |
| JP | 401220466 | * | 9/1989 |
| JP | 4-369859 | * | 12/1992 |
| JP | 4-3696859 | * | 12/1992 |
| JP | 05-243474 | | 9/1993 |
| JP | 7-240494 A | | 9/1995 |
| JP | 09-153577 | | 6/1997 |
| JP | 9-213868 A | | 8/1997 |
| JP | 9-283690 | | 10/1997 |
| JP | 11-008335 | | 1/1999 |
| JP | 11-74404 | * | 3/1999 |
| JP | 11-307707 | | 11/1999 |
| JP | 11-340409 | | 12/1999 |
| JP | 2000-31364 A | | 1/2000 |
| JP | 2000-196005 | | 7/2000 |
| JP | 2000-260908 | | 9/2000 |
| JP | 2000-299423 | | 10/2000 |
| JP | 2000-299423 A | | 10/2000 |
| JP | 2000-307045 A | | 11/2000 |
| JP | 2001-24140 A | | 1/2001 |
| JP | 2001-345411 | | 12/2001 |
| JP | 2001-358279 | | 12/2001 |
| JP | 02001358279 | * | 12/2001 |
| WO | WO 99/00826 | | 1/1999 |

\* cited by examiner

FIG. 40A
FIG. 40B
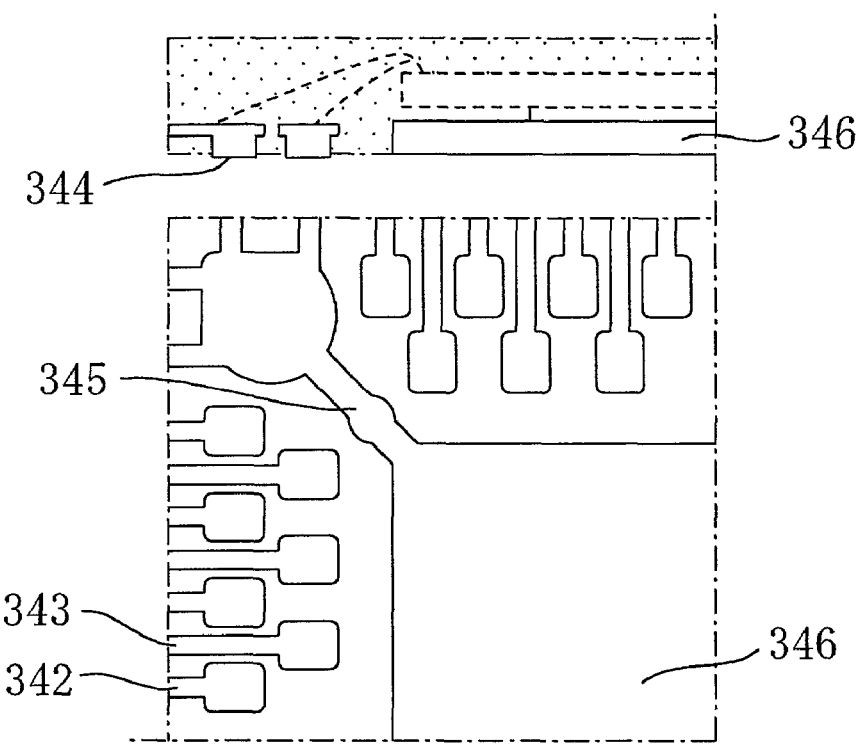
FIG. 40C
FIG. 40D
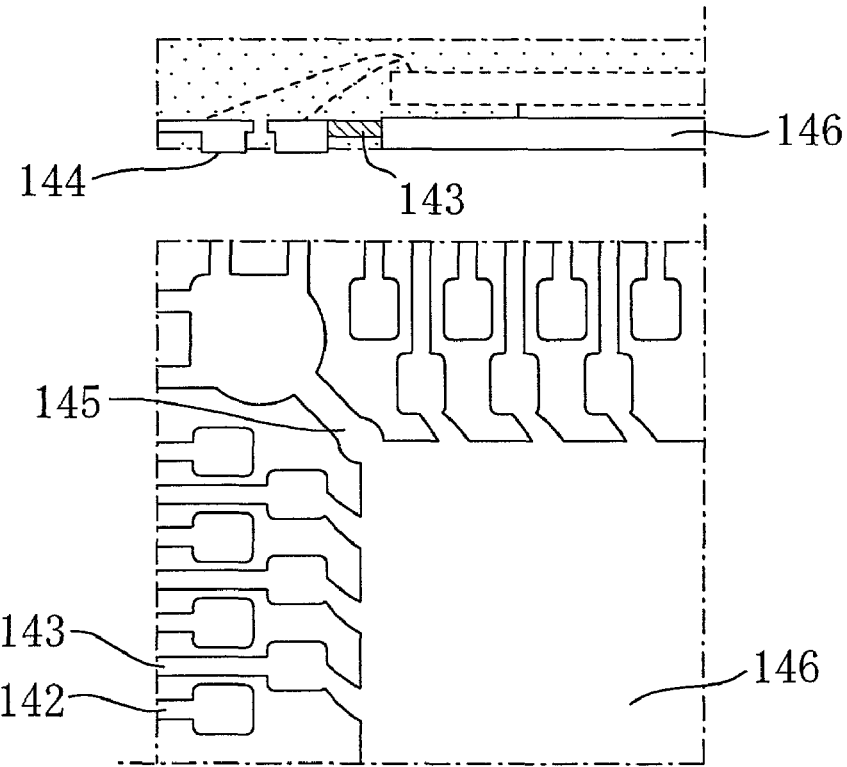

FIG. 42A
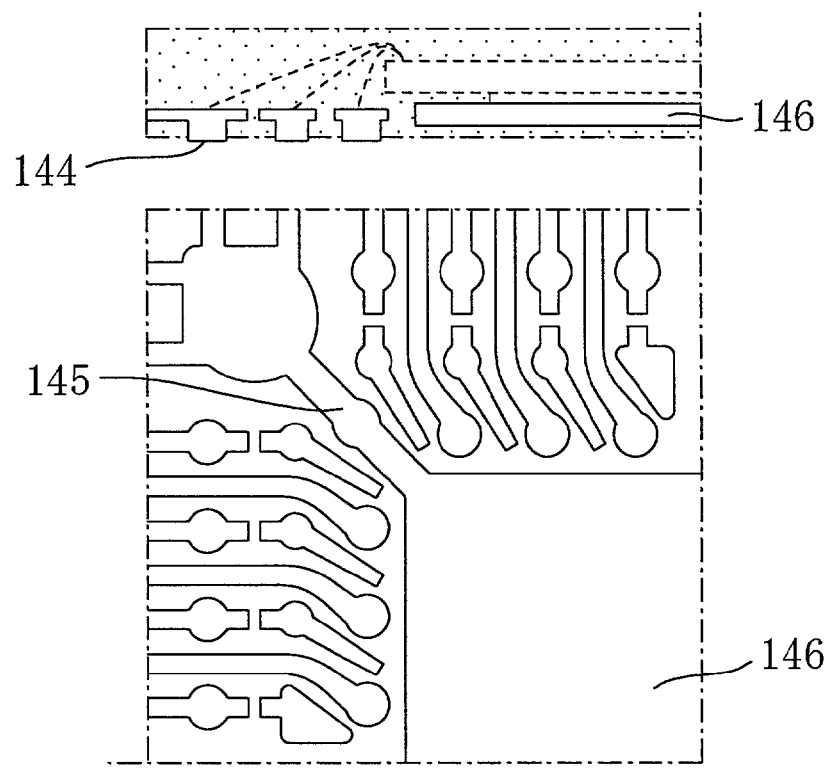
FIG. 42B
FIG. 42C
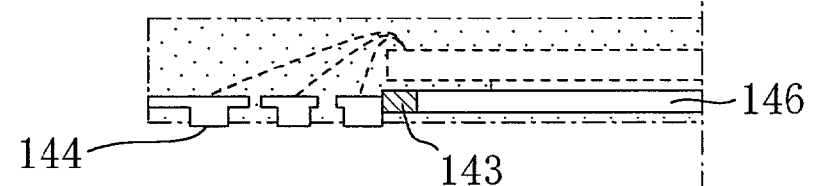
FIG. 42D
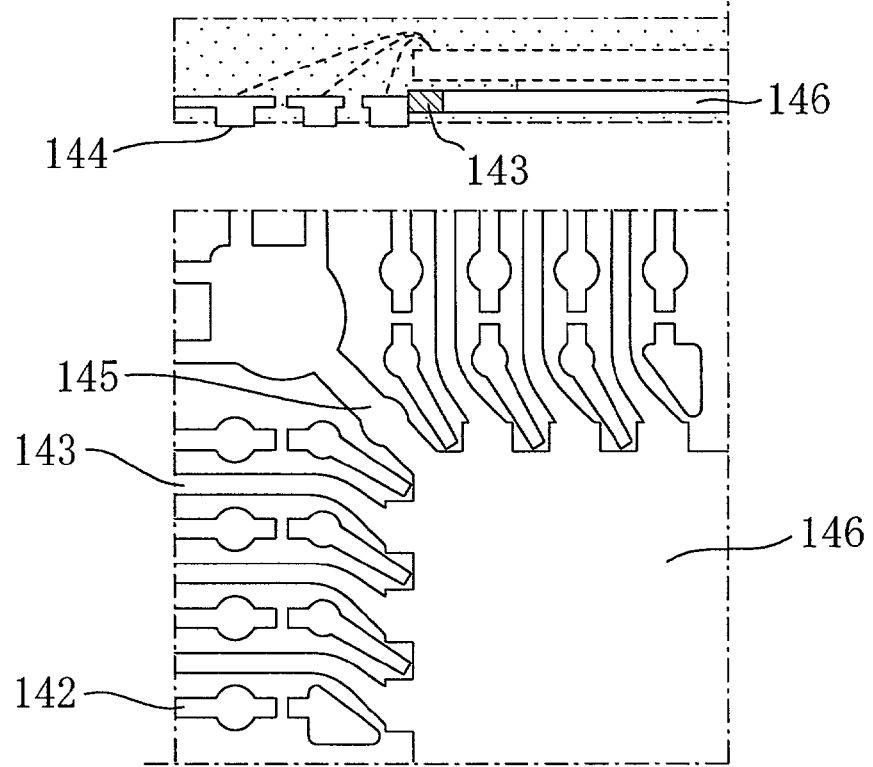

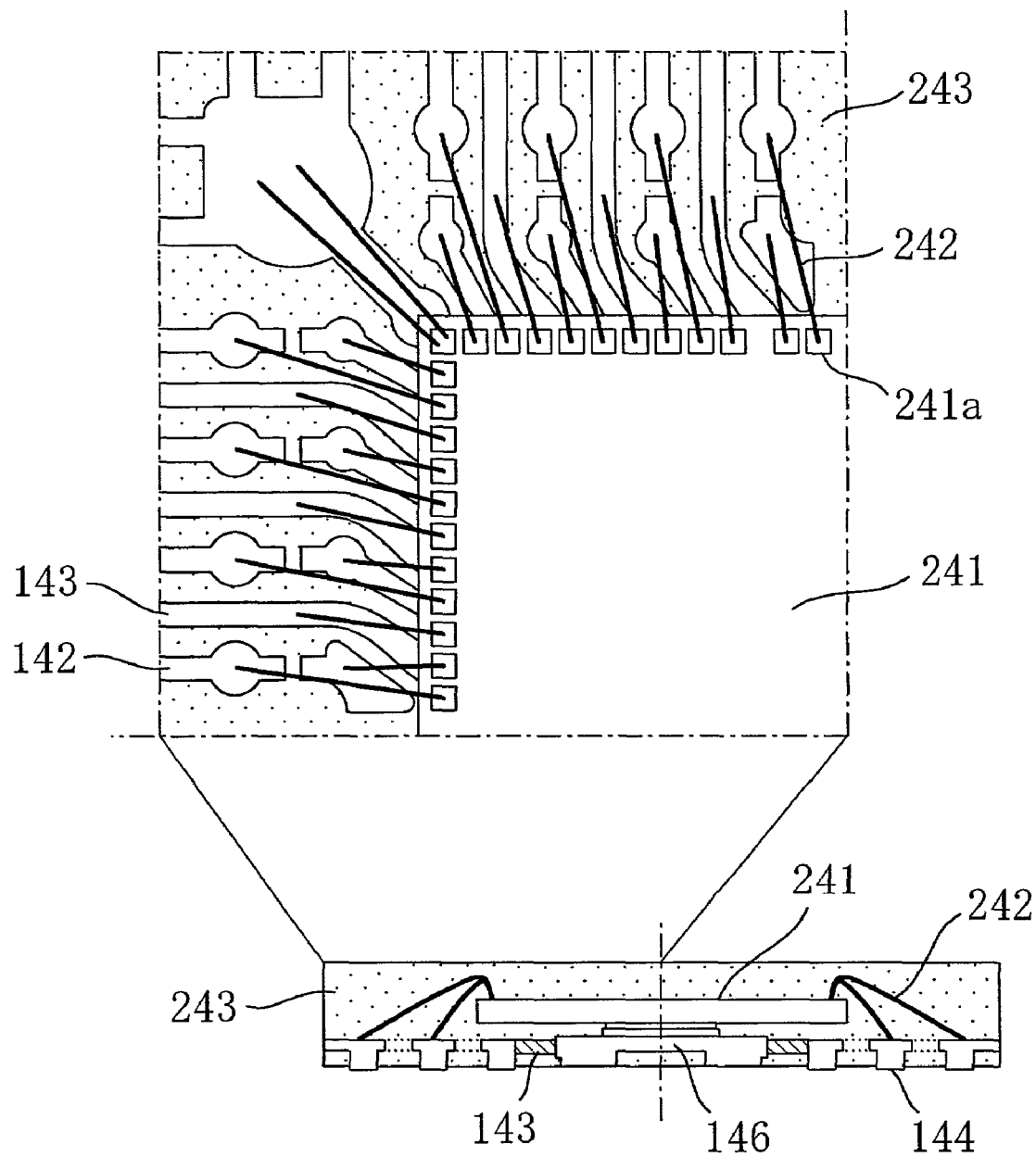

RESIN ENCAPSULATED SEMICONDUCTOR DEVICE AND METHOD FOR MANUFACTURING THE SAME

BACKGROUND OF THE INVENTION

The present invention relates to a lead frame, a method for manufacturing the same, a resin-encapsulated semiconductor device in which the lead frame and a semiconductor chip are encapsulated with resin, and a method for manufacturing the same. In particular, the present invention relates to a resin-encapsulated semiconductor device manufactured to achieve electrical stability and to improve the high frequency characteristics, a method for manufacturing the same, a lead frame used in the resin-encapsulated semiconductor device, and a method for manufacturing the same.

In recent years, in response to compactness and high density of electronic equipment, there is an demand for high density and high performance of semiconductor components such as resin-encapsulated semiconductor devices, and this trend has promoted the development of more compact and thinner semiconductor components. In this context, a semiconductor device called QFP (Quad Flat Package) in which external terminals are extending outside the encapsulating resin has been improved, and a resin-encapsulated semiconductor device called QFN (Quad Flat Non-leaded Package) or LGA (Land Grid Array) in which lower portions of signal leads that are exposed from a package serves also as an external terminal have been put into practice.

Such a compact and thin resin-encapsulated semiconductor device can be utilized in a communication system employing high frequency. In particular, in mobile communications through cellular phones, PDAs (Personal Digital Assistance) or the like, it is necessary to use a high frequency of 1 GHz or more in order to transmit data with large capacity. For example, in cellular phones, communications in a 1.5 GHz band with WCDMA (wide band CDMA) system will become the main stream in the future. In the resin-encapsulated semiconductor device used in these applications, a semiconductor chip made of a compound semiconductor such as GaAs (gallium arsenic) and SiGeC (silicon germanium carbon) having good high frequency characteristics can be used preferably. In addition, it is necessary to take a measure not to inhibit the characteristics of the semiconductor chip in packaging.

Apart from this, for semiconductor devices, it is generally necessary to stabilize the electrical characteristics by ensuring connection to a ground power. In order to achieve the stability of the electrical characteristics of the resin-encapsulated semiconductor device, in a conventional QFP including a die pad, a semiconductor chip provided on the upper surface of the die pad, suspended leads for supporting the die pad, and signal leads spaced equally apart from each other around the die pad, stable power grounding has been achieved by connecting an electrode pad for grounding on the semiconductor chip and a space portion of the die pad, or the electrode pads and the suspended leads with metal thin wires. Such a structure is also applied to QFN or LGA, as discussed later.

FIG. 46A is a plan view taken from the bottom of a conventional QFN resin-encapsulated semiconductor device. FIG. 46B is a cross-sectional view taken along line XLVIb-XLVIb of the conventional resin-encapsulated semiconductor of FIG. 46A. FIG. 46C is a cross-sectional view taken along line XLVIc-XLVIc of the conventional resin-encapsulated semiconductor of FIG. 46A.

Each of FIGS. 45A and 45B is a view showing an example of a lead frame used in the conventional resin-encapsulated semiconductor device.

As shown in FIGS. 46A to 46C, the conventional QFN resin-encapsulated semiconductor device has a substantially quadrangular bottom surface, and includes a die pad 306, a semiconductor chip 401 mounted on the die pad 306 and having a plurality of electrode pads, a plurality of signal leads 302 that are arranged around the die pad 306 and whose lower surfaces are exposed, metal thin wires 402 connecting the electrode pads of the semiconductor chip 401 and the signal leads 302, suspended leads 305 for supporting the die pad 306, encapsulating resin 403 for encapsulating the upper surface of the signal leads 302, the die pad 306, the metal thin wires 402, and the semiconductor chip 401. In FIG. 46A, the die pad 306 and the suspended leads 305 that are encapsulated are shown by dotted lines. The signal leads 302 are arranged along the four sides of the bottom surface of the device. This type of resin-encapsulated semiconductor device is called "peripheral type". The suspended leads 305 are exposed in the four corners of the bottom surface of the resin-encapsulated semiconductor device. The suspended leads 305 are connected to the die pad 306 and connected to the electrode pads for grounding of the semiconductor chip 401 by the metal thin wires 402. Thus, the conventional QFN resin-encapsulated semiconductor device is electrically stabilized, as described above.

As shown in FIGS. 45A and 45B, the lead frame used in the conventional QFN resin-encapsulated semiconductor device has the suspended leads 305 having steps 305a that are bent upward, and the upper surface of the die pad 306 is provided in a higher position than the upper surface of the signal leads 302. Thus, a larger semiconductor chip can be mounted on the die pad 306. Furthermore, since the steps 305a are provided, the clamping force applied when resin encapsulation is performed can escape, which prevents the die pad 306 from being dislocated or deformed. Each of the signal leads 302 has a head groove 302b and a base groove 302c, which allows the signal leads 302 to absorb a stress, so that the metal thin wires are hardly broken in the resin-encapsulated semiconductor device. The broken line that surrounds the lead frame in FIGS. 45A and 45B is an outer line 307 of the resin-encapsulated semiconductor device.

Next, FIG. 47A is a perspective view showing an appearance of a conventional LGA resin-encapsulated semiconductor device that is an area array package. FIG. 47B is a cross-sectional view showing the structure of the conventional resin-encapsulated semiconductor device. FIG. 47C is a plan view taken from the bottom surface of the conventional resin-encapsulated semiconductor device.

As shown in FIGS. 47A to 47C, the LGA resin-encapsulated semiconductor device has, for example, a quadrangular bottom surface, and includes a die pad 346, a semiconductor chip 441 mounted on the upper surface of the die pad 346 and having electrode pads, signal leads 342 arranged around the die pad 346, metal thin wires 442 connecting the electrode pads and the signal leads 342, and an encapsulating resin 443 for encapsulating the signal leads 342 on its upper surface side, the die pad 346, the semiconductor chip 441, and the metal thin wires 442. In the bottom surface of the resin-encapsulated semiconductor device, the lower portions of the signal leads 342 are exposed in a circular shape, and they serve as external terminals 344, which are arranged in a matrix. The portion of the die pad 346 excluding the central portion is exposed on the bottom surface of the device. The external terminals that are located in the four corners of the bottom surface among the external terminals 344 are large in size, and used as reinforcement lands serving also as ground terminals 344a. Since the reinforcement lands serving also as ground terminals 344a are connected to the electrode pads for grounding of the semiconductor chip, this resin-encapsulated semiconductor device is electrically stabilized.

Other that those described above, there is SON (Small Outline Non-leaded Package), which has a quadrangular bottom surface in which external terminals are arranged along the opposing sides of the bottom surface, as a resin-encapsulated semiconductor device in which the lower portions of the signal leads function as external terminals. This package is also stabilized electrically in a similar manner.

However, the conventional structures require advanced processing techniques for the lead frame, which is the basic frame of a semiconductor device, in order to reduce the size of the resin-encapsulated semiconductor device and achieve higher density, so that it has been difficult to realize them.

On the other hand, in the structures of the conventional resin-encapsulated semiconductor devices, it is difficult to obtain high frequency characteristics sufficient to be used in high frequency communications or the like. This is mainly because when high frequency signals are input to external terminals adjacent to each other of the resin-encapsulated semiconductor device, the high frequency signals interfere with each other, which causes noise.

For electronic components mounted in a set of equipment such as communication equipment, further higher frequencies are increasingly in demand, and the effects of the noise as described above become large.

SUMMARY OF THE INVENTION

Therefore, with the foregoing in mind, it is an object of the present invention to provide a resin-encapsulated semiconductor device that has stable electrical characteristics and excellent high frequency characteristics, even if it becomes more compact and thinner, a method for manufacturing the resin-encapsulated semiconductor device, and a lead frame used in the resin-encapsulated semiconductor device.

A lead frame of the present invention includes a framing portion; a die pad on which a semiconductor chip is to be mounted on the upper surface thereof; a plurality of signal leads connected to the framing portion; and at least one ground connection lead connected to the framing portion and the die pad, wherein at least a portion of a lower portion of the signal leads and the ground connection lead serve as an external terminal.

Thus, since the ground connection leads connected to the die pad are provided, it is possible to manufacture a resin-encapsulated semiconductor device having electrical stability and better high frequency characteristics than those of conventional devices by using the lead frame of the present invention.

At least a portion of the signal leads and the ground connection lead are arranged alternately, so that the signal leads can be surrounded by the ground connection leads and the die pad, so that a resin-encapsulated semiconductor device having further improved high frequency characteristics can be manufactured.

Each ground connection lead has a step portion, and a groove is formed on a lower surface of a rising portion of the step portion, so that the angle of the end face of the groove portion can be shape. Therefore, for example, when encapsulating the upper surface of the lead frame to which a sealing tape is attached on its lower surface, the resin can be prevented from penetrating into the gap between the sealing tape and the ground connection lead. In other words, resin burr can be prevented from being formed under the external terminal.

At least a portion of an upper surface of the die pad is higher than an upper surface of the signal leads by 0.03 mm or more and not more than 3/4 of the thickness of the lead frame, so that it is possible to mount the semiconductor chip while overlapping the signal leads in such a manner that the principal surface of the semiconductor chip faces the signal leads. When the set-up height is smaller than 0.03 mm, it is difficult to encapsulate the die pad on its lower surface side with resin reliably. In the case where steps are formed by semi-cutting processing and etching, when the set-up height is more than 3/4 of the thickness of the lead frame, the processing is difficult to perform. Therefore, when the setup height is 0.03 mm or more and not more than 3/4 of the thickness of the lead frame, so that a resin-encapsulated semiconductor device of the present invention having stable quality can be obtained.

The step portion of the ground connection lead is formed by at least one processing method selected from the group consisting of press pressing, semi-cutting processing, crushing processing and etching.

An upper surface of an area from the die pad to the step portion of the ground connection lead is substantially smooth, and a step can be formed in a lower portion of the step portion.

The step portion is formed by press processing and crushing processing, and the size in the short direction of the step portion is larger than that in the short direction of the ground connection lead, so that the adherence between the encapsulating resin and the lead frame can be improved when encapsulating the lead frame on its upper surface side with resin, and therefore peeling or cracks can be prevented from occurring in a portion in which encapsulating resin is thin, such as the lower side of the step portion.

The size in the short direction of at least a portion of the step portion is smaller than that in the short direction of a portion excluding the step portion of the ground connection lead, so that a stress applied to the connection leads or the die pad during resin encapsulation can be absorbed effectively. Thus, deformation of the die pad can be suppressed.

The lead frame of the present invention may further include a suspended lead for supporting the die pad.

The size in the short direction of the at least one ground connection lead is not less than twice the size in the short direction of the signal lead, so that the heat release properties can be improved and the ground power can be obtained more stably.

The lead frame of the present invention further includes a suspended lead for supporting the die pad, wherein at least a portion of a lower portion of the suspended lead serves as a reinforcement land for reinforcing external terminals, and the external terminals are arranged around the die pad in two or more rows. This makes it possible to manufacture a resin-encapsulated semiconductor device that is a so-called LGA using this.

A resin-encapsulated semiconductor device of the present invention includes a die pad; a semiconductor chip mounted on an upper portion of the die pad and including pads for grounding and electrode pads; signal leads provided around the die pad; ground connection leads connected to the die pad; a connecting member; and an encapsulating resin for encapsulating the semiconductor chip, the die pad, and the connecting member and encapsulating the signal leads and the ground connection lead such that at least a portion of a lower portion of the signal leads and the ground connection leads are exposed as external terminals.

According to this configuration, for example, when the ground connection lead is connected to the pad for grounding, since a lower portion of the ground connection lead serves as an external terminal and is connected to the ground power, an electrically stable resin-encapsulated semiconductor device can be realized. Furthermore, when high frequency signals are transmitted to the signal leads, the interference between the signals can be reduced by the ground connection lead and the die pad, so that a resin-encapsulated semiconductor device having a reduced insertion loss of the high frequency signals can be realized. Furthermore, this configuration makes it possible to support the die pad with the ground connection leads without providing the suspended lead.

The connecting member connects between the signal leads and the electrode pads and between at least one of the ground connection leads and the pads for grounding, so that a resin-encapsulated semiconductor device having a reduced insertion loss of the high frequency signals can be realized.

At least one of the signal leads is surrounded by the ground connection leads adjacent thereto and the die pad, so that the interference between the high frequency signals passing through the signal leads can be reduced effectively, and therefore the high frequency characteristics of a resin-encapsulated semiconductor device can be improved further.

The connecting member is a metal thin wire, and the length of the external terminal is shorter than the metal thin wire, so that for example, a resin-encapsulated semiconductor device having a significantly reduced insertion loss of high frequencies, which cannot be realized when the ground connection lead is provided in a resin-encapsulated semiconductor device, having a metal wire longer than that of an external terminal such as QFP, can be realized.

Furthermore, the resin-encapsulated semiconductor device of the present invention may further include a suspended lead connected to the die pad.

In this case, the suspended lead is connected to the pad for grounding by the connecting member, so that the interference between high frequency signals can be reduced when the signals pass through the signal lead adjacent to the suspended lead.

At least a portion of the die pad is exposed, and a lower surface of a portion near a connection portion with the die pad of the ground connection lead may be bent upward.

If an upper surface of a portion near a connection portion with the die pad of the ground connection lead is bent upward, the semiconductor chip can be supported at the bent portions, which makes it possible to mount a larger semiconductor chip than when the bent portions are not provided.

The connecting member is a metal bump, and the principal surface of the semiconductor chip is opposed to an upper surface of the die pad, so that the path through which electrical signals travel can be shortened, and the high frequency characteristics of the resin-encapsulated semiconductor device of the present invention can be improved further.

The suspended lead functions as a reinforcement terminal for the external terminal, and a shape of the external terminal is selected from the group consisting of a circle, substantially an ellipse and substantially a rectangle.

The external terminals may be arranged around the die pad in two or more rows. In this case, a resin-encapsulated semiconductor device having an ever shorter distance from the semiconductor chip to the external terminal can be obtained.

At least one semiconductor element mounted on the semiconductor chip amplifies or attenuates power in a frequency of 1.5 GHz or more, so that the resin-encapsulated semiconductor device of the present invention can be applied to equipment employing high frequency signals such as cellular phones.

A method for manufacturing a lead frame of the present invention is a method for manufacturing a lead frame including a die pad, and a ground connection lead connected to the die pad, and includes the steps of: (a) forming a plurality of grooves in a lower portion near a connection portion with the die pad of the ground connection lead, and (b) forming a step portion by bending a portion between the plurality of grooves upward by press processing.

This method allows the angle of the end portion of the external terminal on the die pad side to be sharp, so that resin burr is prevented from being generated on the lower surface of the external terminal when resin encapsulation is performed later.

A method for manufacturing a resin-encapsulated semiconductor device of the present invention is a method for manufacturing a resin-encapsulated semiconductor device including a die pad, a ground connection lead connected to the die pad, and a semiconductor chip having a pad for grounding, a portion of a lower portion of the ground connection lead functioning as an external terminal, and the method includes the steps of (a) attaching a sealing tape onto a lower portion of a lead frame including a ground connection lead that has an upwardly-bent step portion in a portion near a connection portion with the die pad and in which a groove is formed in a lower portion of a rising portion of the step portion, (b) forming a connecting member for connecting a pad for grounding of the semiconductor chip and the ground connection lead after the step (a), and (c) performing resin encapsulation in such a manner that the external terminal is not covered with an encapsulating resin after the step (b).

According to this method, since in the step (a), the sealing tape is attached onto the lower surface of the lead frame, and the angle of the lower portion of the rising portion is sharp, the encapsulating resin can be prevented effectively from penetrating onto the lower surface of the external terminals in the step (c). In other words, this method makes it possible to manufacture a resin-encapsulated semiconductor device having no resin burr on the external terminal can be manufactured.

BRIEF DESCRIPTION OF THE DRAWINGS

FIGS. 40A and 40B are a cross-sectional view showing the left half of a lead frame for a conventional LGA, and a plan view showing a quarter of the lead frame for the conventional LGA, respectively, and FIGS. 40C and 40D are a cross-sectional view showing the left half of a lead frame used in a resin-encapsulated semiconductor device of a fourth embodiment of the present invention, and a plan view showing a quarter of the lead frame used in the resin-encapsulated semiconductor device of the fourth embodiment, respectively.

FIGS. 42A and 42B are a cross-sectional view showing the left half of a variation of the lead frame for a conventional LGA, and a plan view showing a quarter of the variation of the lead frame, respectively, and FIGS. 42C and 42D are a cross-sectional view showing the left half of a variation of the lead frame used in the resin-encapsulated semiconductor device of the fourth embodiment, and a plan view showing a quarter of the lead frame used in the resin-encapsulated semiconductor device, respectively.

FIG. 43 shows a plan view showing a variation of the resin-encapsulated semiconductor device of the fourth embodiment and a cross-sectional view of the variation.

DETAILED DESCRIPTION OF THE INVENTION

First Embodiment

As a first embodiment of the present invention, a lead frame and a resin-encapsulated semiconductor device that is QFN manufactured with the lead frame will be described.
—Description of Lead Frame—
First, the lead frame used in the QFN resin-encapsulated semiconductor device of the first embodiment of the present invention (hereinafter, referred to as "the lead frame of this embodiment) will be described.

Figure 1A:
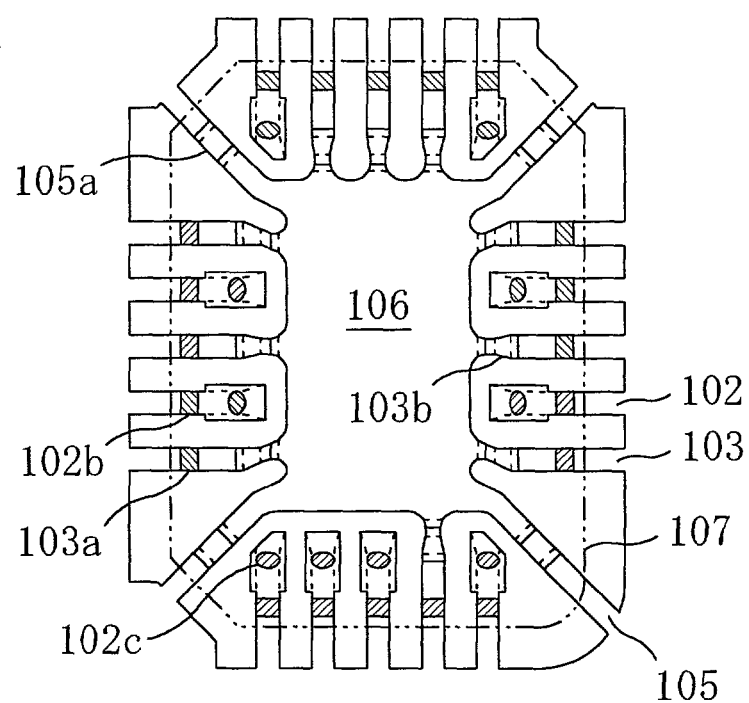
FIGS. 1A and 1B are views showing an example of a lead frame according to a first embodiment of the present invention.
Figure 1B:
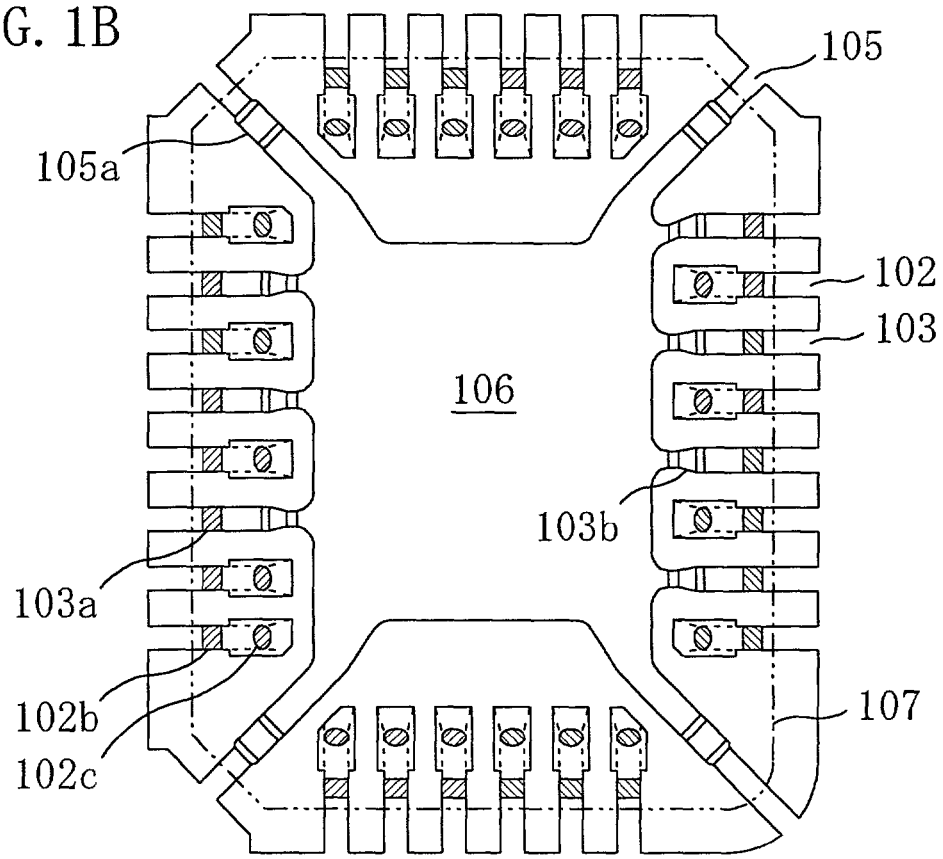

FIGS. 1A and 1B are views showing an example of the lead frame of this embodiment. As shown in FIG. 1A, within each framing portion, the lead frame of this embodiment includes a die pad 106 on which a semiconductor chip is to be mounted, suspended leads 105 for supporting the die pad 106, a plurality of signal leads 102 arranged around the die pad 106 that are connected to the framing portion, and ground connection leads 103 that are connected to the die pad 106 and the framing portion. The signal leads 102 have head grooves 102b and base grooves 102c.

These grooves protect the resin-encapsulated semiconductor device of this embodiment from a bending stress applied from a mother substrate after the resin-encapsulated semiconductor device of this embodiment is mounted on a circuit board of electronic equipment, and so that metal thin wires can be prevented from being broken. More specifically, when the mother substrate is deformed by external force or the like, detachment of the metal thin wires from the signal leads stops at the groove portions, and thus the metal thin wires are prevented from being broken.

The suspended leads 105 have step portions 105a, and supports the die pad 106 in a position higher than the signal leads 102 by, for example, bending. The dashed double dotted line surrounding the signal leads 102 indicates the outline 107 of the resin-encapsulated semiconductor device, and shows an area that is encapsulated with resin.

The lead frame of this embodiment is characterized in that the ground connection leads 103 connected to the die pad 106 are provided. The ground connection leads 103 have grooves 103a in substantially the same position as the head grooves 102b of the signal leads 102, and ground connection lead step portions 103b in a portion near the die pad 106.

Figure 2A:
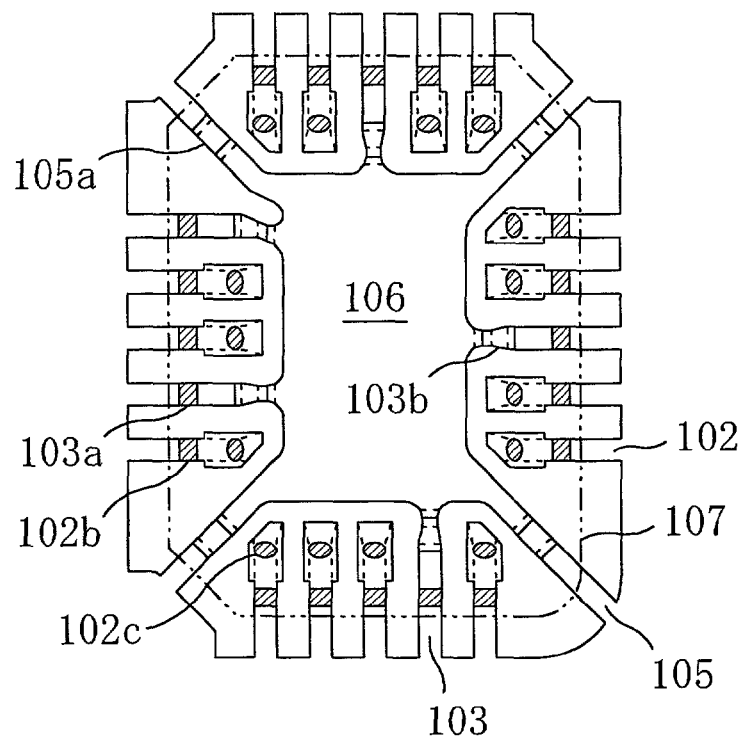
FIGS. 2A and 2B are views showing an example of a lead frame according to the first embodiment.
Figure 2B:
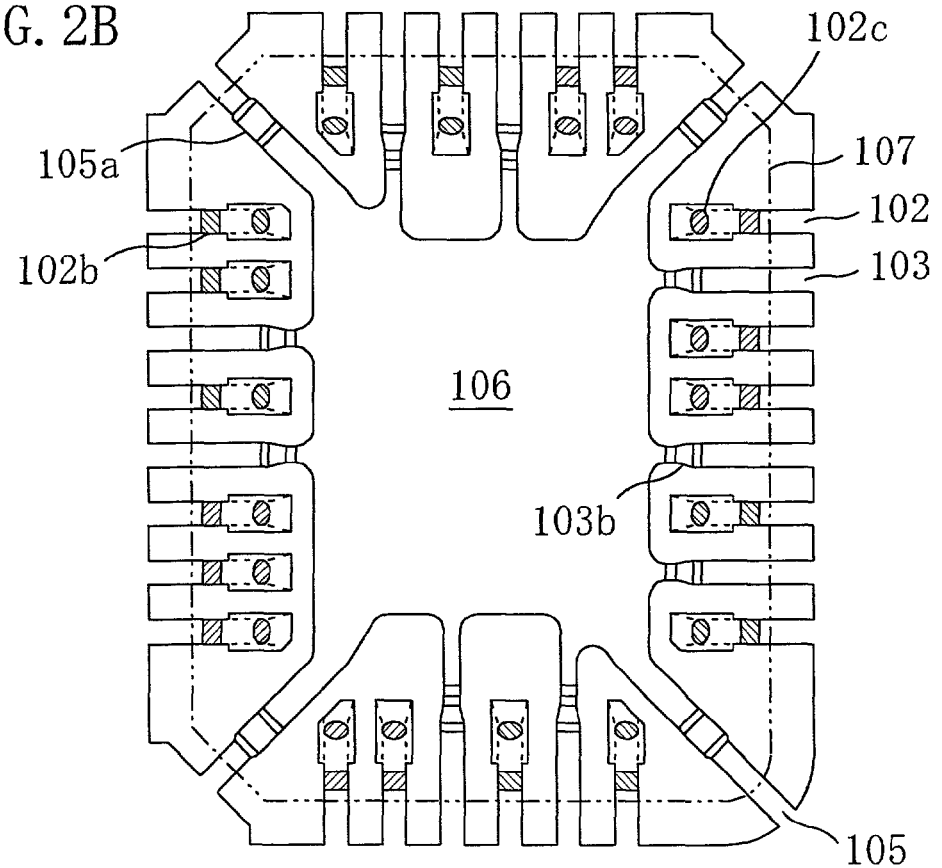

FIGS. 2A and 2B are views showing examples of the lead frame of this embodiment. As shown in FIGS. 2A and 2B and FIG. 1B, the position and the number of the ground connection leads 103 can be selected arbitrarily. More specifically, as shown in FIG. 1A, the ground leads 103 and the signal leads 102 can be arranged alternately, or one ground connection leads 103 for every two or three signal leads 102 can be provided.

As described in details later, in order to stabilize the electrical characteristics of the resin-encapsulated semiconductor device, there is no limitation regarding the arrangement of the ground connection leads 103, whereas in order to improve the high frequency characteristics, it is preferable to provide the ground connection leads 103 and the signal leads 102 as alternately as possible, as shown in FIG. 1A.

The distance between the ground connection leads 103 and the signal leads 102 or the distance between the signal leads 102 is not necessarily constant, but it is practically preferable that the distance is constant and is matched to the specifications of the existing packages.

As shown in FIGS. 1A and 1B, the width of the portion of the ground connection lead 103 that is near the connection portion with the die pad 106 is reduced in order to reduce the stress applied when the ground connection lead 103 is processed so as to be provided with a step.

Figure 3:
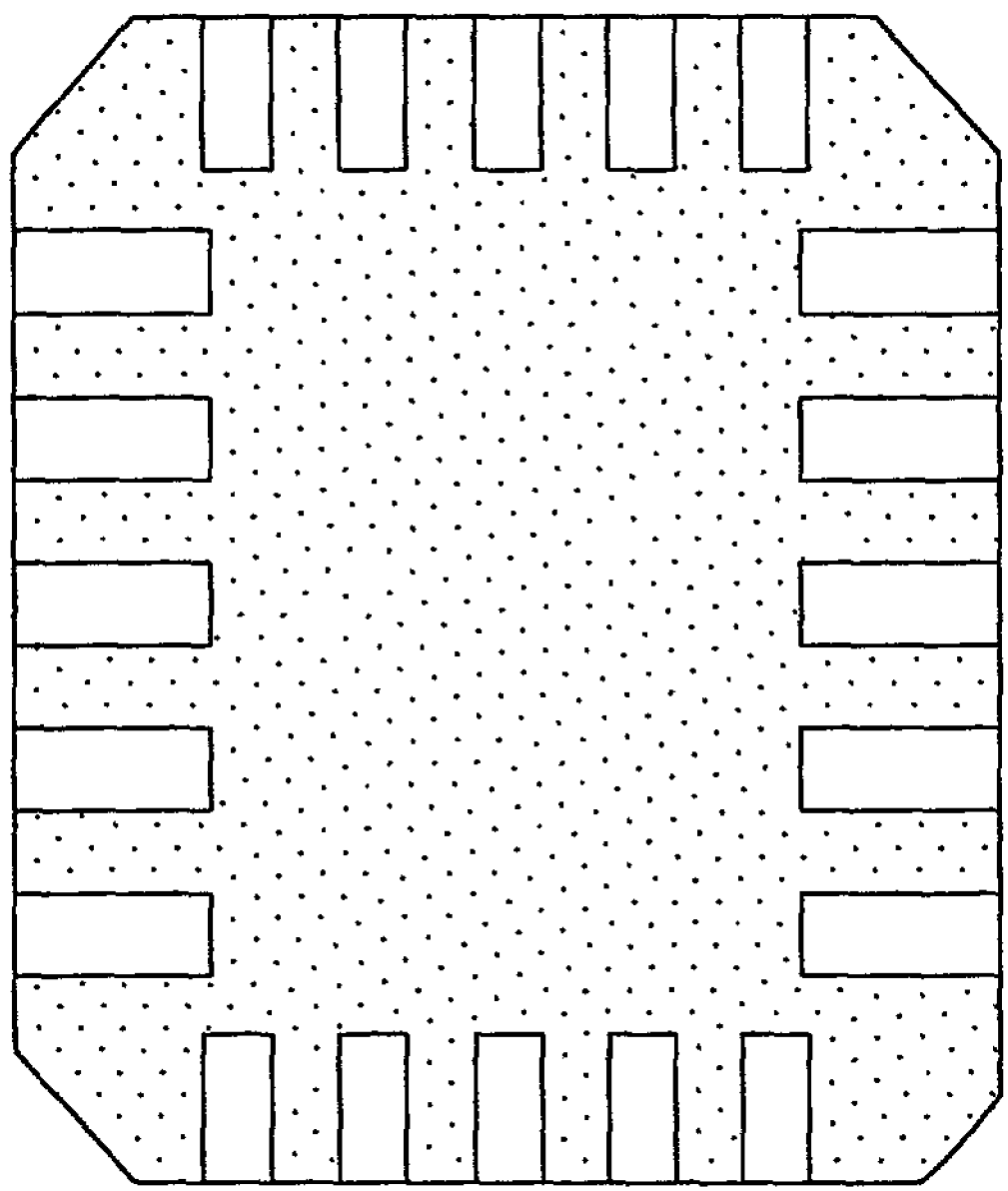
FIG. 3 is a plan view showing a resin-encapsulated semiconductor device employing the lead frame of the first embodiment.

FIG. 3 is a plan view showing the bottom surface of the resin-encapsulated semiconductor device employing the lead frame of this embodiment. As shown in FIG. 3, even if the lead frames shown in FIGS. 1A, 1B, 2A and 2B are used, a resin-encapsulated semiconductor device that is apparently the same as the conventional one can be manufactured. In other words, if the lead frame of this embodiment is used, there is no need of changing the specification of the package and thus there is also no need of changing the peripheral apparatuses.

Figure 4A:
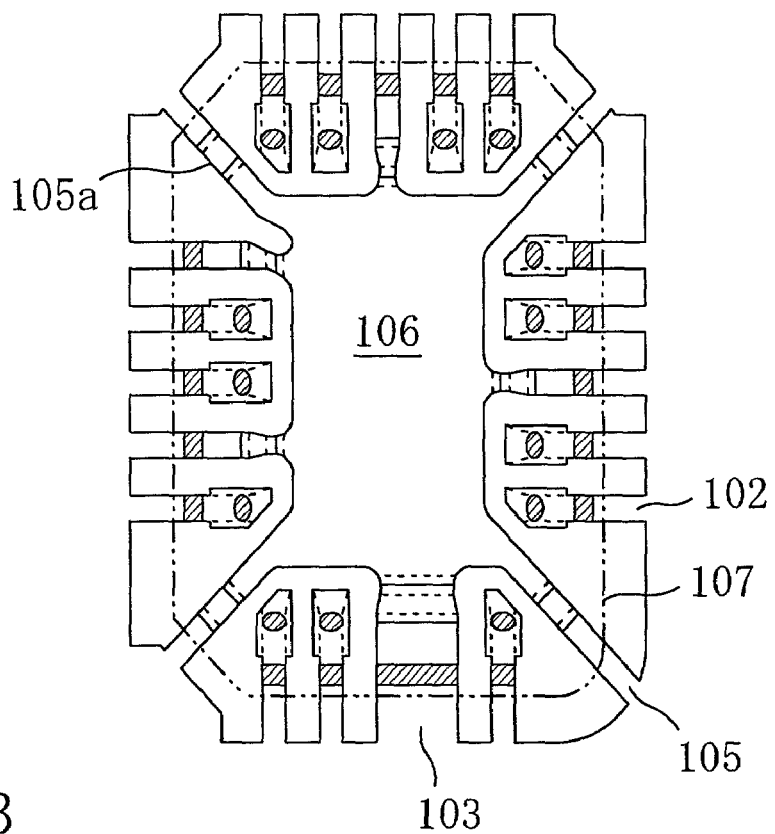
FIGS. 4A and 4B are views showing a variation of the lead frame according to the first embodiment, and a plan view showing a resin-encapsulated semiconductor device manufactured using the lead frame, respectively.
Figure 4B:
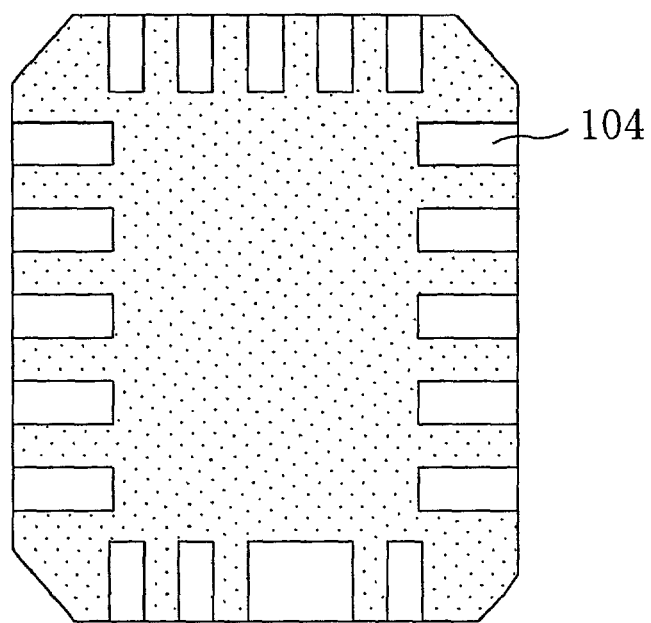

FIGS. 4A and 4B are a view showing a variation of the lead frame of this embodiment, and a plan view showing the bottom surface of the resin-encapsulated semiconductor device manufactured with the lead frame, respectively.

As shown in FIG. 4A, the width in the short direction of the ground connection lead 103 may be a width resulting from the addition of two signal leads 102 and the gap between the two signal leads 102. Herein, in the ground connection leads 103, the direction toward the die pad 106 refers to the longitudinal direction, and the direction orthogonal thereto refers to the short direction. As shown in FIG. 4B, as the signal leads 102 becomes wider, the width of the external terminals exposed on the bottom surface of the resin-encapsulated semiconductor device becomes larger. This makes it possible to improve the heat release properties of the device and improve the stability of the power for grounding. Furthermore, the positions and the widths of other external terminals are the same as those of the conventional ones, so that in the variation of the resin-encapsulated semiconductor device of this embodiment, the same specifications as those of the conventional devices can be used. The area or the shape of the exposed external terminal can be determined freely without complying the conventional specifications.

Next, the structure of the entire lead frame will be described.

Figure 5:
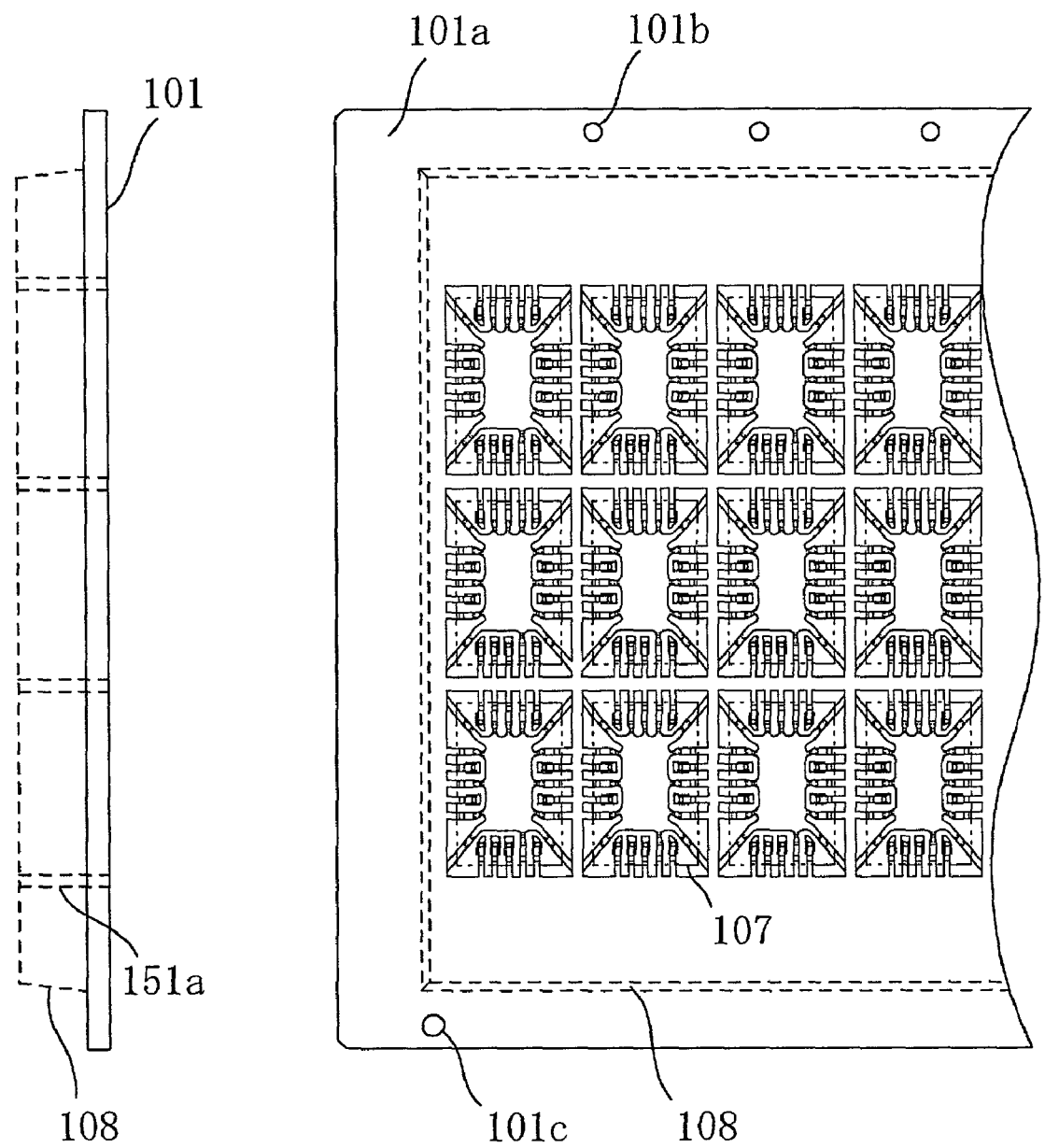
FIG. 5 is a view illustrating the structure of the entire lead frame of the first embodiment.

FIG. 5 is a view illustrating the structure of the entire lead frame of this embodiment. The drawing on the right side from the center of FIG. 5 is a plan view, and the drawing on the left side is a side view when viewed from the side in the plan view.

As shown in FIG. 5, the lead frame of this embodiment has an inner frame portion in which multiple framing portions are arranged in a matrix, and an outer frame portion 101a in which circular registration holes 101b provided along the upper side when assuming that the short direction corresponds to the vertical direction, and elliptic registration holes 101c provided on the lower side are formed. The double dashed lines shown in the plan view denote a mold line 108 indicating an area that is to be encapsulated with resin later. The broken line in the side view indicates an area in which the resin-encapsulated semiconductor device is to be formed. The signal leads in the adjacent framing portions are supported by a coupling bar in a device separation line 151a and form a shape that resembles the backbone of an animal.

The lead frame of this embodiment is a lead frame for so-called batch molding. That is to say, a large number of semiconductor chips are mounted on one lead frame, and resin encapsulation is performed for the entire lead frame and then the lead frame is diced to manufacture a large number of resin-encapsulated semiconductor devices at the same time.

In the lead frame of this embodiment, the size of each framing portion varies with the side of the resin-encapsulated semiconductor device, and the number of the resin-encapsulated semiconductor devices that are manufactured from one lead frame varies. The number of external terminals (the number of the signal leads) and the design are changed in accordance with the specifications of the resin-encapsulated semiconductor device.

The size of the lead frame of this embodiment can be 30 to 80 mm in the short direction (the vertical direction in FIG. 5), and 50 to 300 mm in the longitudinal direction, and the thickness is about 0.1 to 0.4 mm. The lead frame can be formed of a Fe—Ni material or a Cu alloy. The size of the resin-encapsulated semiconductor device arranged on the lead frame is primarily 3.0 mm×3.0 mm to 20.0 mm×20.0 mm.

The lead frame of this embodiment is generally subjected to plating, which is necessary for joining with semiconductor chips or mounting. As the material for plating, Ag, Au, NiPdAu and the like can be used. In the case of Ag plating, only the upper surfaces of the signal leads is plated with Ag, and the lower surfaces of the signal leads that serve as external terminals have to be plated with Sn—Pb or Sn—Bi. The thickness of the plating is 1 μm or less for Au plating and Pd plating, and is several μm or less for Ag plating.

Furthermore, in order to perform resin encapsulation of the semiconductor device stably, a film such as heat resistant polyimide or an aluminum foil may be provisionally attached as a sealing tape onto the lower surface of the lead frame (the surface opposite to the surface on which semiconductor chips are to be mounted).

Next, a method for manufacturing the lead frame of this embodiment will be described. As the reference numerals of the components, those shown in FIG. 1 are used.

First, a solid metal plate is subjected to press processing or the like to form the signal leads 102, the die pads 106 and the suspended leads 105. This process is referred to as "mechanical processing (press processing) process herein.

Next, the head grooves 102b and the base grooves 102c of the signal leads 102 are formed by, for example, etching, and then the die pad 106 is set up in such a manner that the upper surface thereof is positioned higher than the upper surface of the signal leads 102. The method for processing of the lead frame in this case will be described below.

Figure 6A:
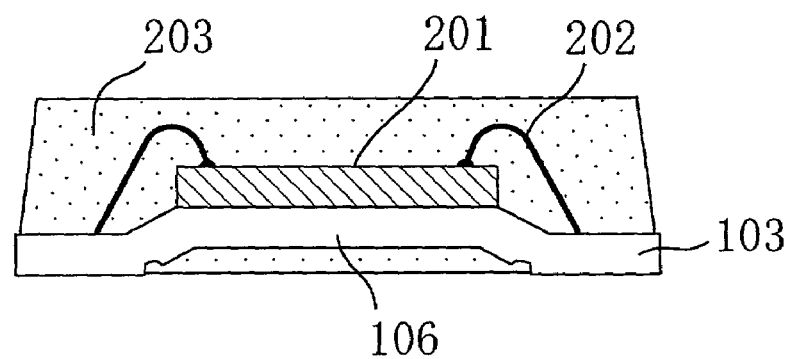
FIG. 6A is a cross-sectional view showing a resin-encapsulated semiconductor device employing a lead frame that has been subjected to processing for tapered steps.
Figure 6B:
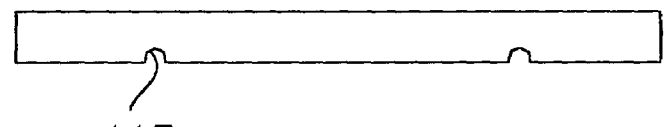
FIGS. 6B and 6C are cross-sectional views showing the processing process of the lead frame.
Figure 6C:
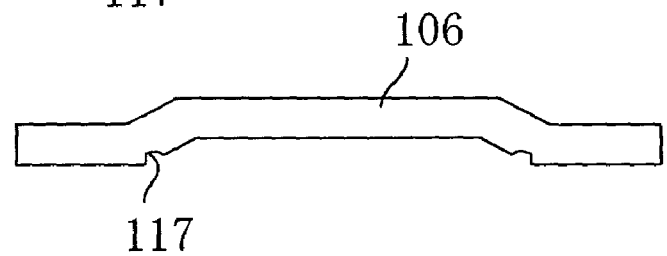

FIG. 6A is a cross-sectional view of a resin-encapsulated semiconductor device employing a lead frame that has been subjected to processing for tapered steps (press processing), and FIGS. 6B and 6C are cross-sectional views showing the processing process of the lead frame. FIG. 6A shows a cross section showing ground connection leads on the right and left sides. In the example shown in FIG. 6C, the die pad 106 is set up by subjecting the ground connection leads 103 and the suspended leads 105 to step processing with a pressing apparatus. This method makes it possible to set the height by which the die pad 106 is lifted to an arbitrary value. At this time, the thickness of the portion that has been subjected to step processing is made smaller than that of the original lead frame because it is stretched.

When performing resin encapsulation to the upper surface of the lead frame in a sequential process, the resin can penetrate into the gap between the lower surface of the signal leads and a sealing tape in the case where the sealing tape is used. This is because the edge at a portion in which the lifting is started (hereinafter, referred to as "rising portion) is rounded at the time of the step processing, which facilitates the penetration of the resin. As shown in FIG. 6B, in the lead frame of this embodiment, grooves 117 are provided on the lower surface of the rising portion of the ground connection leads 103 before the step processing is performed to form a sharp angel of the edge of the rising portion. Thus, the resin can be prevented from penetrating into the portion of the external terminals.

Figure 7A:
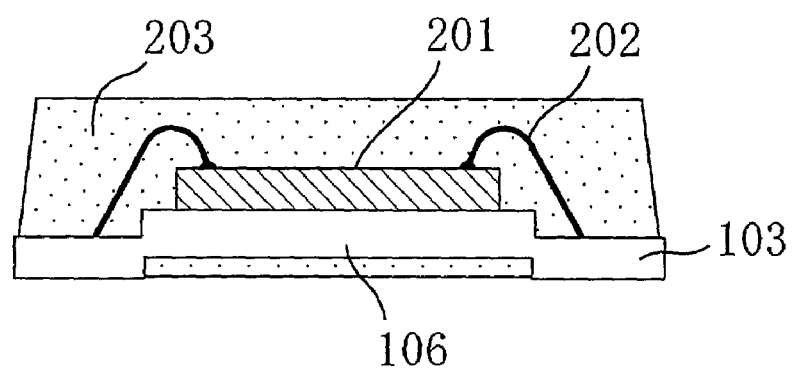
FIG. 7A is a cross-sectional view showing a resin-encapsulated semiconductor device employing a lead frame of the first embodiment that has been subjected to semi-cutting processing.
Figure 7B:
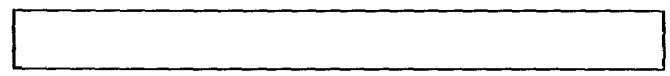
FIGS. 7B and 7C are cross-sectional views showing the processing process of the lead frame.
Figure 7C:
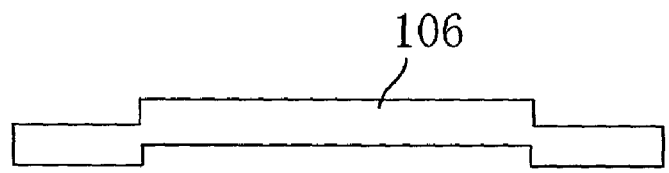

Next, FIG. 7A is a cross-sectional view of a resin-encapsulated semiconductor device employing a lead frame that has been subjected to semi-cutting processing, and FIGS. 7B and 7C are cross-sectional views showing the processing process of the lead frame. As shown in FIGS. 7B and 7C, the semi-cutting processing that is described in Japanese Laid-Open Patent Publication No. 2000-294717 may be performed with respect to the die pad 106 so as to set up the die pad 106. In this case, the edges of the rising portion are not rounded, so that it is not necessary to provide grooves in the lower portion of the ground connection leads 103.

Figure 8A:
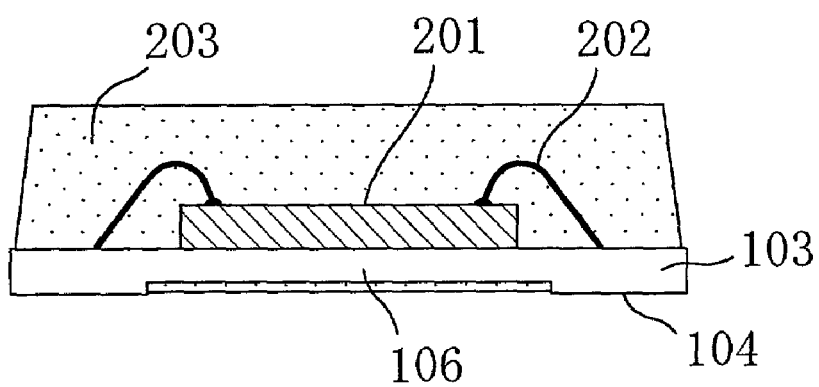
FIG. 8A is a cross-sectional view showing a resin-encapsulated semiconductor device employing a lead frame of the first embodiment when steps are provided by crushing processing or etching.
Figure 8B:
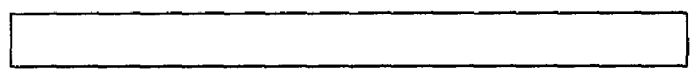
FIGS. 8B and 8C are cross-sectional views showing the processing process of the lead frame.
Figure 8C:
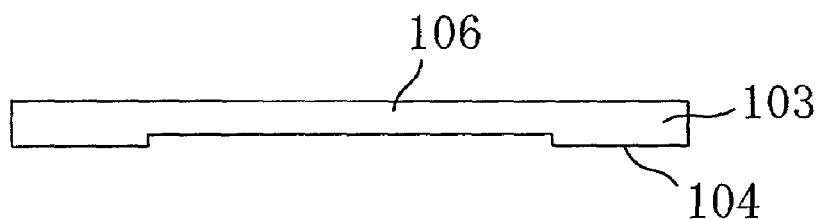

FIG. 8A is a cross-sectional view of a resin-encapsulated semiconductor device employing a lead frame that has been subjected to crushing processing or etching, and FIGS. 8B and 8C are cross-sectional views showing the processing process of the lead frame.

As shown in FIGS. 8B and 8C, the lower portion of the die pad 106 can be made thin by crushing processing or etching. The upper portion of the ground connection leads 103 may be made thin at the same time.

According to the semi-cutting processing, the crushing processing and the etching as described above, step processing can be performed within the range of the thickness of the lead frame, so that a lead frame used in a compact or thin resin-encapsulated semiconductor device can be manufactured.

Figure 9A:
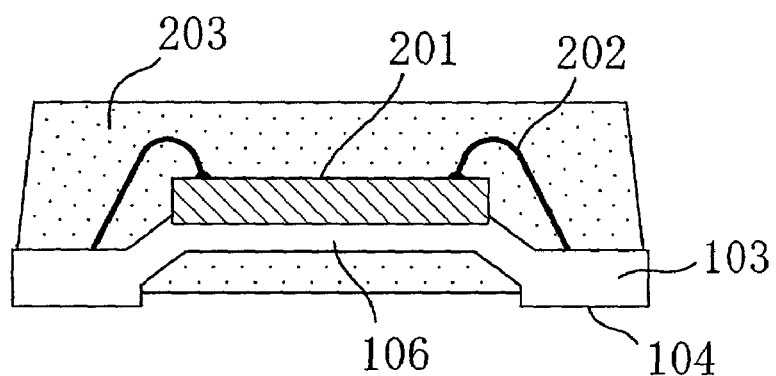
FIG. 9A is a cross-sectional view showing a resin-encapsulated semiconductor device of the first embodiment employing a lead frame that is provided with steps by crushing processing or etching.
Figure 9B:
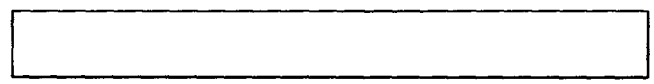
FIGS. 9B to 9D are cross-sectional views showing the processing process of the lead frame.
Figure 9C:
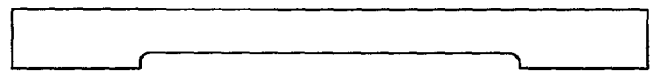
Figure 9D:
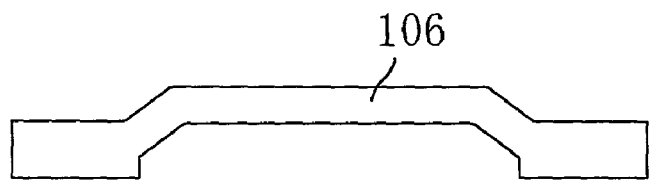

FIG. 9A is a cross-sectional view of a resin-encapsulated semiconductor device employing a lead frame in which steps are formed by crushing processing or etching, and FIGS. 9B to 9D are cross-sectional views showing the processing process of the lead frame. As shown in FIGS. 9B to 9D, after crushing processing or etching is performed, set-up processing may be performed with a pressing apparatus.

The upper surface of the die pad 106 is made higher than the upper surface of the signal leads 102 by 0.03 mm or more and not more than ¾ of the thickness of the lead frame, so that the quality of the resin-encapsulated semiconductor device can be stabilized. More specifically, when the height by which the die pad 106 is lifted is smaller than 0.03 mm, resin reaches the lower surface of the die pad 106 with difficulty, so that resin encapsulation may be insufficient. In the case of semi-cutting or etching, it is technically difficult at present to lift the die pad 106 more than ¾ of the thickness of the lead frame.

After the above-described processing, the lead frame is plated, and then, if necessary, a sealing tape is attached onto the lower surface. In this manner, the lead frame of this embodiment can be formed.

The lead frame of this embodiment can realize a compact QFN by providing the signal leads 102 with the head grooves 102b and the base grooves 102c, providing grooves on the lower surface of the rising portion of the ground connection leads 103 with grooves, and narrowing at least a portion of the step portions of the ground connection leads 103.

—Description of the Resin-Encapsulated Semiconductor Device—

Figure 10A:
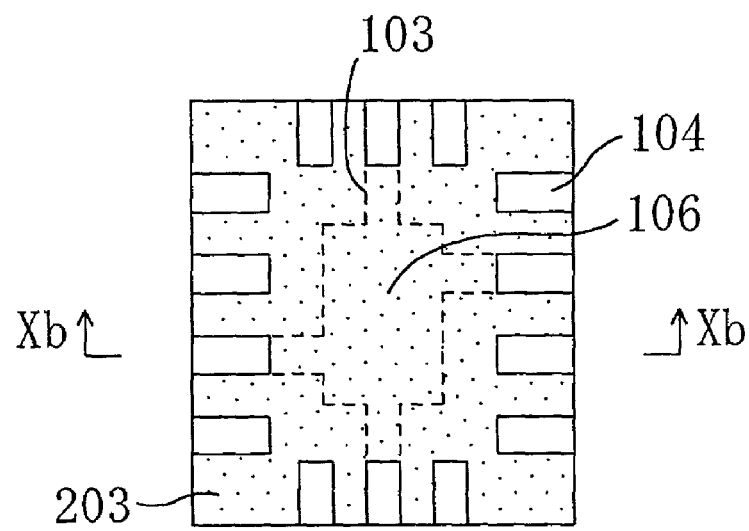
FIGS. 10A to 10C are a plan view showing the resin-encapsulated semiconductor device of the first embodiment, a cross-sectional view taken along line Xb-Xb of the resin-encapsulated semiconductor device, and a perspective view showing the appearance, respectively.
Figure 10B:
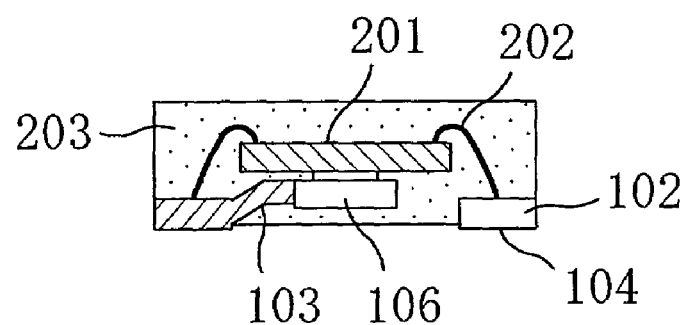
Figure 10C:
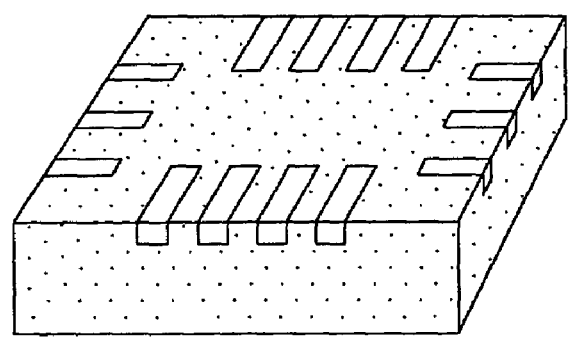

FIGS. 10A to 10C are a plan view when viewed from the bottom surface of the resin-encapsulated semiconductor device of this embodiment manufactured with the above-described lead frame, a cross-sectional view taken along line Xb-Xb, and a perspective view of the appearance, respectively. In this specification, the surface to which the external terminals 104 are exposed is referred to as "the bottom surface or the lower surface" of the resin-encapsulated semiconductor device, and the surface opposed to it is referred to as "the upper surface".

As shown in FIGS. 10A to 10C, the resin-encapsulated semiconductor device of this embodiment is substantially a rectangular solid, and includes the die pad 106, the signal leads 102 provided along the four sides of the bottom surface of the device, the ground connection leads 103 provided parallel to the adjacent signal leads 102 and connected to the die pad 106, a semiconductor chip 201 fixed on the upper surface of the die pad 106 with an adhesive such as Ag paste and having electrode pads, and metal thin wires 202 connecting the signal leads 102 and the electrode pads of the semiconductor chip 201, suspended leads (not shown) connected to the die pad, and an encapsulating resin 203 for encapsulating the die pad 106, the semiconductor chip 201, the suspended leads, and the upper surfaces of the signal leads 102 and the ground connection leads 103. The lower surfaces and the side end faces of the ground connection leads 103 and the signal leads 102 are exposed, and in particular, the lower portion of the signal leads 102 exposed on the bottom surface of the device act as the external terminals 104. The length of the external terminals 104 is smaller than that of the metal thin wires 202.

The resin-encapsulated semiconductor device of this embodiment is characterized by including the ground connection leads 103 connected to the die pad 106. As shown in FIG. 10B, the ground connection leads 103 are connected to the electrode pads for grounding on the semiconductor chip 201 with connecting members such as the metal thin wires 202. At least a portion of the lower portion of the ground connection leads 103 is connected to the ground power of a mother substrate or the like as external terminal 104 for grounding.

Therefore, in the resin-encapsulated semiconductor device of this embodiment, accumulation of charges or the like does not occur, and electrical stability can be achieved. Furthermore, using the ground connection leads 103 as ground terminals makes it possible to establish grounding even if the device is made more compact.

In addition, according to the resin-encapsulated semiconductor device of this embodiment, the high frequency characteristics can be better than those of the conventional resin-encapsulated semiconductor device. This is because high frequency signals traveling in the same direction can easily interfere with each other, but the high frequency signals transmitted to each signal lead 102 can be isolated by enclosing one signal lead 102 with two ground connection leads 103 and the die pad 106 connected thereto. If the high frequency signals transmitted to each signal lead 102 can be isolated, as a result, mutual interference between the high frequency signals can be suppressed. Therefore, it is preferable that the signal leads 102 and the ground connection leads 103 are provided as alternately as possible in order to improve the high frequency characteristics. However, even if the signal leads 102 and the ground connection leads 103 are not provided alternately, the high frequency characteristics can be better than those of the conventional resin-encapsulated semiconductor device. The high frequency characteristics will be described in details later.

It is not necessary to connect the ground connection leads 103 to the electrode pads of the semiconductor chip 201 for the purpose of improving the high frequency characteristics. In order to stabilize the electrical characteristics, it is preferable to connect all the electrode pads for grounding to the ground connection leads 103. Therefore, when the number of the ground connection leads 103 is larger than that of the electrode pads for grounding, some ground connection leads 103 may be not connected to the semiconductor chip.

As shown in FIG. 10C, the distance between the signal lead 102 and the ground connection lead 103 of the resin-encapsulated semiconductor device of this embodiment is substantially the same as that between the signal leads 102, so that the appearance of the resin-encapsulated semiconductor device of this embodiment is the same as that of the conventional resin-encapsulated semiconductor device. This means that a resin-encapsulated semiconductor device that is stabilized electrically and has better high frequency characteristics and yet the same specifications in terms of the size or the number of pins as those of the conventional devices can be realized. For this reason, there is no need of changing the specifications of the devices that are to be connected to the resin-encapsulated semiconductor device.

When a lead frame in which the die pad 106 is lifted by a smaller height by semi-cutting processing or crushing processing and etching is used as the material of the resin-encapsulated semiconductor device of this embodiment, a particularly compact and thin resin-encapsulated semiconductor device can be manufactured.

In the resin-encapsulated semiconductor device of this embodiment, the arrangement of the signal leads 102 and the ground connection leads 103 and the shape of the die pad 106 can be changed, if necessary.

In the resin-encapsulated semiconductor device of this embodiment, the external terminals 104 are substantially rectangular, but can be changed to other shapes such as substantially ellipse by changing the shape of the lead frame to be used.

In the resin-encapsulated semiconductor device of this embodiment, the electrodes pad for grounding can be connected to not only the ground connection leads 103 but also signal leads 102.

Figure 11A:
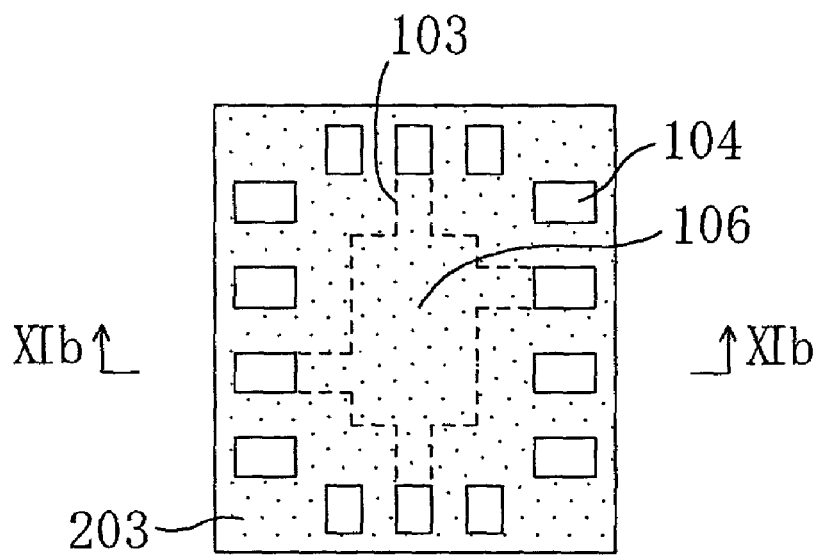
FIGS. 11A to 11C are a plan view showing a first variation of the resin-encapsulated semiconductor device of the first embodiment, a cross-sectional view taken along line XIb-XIb of the resin-encapsulated semiconductor device, and a perspective view showing the appearance, respectively.
Figure 11B:
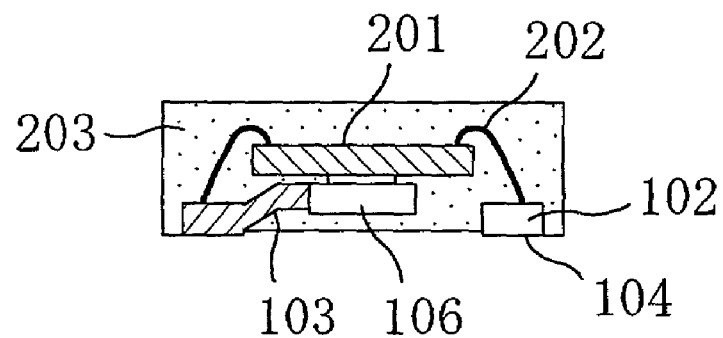
Figure 11C:
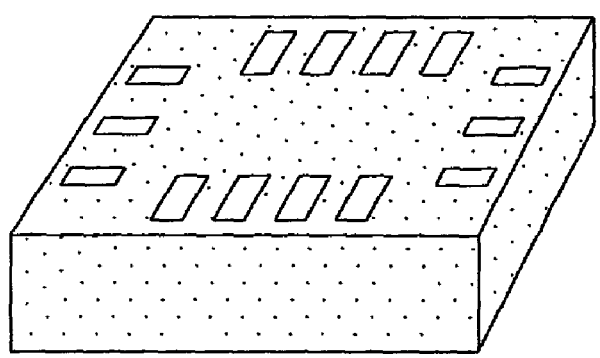

FIGS. 11A to 11C are a plan view when viewed from the bottom surface of a first variation of the resin-encapsulated semiconductor device of this embodiment, a cross-sectional view taken from line Xb-Xb of the resin-encapsulated semiconductor device, and a perspective view of the appearance of the resin-encapsulated semiconductor device, respectively. As shown in FIGS. 11A to 11C, even if the side end faces of the signal leads 102 are not exposed outside, the electrical characteristics and the high frequency characteristics as described above can be obtained if the ground connection leads 103 are provided.

Figure 12A:
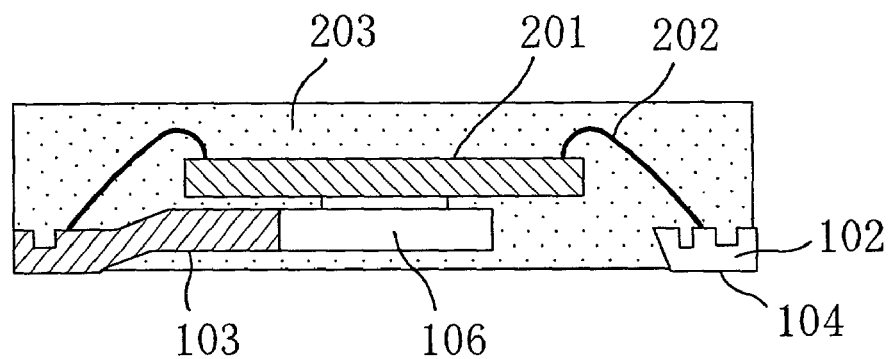
FIGS. 12A and 12B are a cross-sectional view taken along line XIIa-XIIa showing a second variation of the resin-encapsulated semiconductor device of the first embodiment, and a perspective view showing the appearance, respectively.
Figure 12B:
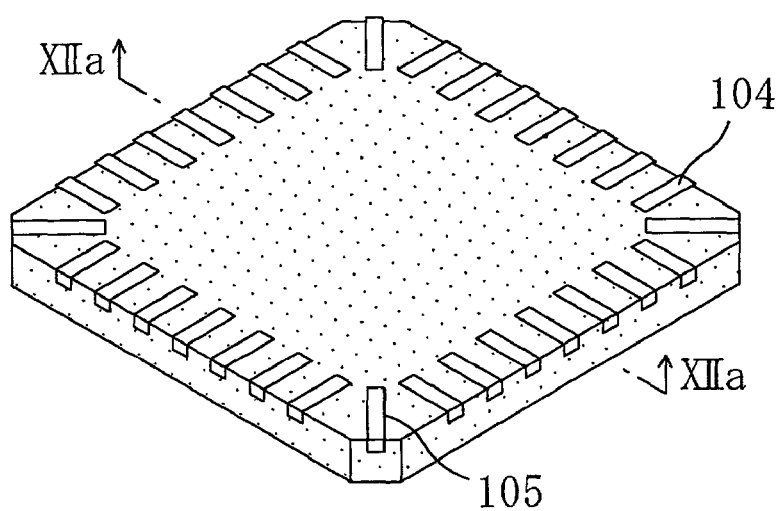

FIGS. 12A and 12B are a cross-sectional view taken from line XIIa-XIIa of a second variation of the resin-encapsulated semiconductor device of this embodiment, and a perspective view of the appearance, respectively. As shown in FIGS. 12B, the suspended leads 105 can be exposed at the four corners of the bottom surface of the resin-encapsulated semiconductor device. Furthermore, since the signal leads 102 are provided with the base grooves and the head grooves, the resin-encapsulated semiconductor device can be protected from a substrate bending stress after the device is mounted on a circuit board of electronic equipment, and the metal thin wires 202 can be prevented from being broken.

Figure 13A:
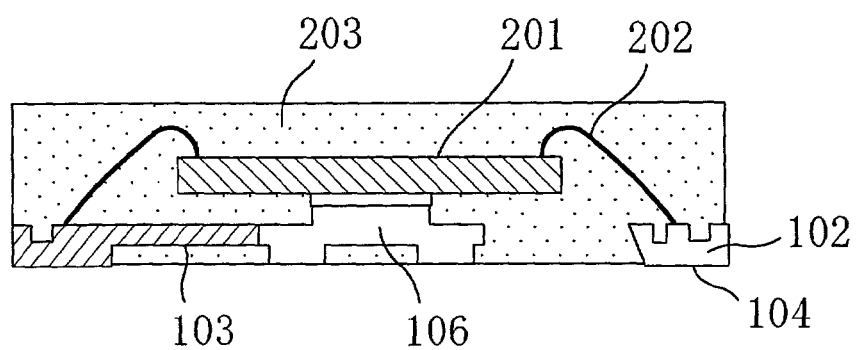
FIGS. 13A and 13B are a cross-sectional view taken along line XIIIa-XIIIa showing a third variation of the resin-encapsulated semiconductor device of the first embodiment, and a perspective view showing the appearance, respectively.
Figure 13B:
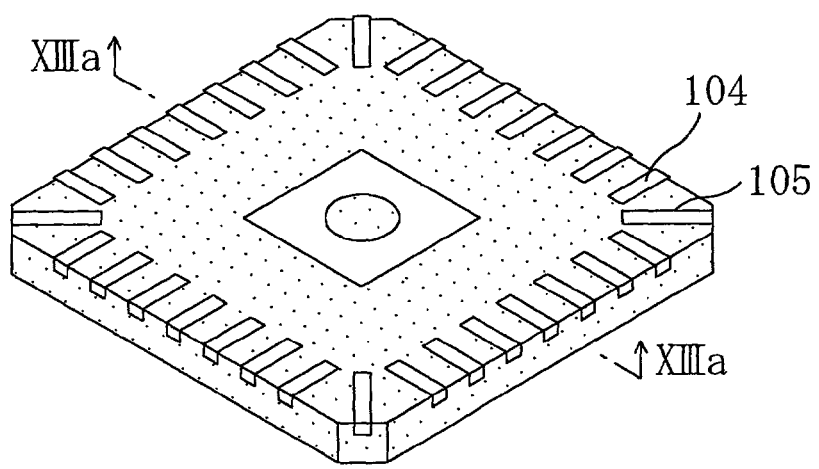

FIGS. 13A and 13B are a cross-sectional view taken from line XIIIa-XIIIa of a third variation of the resin-encapsulated semiconductor device of this embodiment, and a perspective view of the appearance, respectively. This variation is a power QFN in which a portion of the bottom surface of the die pad 106 is exposed from the bottom surface of the package. In this variation, the heat release properties are better than those of the resin-encapsulated semiconductor device of this embodiment, so that heat generated from the power semiconductor device that is operating with high frequency signals can be released rapidly. It is very preferable to provide the ground connection leads 103 in the power QFN in term of the high frequency characteristics as in this variation. In this variation, a lead frame that has been formed by semi-cutting processing can be used preferably.

Figure 14A:
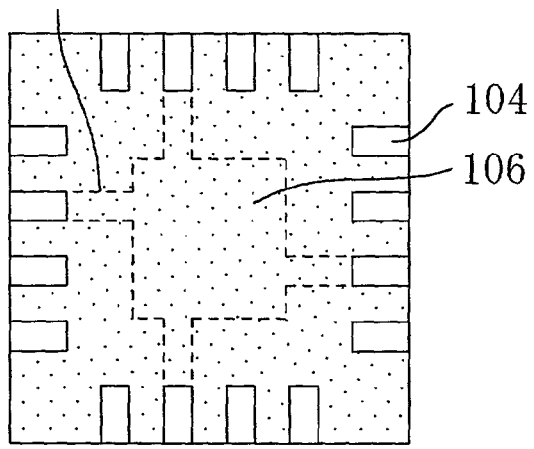
FIGS. 14A to 14C are plan views showing a fourth variation, a fifth variation, and a sixth variation of the resin-encapsulated semiconductor device of the first embodiment, respectively.
Figure 14B:
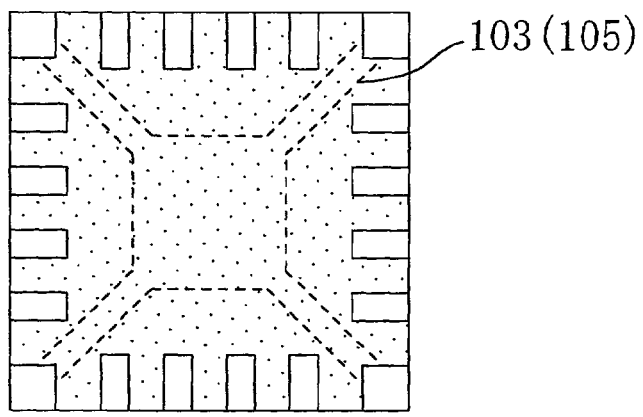
Figure 14C:
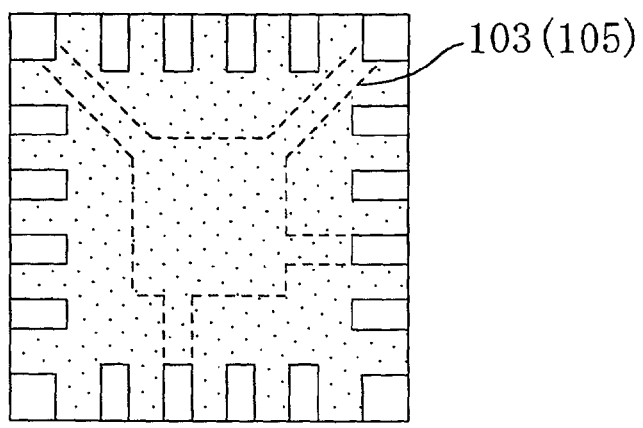

FIGS. 14A to 14C are plan views of a fourth variation, a fifth variation and a sixth variation of the resin-encapsulated semiconductor device of this embodiment when viewed from the bottom, respectively. As shown in FIG. 14A, in the resin-encapsulated semiconductor device of this embodiment, the ground connection leads 103 support the die pad 106, so that it is not necessary to provide the suspended leads 105. Alternatively, as shown in FIG. 14B, the suspended leads 105 extending from the die pad 106 to the corner portions of the package are connected to the electrode pads for grounding on the semiconductor chip, so that the suspended leads 105 also serve as the ground connection leads 103. As shown in FIG. 14C, at least one of the ground connection leads 103 can serve as the suspended leads 105, and the remaining ground connection leads 103 can be provided between the signal leads 102. In this case, the number the ground connection leads 103 is not necessarily four.

Figure 15:
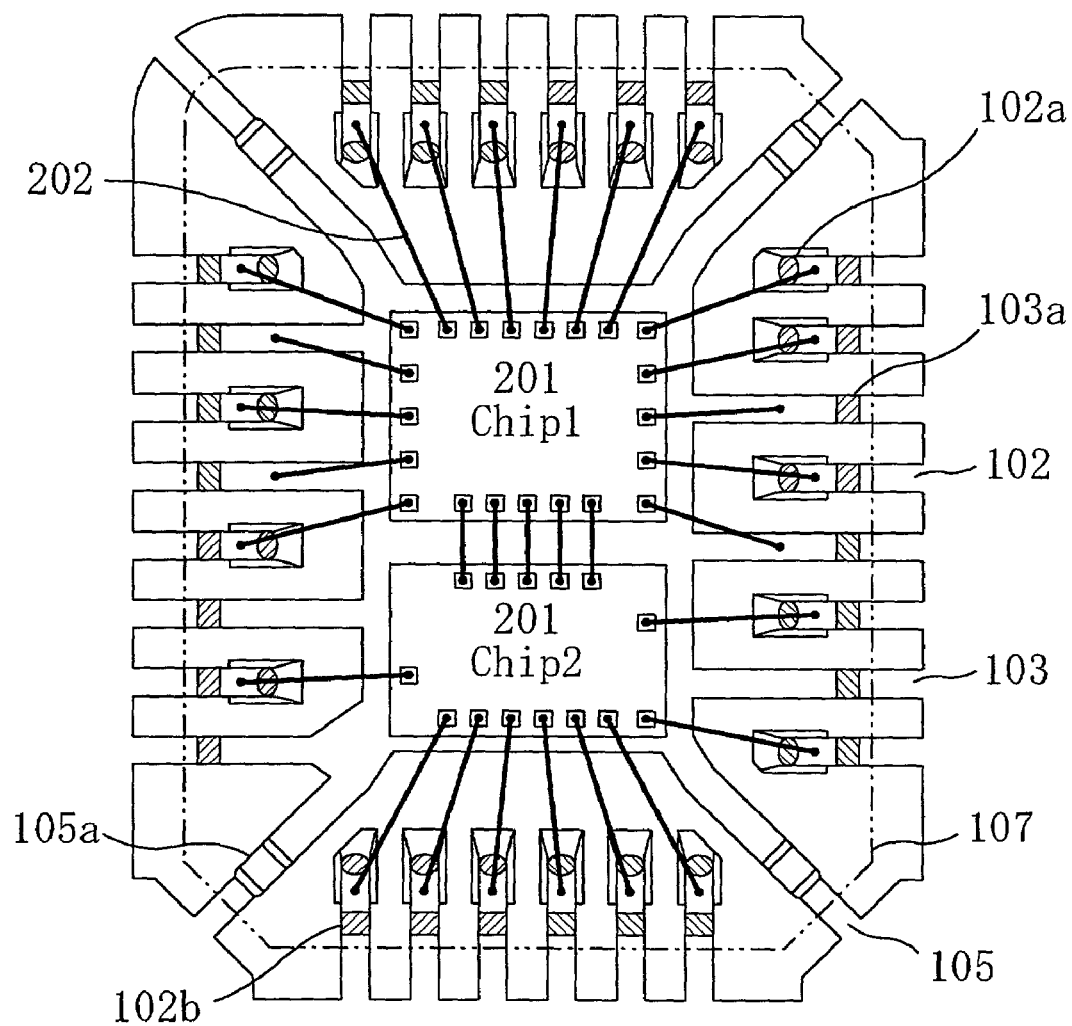
FIG. 15 is a plan view showing a seventh variation of the resin-encapsulated semiconductor device of the first embodiment.

FIG. 15 is a plan view illustrating a seventh variation of the resin-encapsulated semiconductor device of this embodiment. In this FIG. 15, two semiconductor chips 201 are mounted on the die pad 106 of the lead frame, and the signal leads 102 and ground connection leads 103 are connected to the electrode pads or the pads for connection of the semiconductor chips 201 with metal thin wires 202. As shown in FIG. 15, when the present invention also can be applied to the case where a plurality of semiconductor chips 201 are mounted on the upper surface of the die pad 106. Such a so-called multi-tip structure is generally used when elements manufactured in different processes, for example, a memory and a system LSI, or a GaAs semiconductor element and CMOS made of Si, are formed into one resin-encapsulated semiconductor device. In this case, the electrode pads of the mounted semiconductor chip 201 are connected to each other with metal thin wires or the like as necessary. The connection between the metal thin wires 202 and the corresponding pads can be established more reliably by increasing the size of the electrode pads to which the metal thin wires 202.

Figure 16:
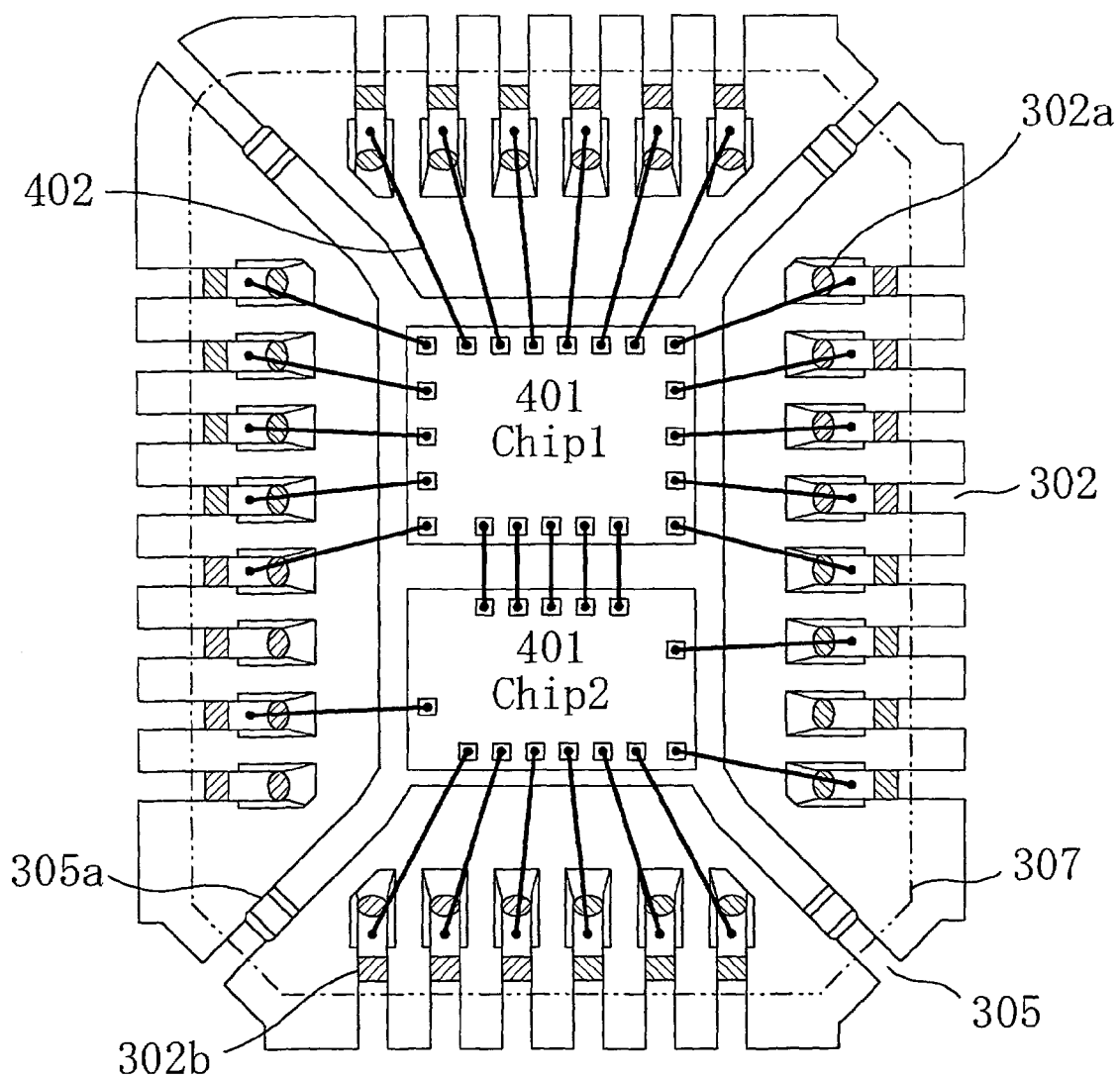
FIG. 16 is a view showing a conventional resin-encapsulated semiconductor device corresponding to the seventh variation of the resin-encapsulated semiconductor device of the first embodiment shown in FIG. 15.

FIG. 16 is a plan view showing a conventional resin-encapsulated semiconductor device corresponding to the seventh variation of the resin-encapsulated semiconductor device of this embodiment. This device has the same structure as that of the seventh variation, except that the ground connection leads 103 are not provided.

In the example described above, the electrode pads and the signal leads 102 or the electrode pads and ground connection leads 103 are connected with the metal thin wires 202. However, metal bumps can be used instead. In this case, the semiconductor chips 201 that are provided with bumps on their upper surfaces are mounted on the die pad 106 with the upper surface of the semiconductor chips 201 facing downward.

—High Frequency Characteristics of the Resin-Encapsulated Semiconductor Device—

Next, the results of investigating the high frequency characteristics of the resin-encapsulated semiconductor device of this embodiment will de described.

Figure 17:
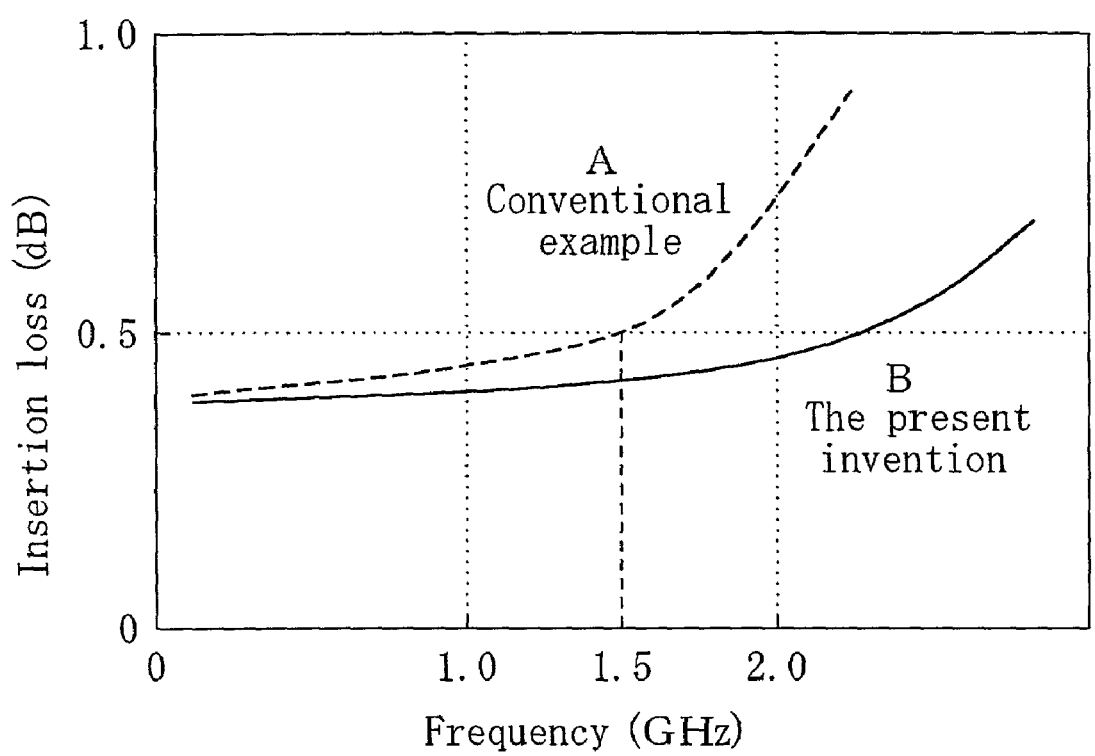
FIG. 17 is a graph showing the high frequency characteristics of the resin-encapsulated semiconductor device of the first embodiment.

FIG. 17 is a graph showing the simulation results of the high frequency characteristics of the resin-encapsulated semiconductor device of this embodiment and the conventional resin-encapsulated semiconductor device. Here, as the resin-encapsulated semiconductor device of this embodiment, the seventh variation shown in FIG. 15 is used, and the resin-encapsulated semiconductor device shown in FIG. 16 that has the same number of pins and the same structure as those of the seventh variation is used as the conventional example. The characteristic curve B (solid line) indicates the characteristics of the resin-encapsulated semiconductor device of this embodiment, and the characteristic curve A (broken line) indicates the characteristics of the conventional resin-encapsulated semiconductor device.

FIG. 17 shows that the resin-encapsulated semiconductor device of this embodiment has a smaller insertion loss than that of the conventional example in all the frequencies in the range that was subjected to simulation. For example, in 1.5 GHz, which is used for communications through cellular phones, the insertion loss of the conventional resin-encapsulated semiconductor device is about 0.5 dB, whereas that of the resin-encapsulated semiconductor device of this embodiment is about 0.4 dB. Since the difference in the insertion loss between the two devices increases as the frequency increases, the resin-encapsulated semiconductor device will provide an even larger advantage if the high frequency signals of 1.5 GHz or more are used in the future.

Next, the reason why the high frequency characteristics are improved in the resin-encapsulated semiconductor device of this embodiment will be described.

Figure 18A:
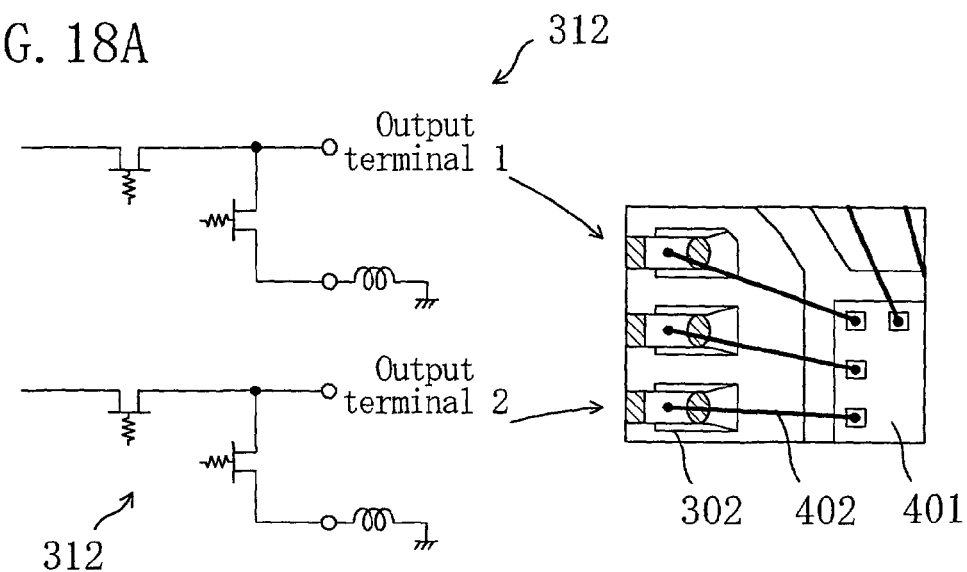
FIG. 18A shows a plan view and a circuit diagram showing a connection portion between signal leads or ground connection leads and a semiconductor chip in the conventional resin-encapsulated semiconductor device.
Figure 18B:
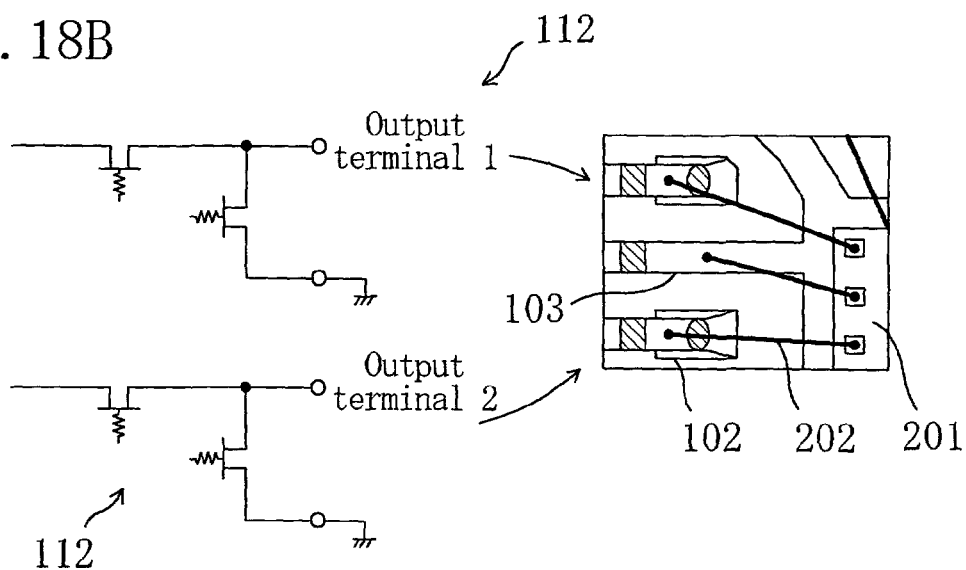
FIG. 18B shows a plan view and a circuit diagram showing a connection portion between signal leads or ground connection leads and a semiconductor chip in the resin-encapsulated semiconductor device of the first embodiment.

FIG. 18A shows a plan view and a circuit diagram showing a portion in which signal leads are connected to a semiconductor chip in the conventional resin-encapsulated semiconductor device, and FIG. 18B shows a plan view and a circuit diagram showing a portion in which the signal leads or the ground connection leads and the semiconductor chips are connected in the resin-encapsulated semiconductor device of this embodiment. A circuit 312 shown on the left side of FIG. 18A is a circuit diagram representing a portion in which the signal leads 302 are connected to the semiconductor chip 401, which is shown on the right side. Similarly, a circuit 112 shown on the left side of FIG. 18B is a circuit diagram representing a portion in which the signal leads 102 are connected to the semiconductor chip 201, which is shown on the right side As shown in FIG. 18A, in the conventional resin-encapsulated semiconductor device, the signal leads 302 are close to the adjacent signal leads, so that magnetism occurs when high frequency signals pass through the signal leads 302 and the metal thin wires 402, and thus noise is present in an output terminal. On the other hand, in the resin-encapsulated semiconductor device of this embodiment, one signal lead 102 is surrounded by the sides of the ground connection leads 103 and the die pad 106, so that the signal leads 102 are not affected by a magnetic field, so that a resistance is smaller than that of the conventional example. Therefore, in order to improve the high frequency characteristics, it is preferable to arrange the ground connection leads 103 and the signal leads 102 alternately.

Next, in the resin-encapsulated semiconductor device of this embodiment, the significance of the fact that the ground connection leads are provided in a QFN in which the lower portion of the signal leads serve as external terminals will be described.

Figure 21:
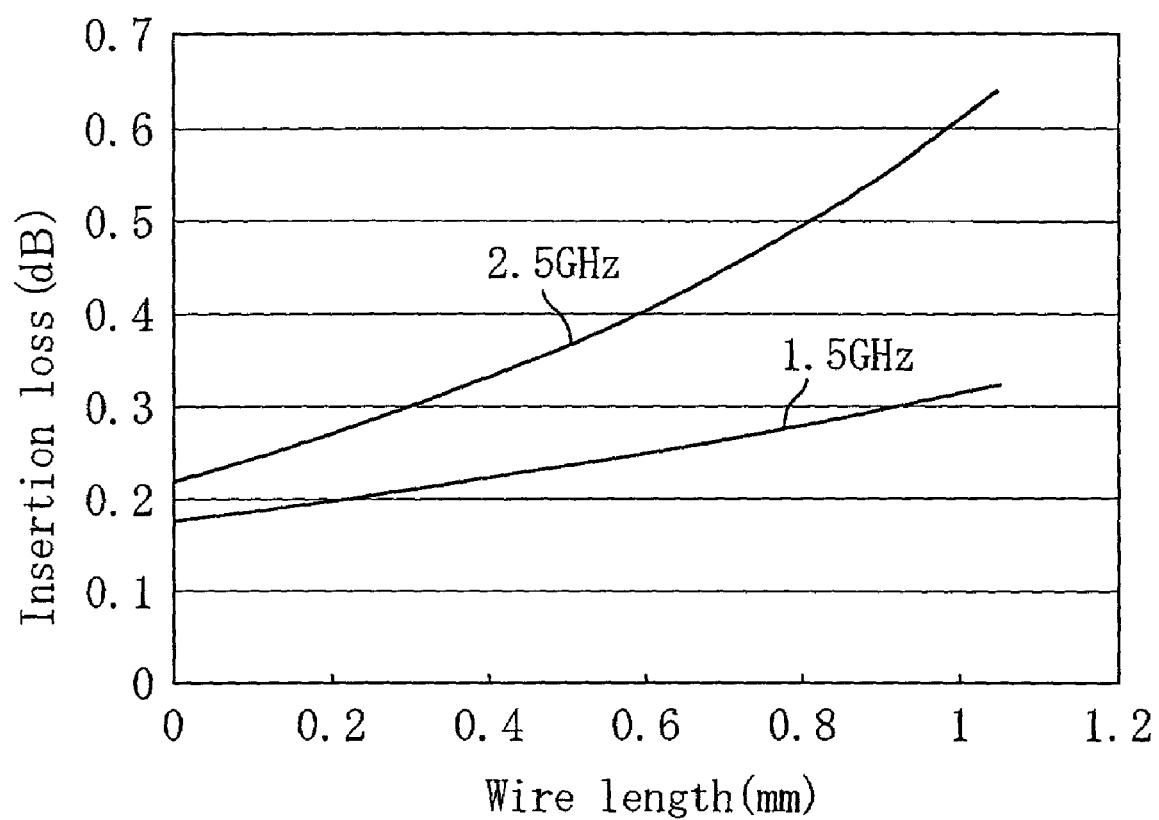
FIG. 21 is a graph showing the insertion loss and the length of the metal thin wires in the resin-encapsulated semiconductor device of the first embodiment.

FIG. 21 is a graph showing the relationship between the insertion loss and the length of the metal thin wires (wires) in the resin-encapsulated semiconductor device of this embodiment. The diameter of the metal thin wire used herein is about 20 to 30 μm, and the inductance is generally 1 nH per mm in 0.8 GHz.

As seen from FIG. 21, when the operation frequency is 1.5 GHz, as the length increases 1 mm, an insertion loss of 0.1 dB is generated in a flip tip state. Furthermore, as the frequency increases, the length of the metal thin wires affects the insertion loss more significantly, and in 2.5 GHz, as the length increases 1 mm, an insertion loss of about 0.3 dB is generated. In the case of switches (SW) used in antenna blocks for signal reception and transmission of cellular phones, an insertion loss of 0.1 dB causes degradation of signal reception and generation of noise. Furthermore, when the power of the transmission block (power amplifier) is increased in view of the influence of noise, a large number of operations are required in some equipment, so that it takes a long time to transmit information. When the length of the metal thin wire is increased, the insertion loss is increased for the following reason. The inductance L is increased substantially in proportion to the length of the metal thin wire, and in accordance with this, the impedance Z represented by $Z=j\omega L$ is increased, and thus the insertion loss is increased. Herein, j is an imaginary number, and $\omega=2\pi f$ (f is a frequency).

Thus, as the path in which a signal travels becomes longer, the electrical characteristics of the resin-encapsulated semiconductor device becomes poorer. In particular, in the case where operation is performed with high frequency signals, this phenomenon occurs significantly.

In the above example, the influence of the length of the metal thin wire has been described, but with respect to leads as well as the metal thin wires, as the length becomes larger, the insertion loss becomes larger. Next, the high frequency characteristics of the resin-encapsulated semiconductor device of this embodiment that is a QFN will be compared with those of a QFP.

Figure 19A:
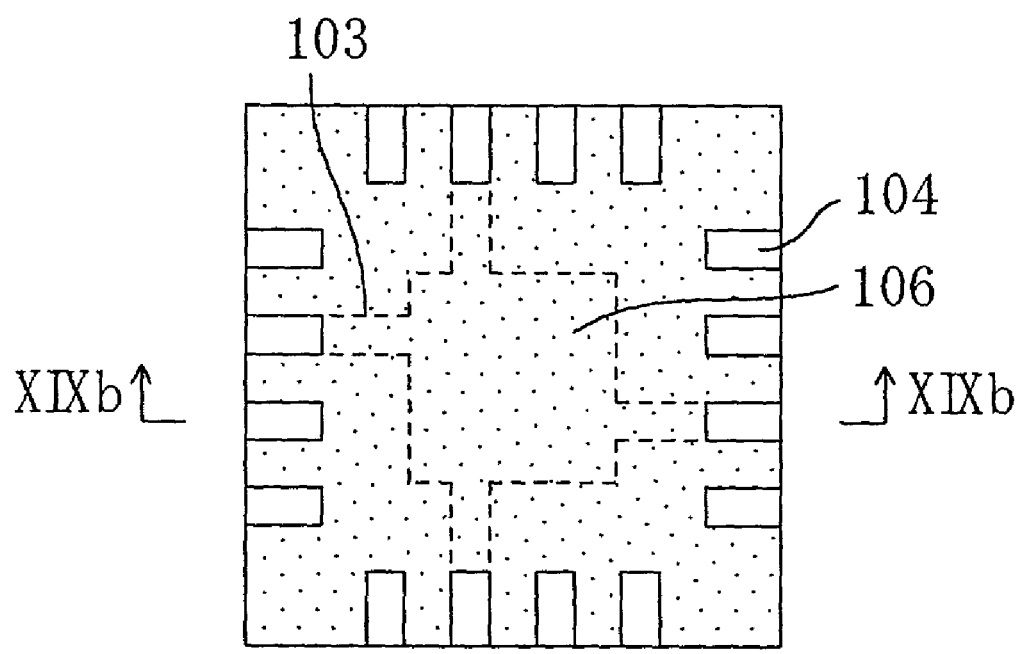
FIGS. 19A and 19B are a plan view showing an example of the resin-encapsulated semiconductor device of the first embodiment, and a cross sectional view taken along line XIXb-XIXb of the resin-encapsulated semiconductor device, respectively.
Figure 19B:
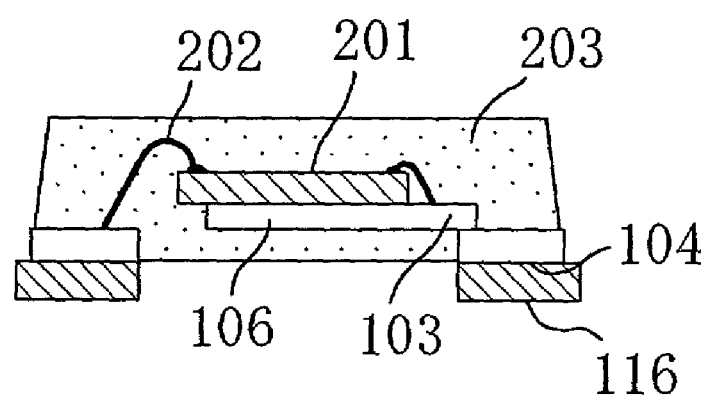
Figure 20A:
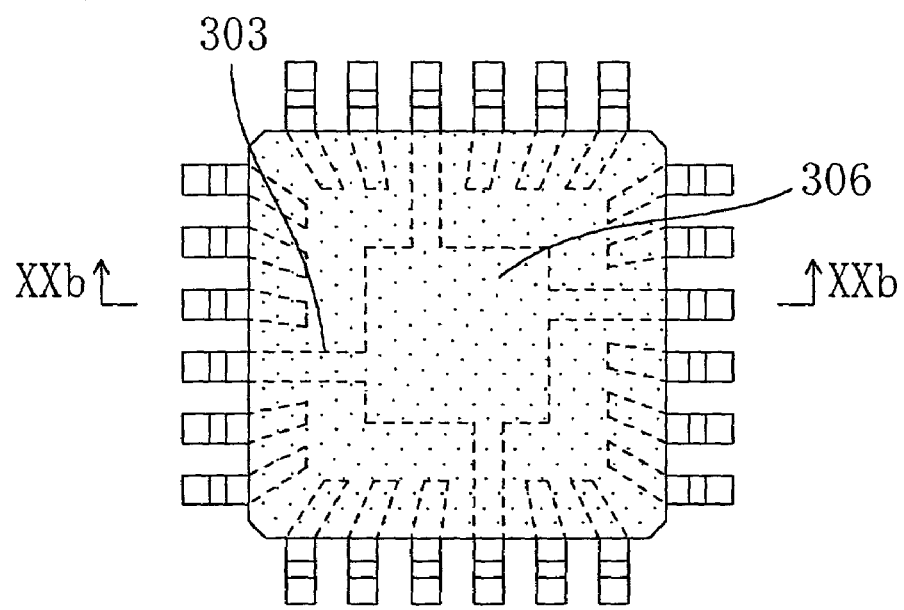
FIGS. 20A and 20B are a plan view showing QFP provided with ground connection leads, and a cross sectional view taken along line XXb-XXb of the QFP, respectively.
Figure 20B:
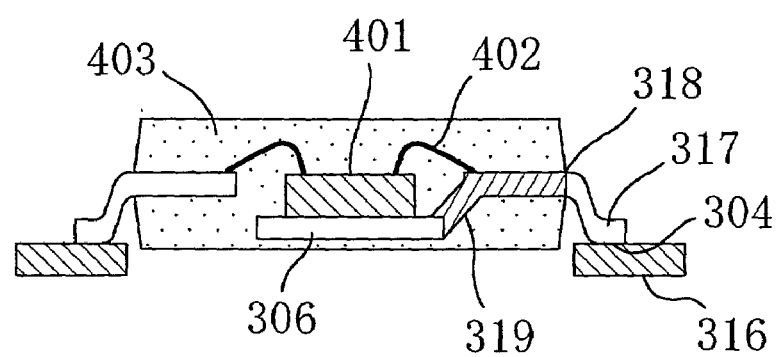

FIGS. 19A and 19B are a plan view showing an example of the resin-encapsulated semiconductor device of this embodiment, and a cross-sectional view taken along line XIXb-XIXb, respectively, and FIGS. 20A and 20B are a plan view showing a resin-encapsulated semiconductor device that is a QFP provided with the ground connection leads, and a cross-sectional view taken along line XXb-XXb, respectively. Substrate wires 116 are connected to the external terminals 104 of the resin-encapsulated semiconductor device of this embodiment, and substrate wires 316 are connected to the external terminals 304 of the QFP. The QFP is provided with leads 318 including the signal leads and external leads 317 extending to the outside of an encapsulating resin 403, and a portion of the signal lead is a ground connection lead 319 connected to the die pad 306. The QFP is different from the resin-encapsulated semiconductor device of this embodiment in that the lead 318 includes the external lead 317 and the lower portion of the external lead 317 severs as the external terminal 304.

In the QFP shown in FIG. 20B, the shortest path of electrical signals from the semiconductor chip 401 is a path from the electrode pad of the semiconductor chip 401 to substance wire 316 via the metal thin wire 402, the ground connection leads 319 and the external lead 317. On the other hand, in the resin-encapsulated semiconductor device of this embodiment, the lower portion of the signal leads 102 serve as the external terminals, so that the shortest path of electrical signals is smaller than that of the QFP by the length of the external lead 317. Therefore, in the resin-encapsulated semiconductor device of this embodiment, the distance from the semiconductor chip to the substrate wire can be reduced to about ⅓ of that of the QFP. For example, the conductive path of signals in the resin-encapsulated semiconductor device of this embodiment is 0.80 mm, which is the total of 0.50 mm as the length of the metal thin wire and 0.30 mm as the length from the ground connection lead to the substrate wire in a plan view. The conductive path of signals in the QFP is 2.40 mm, which is the total of 0.50 mm as the length of the metal thin wire, 0.50 mm as the length from the ground connection lead to the external lead, and 1.4 mm as the length from the external lead to the substrate wire. In this case, when the inductance per mm of the conductive path is 1 nH, the inductance of signals in the resin-encapsulated semiconductor device of this embodiment is 0.80 nH, whereas, the inductance in the QFP is 2.40 nH. The difference in the inductance is far beyond the range examined with reference to FIG. 21.

Furthermore, the difference in the inductance becomes larger as the frequency of signals becomes higher, so that even if the ground connection leads are provided in the QFP, the high frequency characteristics as good as those of the resin-encapsulated semiconductor device of this embodiment cannot be obtained. In other words, the present invention can realize a resin-encapsulated semiconductor device having excellent high frequency characteristics that conventionally cannot be obtained, by providing the ground connection leads in the resin-encapsulated semiconductor device in which the lower portion of the signal leads serve as the external terminals, such as a QFN.

When using such a resin-encapsulated semiconductor device of this embodiment in a cellular phone that operates with high frequency signals of 1.5 GHz or more, a resin-encapsulated semiconductor device including at least one semiconductor element that amplitudes or attenuates power in a frequency of 1.5 GHz or more is used. This is not limited to QFN, but also true for SON or LGA.

—Method for Manufacturing the Resin-Encapsulated Semiconductor Device—

Next, an example of a method for manufacturing a resin-encapsulated semiconductor device of this embodiment will be described.

FIGS. 22A to 22E are cross-sectional views showing a production process sequence of the resin-encapsulated semiconductor device of this embodiment.

Figure 22A:
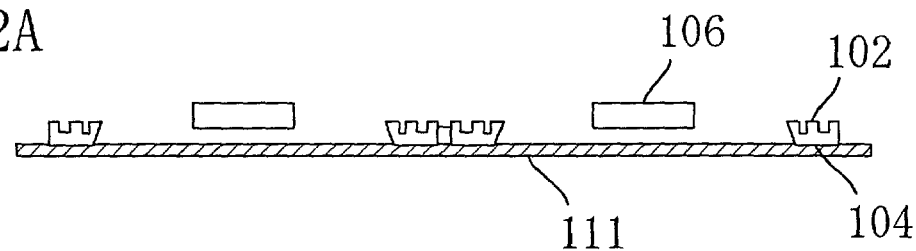
FIGS. 22A to 22E are cross-sectional views showing a production process sequence of the resin-encapsulated semiconductor device of the first embodiment.

First, in the process shown in FIG. 22A, a lead frame to which a sealing tape is attached on its lower surface is prepared. This lead frame already has been subjected to a three-dimensional processing such as set-up processing or set-down processing, and has at least the die pad 106, the signal leads 102 having grooves on the upper surface and the sealing tape 111.

Figure 22B:
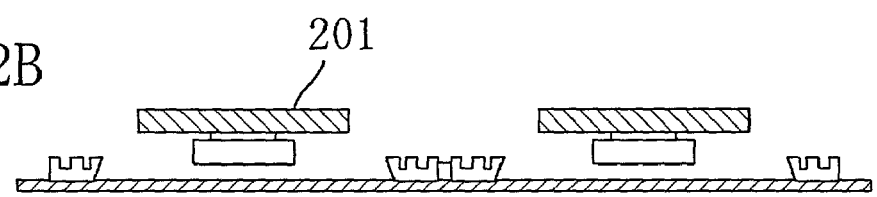

Next, in the process shown in FIG. 22B, semiconductor chips 201 are mounted on the upper surface of the die pad 106 with an adhesive such as Ag.

Figure 22C:
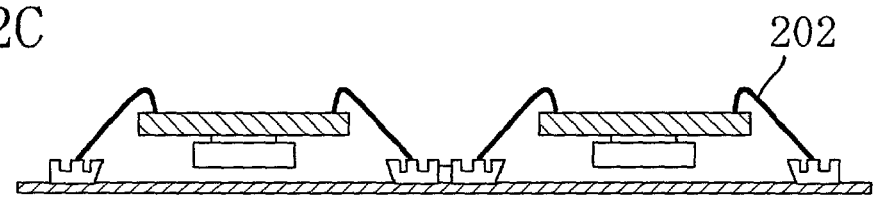

Then, in the process shown in FIG. 22C, the electrode pads on the semiconductor chips 201 are electrically connected to the top portion of the signal leads 102 and arbitrary portions of the ground connection leads (not shown) with metal thin wires 202.

Figure 22D:
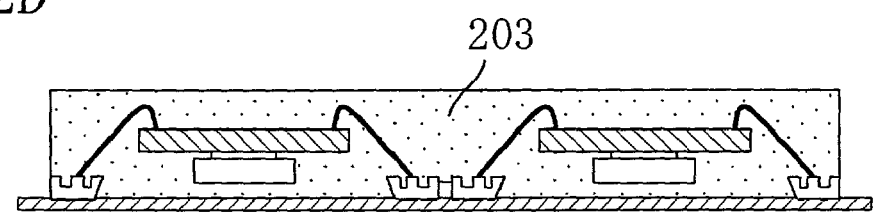

Thereafter, in the process shown in FIG. 22D, the upper surfaces of the signal leads 102 and the ground connection leads, the die pad 106, and the semiconductor chips are encapsulated with an encapsulating resin 203. This process will be described in greater details.

Figure 23A:
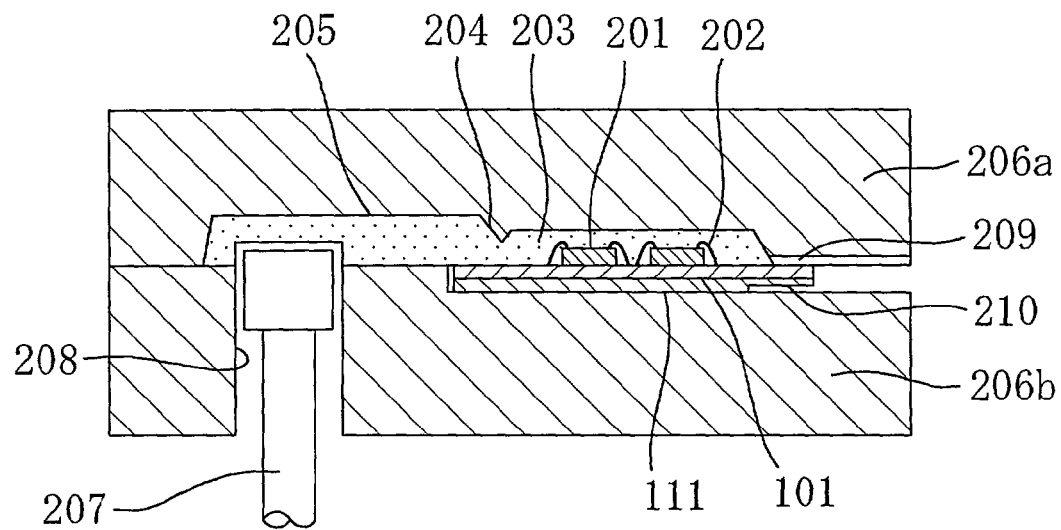
FIGS. 23A and 23B are a cross-sectional view and a plan view illustrating the resin encapsulation process shown in FIG. 22D, respectively.
Figure 23B:
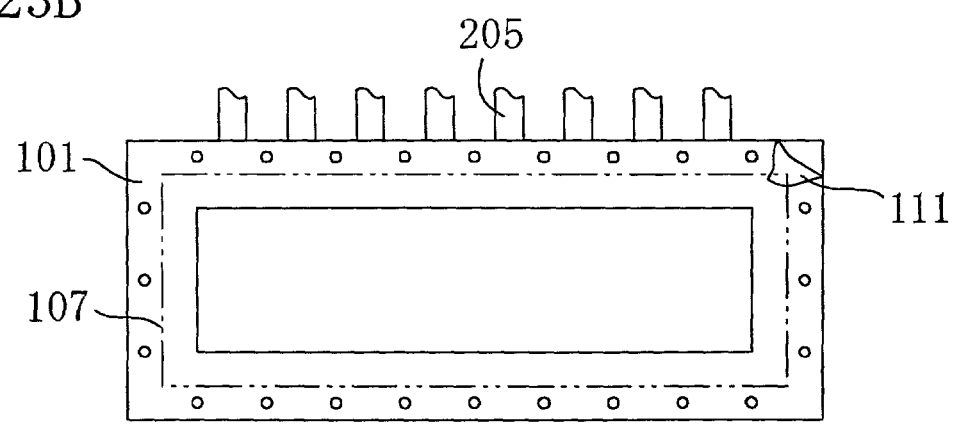

FIGS. 23A and 23B are a cross-sectional view and a plan view illustrating the resin encapsulation process shown in FIG. 22D, respectively.

As shown in FIG. 23A, in the resin encapsulation process, the resin-encapsulated semiconductor device that has been subjected to all the processes up to that shown in FIG. 22C is set in molds 206a and 206b for resin encapsulation and is sandwiched by them. Then, a thermosetting epoxy resin fed into a pot 208 is forced in with a plunger 207. The forced-in resin is melted to become liquid by the heat of the molds that has been heated to 150 to 200° C. beforehand, passes through a runner 205 and is injected from a gate 204 to a die cavity (encapsulation mold) in which the resin-encapsulated semiconductor device is set. At this time, air is released through an air vent 209, which is provided on the side opposite to the gate 204 in the die cavity, or an air escape groove 210 of the lead frame, so that a resin-encapsulated semiconductor device without voids (air foam in the cured resin) can be molded. Thereafter, the resin is pressed with the plunger 207 and the molds 206a and 206b for resin encapsulation for several tens of seconds, and is cured. After the resin encapsulation is completed, the runner 205 is removed, and then the sealing tape 111 is stripped. In the resin encapsulation process, when a lead frame that has been subjected to step processing by pressing is used, encapsulating resin is prevented from penetrating between the sealing tape 111 and the external terminal 104 by providing grooves on the lower surface of the rising portion of the ground connection leads 103 or the suspended leads.

Figure 22E:
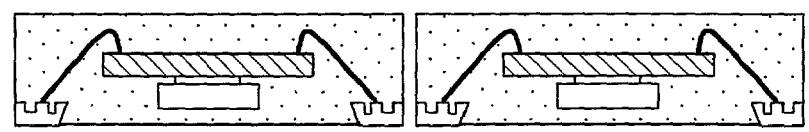

Next, in the process shown in FIG. 22E, the lead frame is cut at the position of a device separation line 151a that is located between the signal leads of the adjacent semiconductor devices, so that the resin-encapsulated semiconductor device of this embodiment can be manufactured. Hereinafter, this product separating process will be described in details.

Figure 24:
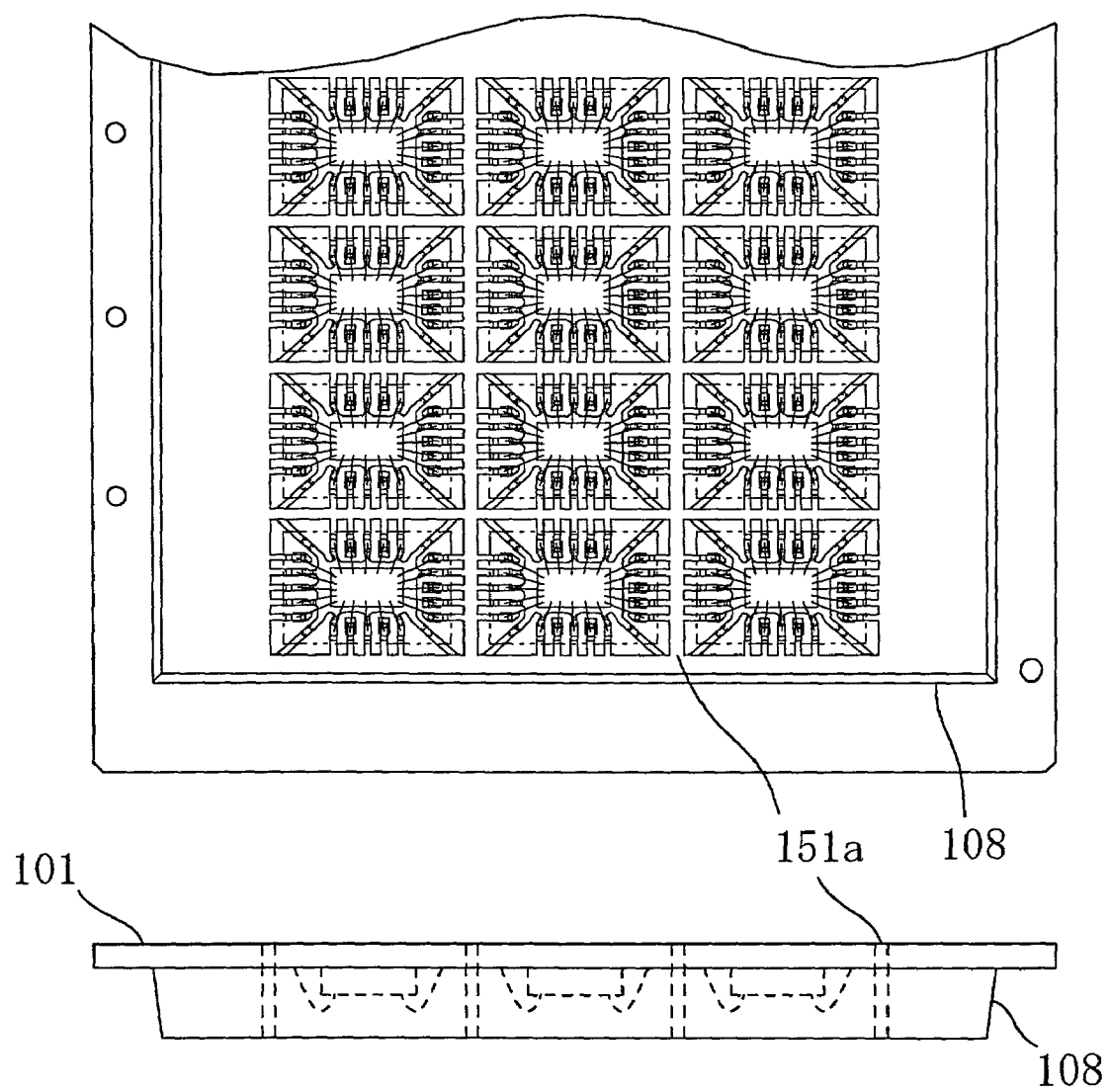
FIG. 24 is a view illustrating the structure of the entire lead frame after the resin encapsulation process shown in FIG. 22D is completed.
Figure 25A:
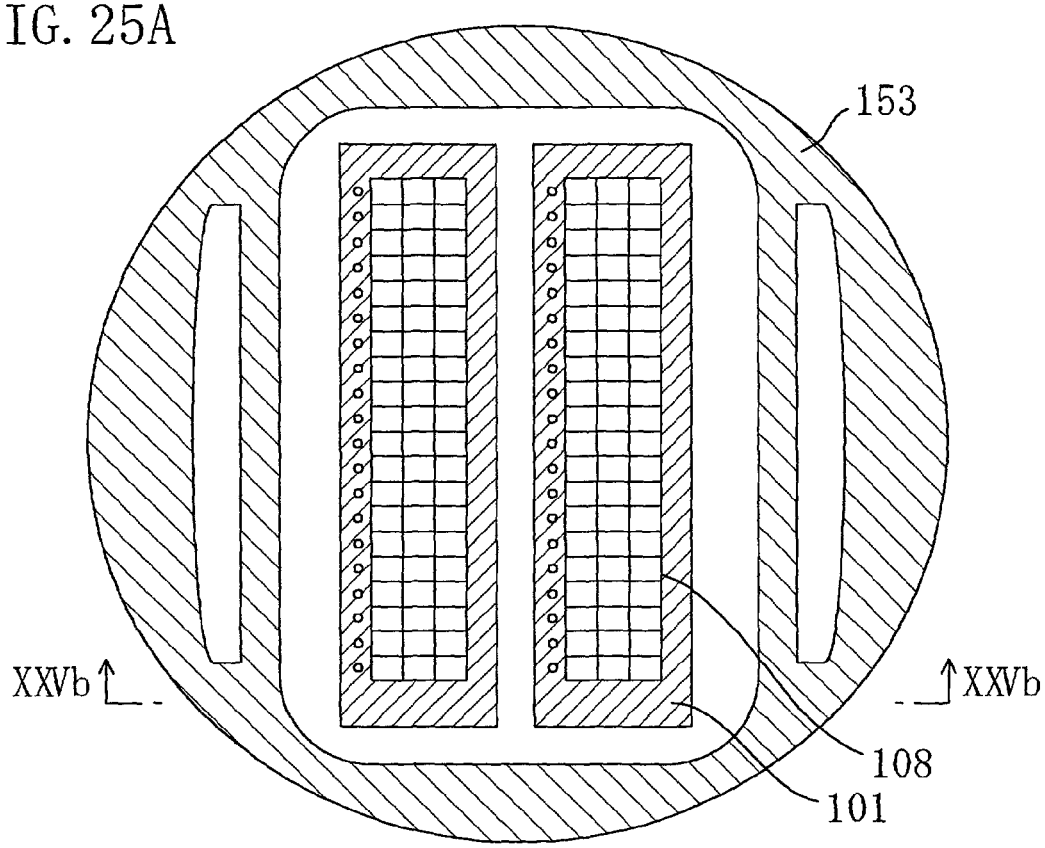
FIGS. 25A to 25C are a plan view illustrating a product separating process, a cross-sectional view taken along line XXVb-XXVb of the resin-encapsulated semiconductor device before the product separating process, and a cross-sectional view of an enlarged cut portion of the resin-encapsulated semiconductor device in the product separation.
Figure 25B:
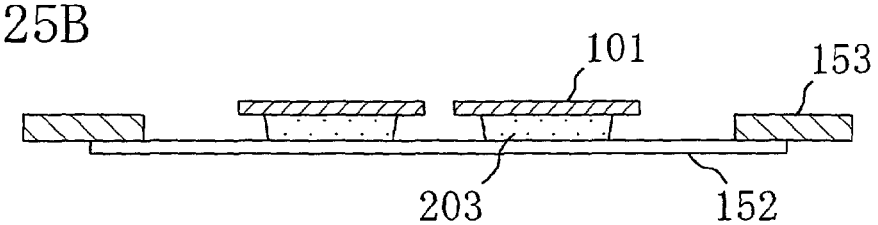
Figure 25C:
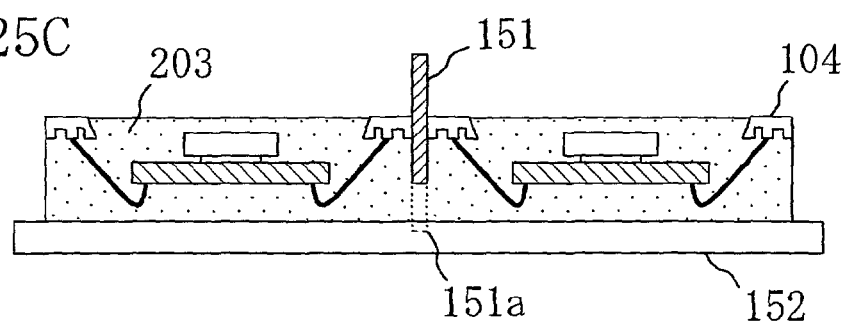

FIG. 24 is a view illustrating the structure of the entire lead frame after the resin encapsulation process shown in FIG. 22D is completed. FIGS. 25A to 25C are a plan view, a cross-sectional view taken along line XXVb-XXVb, and a cross-sectional view showing an enlarged cut portion, respectively, which illustrate the product separating process.

As shown in FIG. 25A, in the product separating process, the lead frame shown in FIG. 24 that has been subjected to the resin encapsulation is attached onto a tape 152 for device attachment that is held by a holding ring 153. In this case, the resin-encapsulated lead frame is attached onto the tape 152 for device attachment with its lower surface (on the side of external terminals) facing upward. This facilitates registration of the device separation line 151a for separating products, and makes it possible not to cause metal burr at the time of cutting of the lead frame. Then, as shown in FIG. 25C, the resin-encapsulated lead frame is cut along the device separation line 151a with a blade 151 for separating devices. At this time, the blade is cut into the tape 152 for device attachment by about 10 to 20 μm. This makes it possible that the cut surface of the resin-encapsulated semiconductor device can be smooth. Then, a large number of resin-encapsulated semiconductor devices can be simultaneously obtained by removing the resin-encapsulated semiconductor devices from the tape 152 for device attachment. Here, the tape 152 for device attachment is a substrate having a thickness of 100 μm to 200 μm that is coated with an acrylic adhesive having a thickness of several μm to ten several μm. Since the adhesion of the tape is deteriorated by UV irradiation, the resin-encapsulated semiconductor devices can be picked up without being damaged.

In the process shown in FIG. 22C, in general, the metal thin wires 202 are provided so as not to be cross each other, but can be provided so as to cross each other.

Figure 26A:
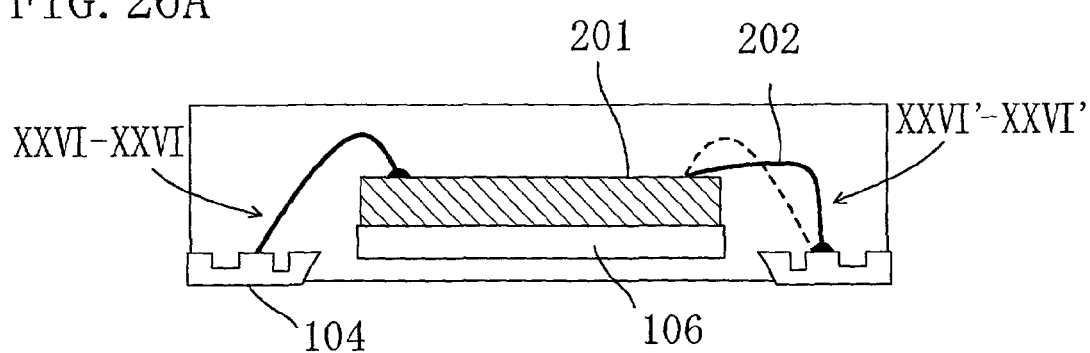
FIGS. 26A and 26B are a cross-sectional view in the cross section including line XXVI-XXVI and line XXVI'-XXVI' of an eight variation of the resin-encapsulated semiconductor device of this embodiment in which metal thin wires are crossed, and a plan view of the lead frame of the resin-encapsulated semiconductor device.
Figure 26B:
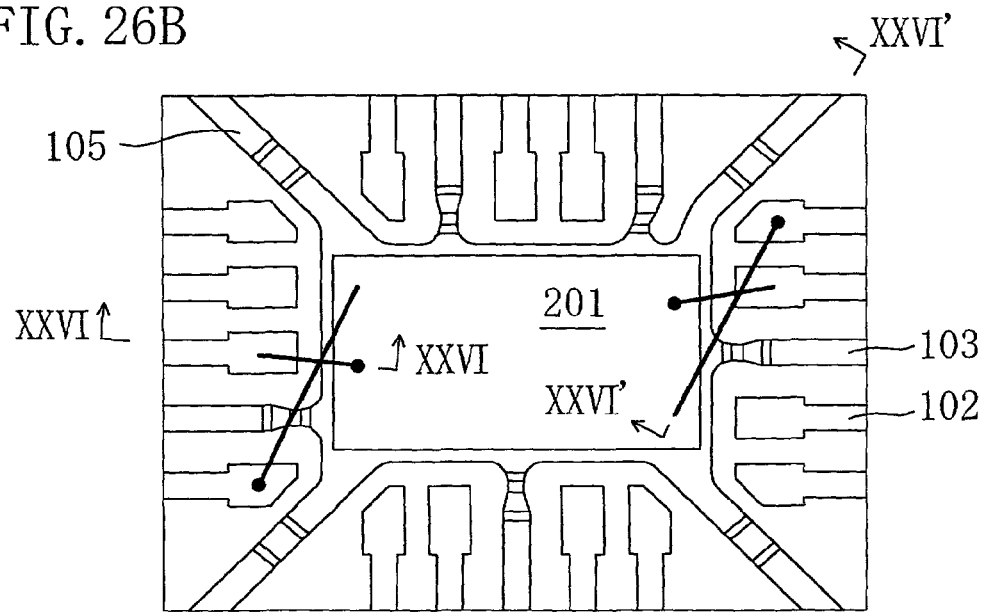

FIGS. 26A and 26B are a cross-sectional view in the cross section including line XXVI-XXVI and line XXVI'-XXVI' of an eighth variation of the resin-encapsulated semiconductor device of this embodiment in which metal thin wires are crossed, and a plan view showing the lead frame of the eighth variation, respectively. When the metal thin wires 202 are provided between the signal leads 102 and the electrode pads, in general, the head portion of the metal thin wires 202 are melted by arc (spark of high voltage) so as to be ball-like shaped, and this portion is first bonded to the electrode pad, and then the other end of the metal thin wire 202 is connected to the signal lead 102. When the side that is first connected is referred to as "first side", and the side that is connected later is referred to as "second side", a metal ball is formed on the first side, so that the metal thin wire 202 stands up substantially perpendicularly in the connection point. On the other hand, the metal thin wire is connected by being pressed with rubbing on the second side, so that the metal thin wire does not stand up and is connected at a small angle. Then, in this variation, the first side corresponds to the signal leads 102 side, and the second side corresponds to the electrode pad side, so that the height of the metal thin wires 202 connected to the electrode pads is small. Therefore, as shown in the right half portion of the FIG. 26A, as the next process, the metal thin wire 202 is provided so as to be connected to the electrode pad as the first side, so that the metal thin wires 202 can cross each other.

In this variation, the interference between high frequency signals passing through the metal thin wires 202 is suppressed and the insertion loss is reduced by crossing the metal thin wires 202.

Second Embodiment

As a second embodiment of the present invention, HQFN (Quad Flat Non-leaded Package provided with a heat sink), which is a variation of the QFN, will be described.

Figure 27A:
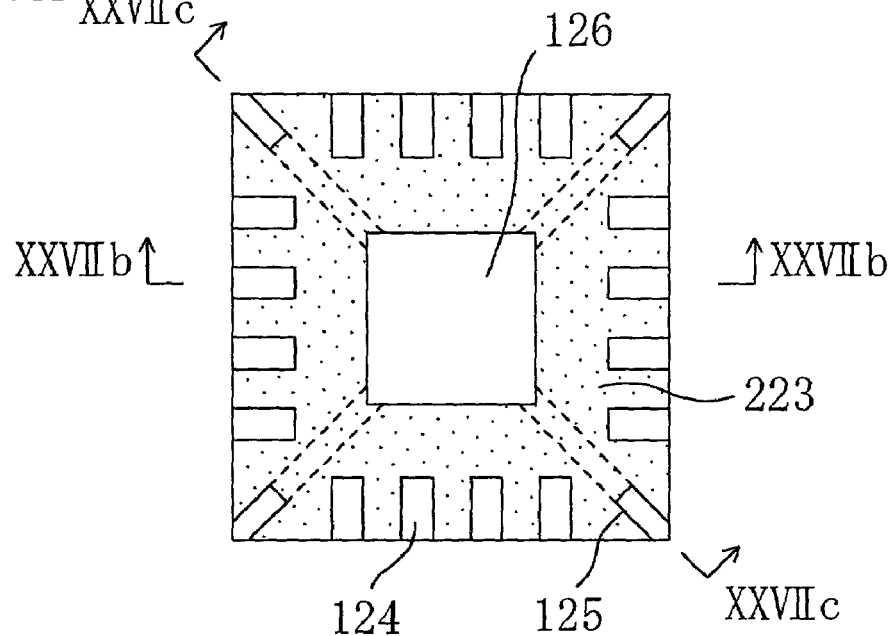
FIGS. 27A to 27C are a plan view showing a resin-encapsulated semiconductor device of a second embodiment of the present invention, a cross-sectional view taken along XXVIIb-XXVIIb of the resin-encapsulated semiconductor device, and a cross-sectional view taken along XXVIIc-XXVIIc of the resin-encapsulated semiconductor device, respectively.
Figure 27B:
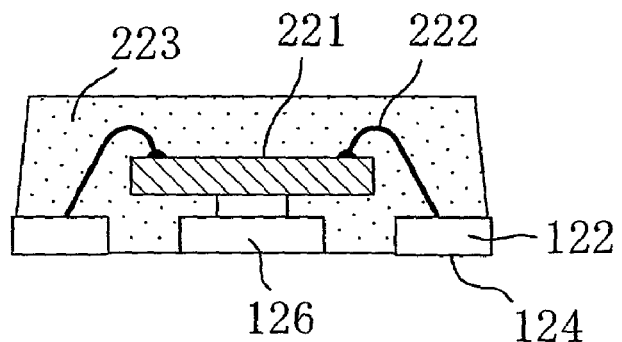
Figure 27C:
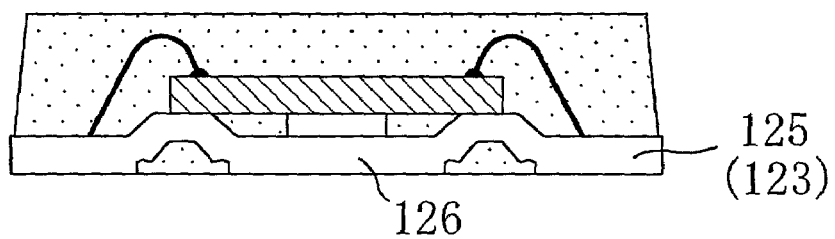

FIGS. 27A to 27C are a plan view when viewed from the bottom, showing a resin-encapsulated semiconductor device of this embodiment that is HQFN, a cross-sectional view taken along XXVIIb-XXVIIb of the resin-encapsulated semiconductor device, and a cross-sectional view taken along XXVIIc-XXVIIc of the resin-encapsulated semiconductor device, respectively. As shown in FIGS. 27A to 27C, the resin-encapsulated semiconductor device of this embodiment are substantially a rectangular solid, and includes a die pad 126, a plurality of signal leads 122 provided along the four sides of the bottom surface of the device, ground connection leads 123 (not shown) connected to the die pad 126, a semiconductor chip 221 fixed on the upper surface of the die pad 126 with an adhesive and having electrode pads, and metal thin wires 222 connecting the signal leads 122 and the electrode pads of the semiconductor chip 221, suspended leads 125 connected to the die pad, and an encapsulating resin 223 for encapsulating the die pad 126, the semiconductor chip 221, the suspended leads 125, and the upper surfaces of the signal leads 122 and the ground connection leads 123. The lower surface of the die pad 126, and the lower surfaces and the side end faces of the ground connection leads 123 and the signal leads 122 are exposed on the bottom surface of the device, and in particular, the lower portion of the signal leads 122 exposed on the bottom surface of the device act as the external terminals 124.

In the resin-encapsulated semiconductor device of this embodiment, unlike the resin-encapsulated semiconductor device of the first embodiment, the lower surface of the die pad 126 on which the semiconductor chip 221 is to be mounted is exposed to the outside in order to improve the heat release performance. The bottom surface of the resin-encapsulated semiconductor device including the exposed surface of the die pad 126 is soldered directly to a mother substrate. As shown in FIG. 27C, the suspended leads 125 exposed in the four corners of the bottom surface of the resin-encapsulated semiconductor device are connected to the die pad 126 and also electrically connected to the electrode pads for grounding of the semiconductor chip 221, so that they also act as ground connection leads 123.

The resin-encapsulated semiconductor device of this embodiment is provided with the ground connection leads 123, so that the electrical characteristics are stabilized. In addition, as in the first embodiment, the ground connection leads are provided between the signal leads 122, so that interference between high frequencies passing through the signal leads 122 can be suppressed, and the insertion loss can be smaller than that of the conventional resin-encapsulated semiconductor device. In particular, when the signal leads 122 and the ground connection leads 123 are provided alternately, this effect can be large.

Figure 28A:
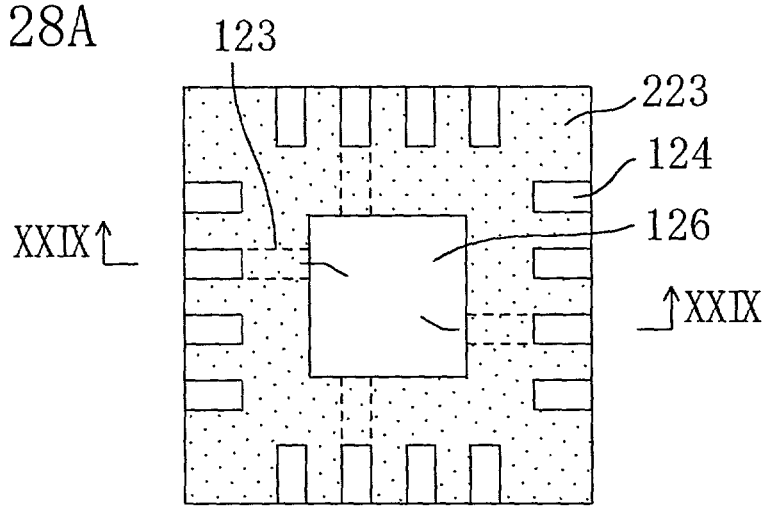
FIGS. 28A to 28C are plan views illustrating the position of the ground connection leads in the resin-encapsulated semiconductor device of the second embodiment.
Figure 28B:
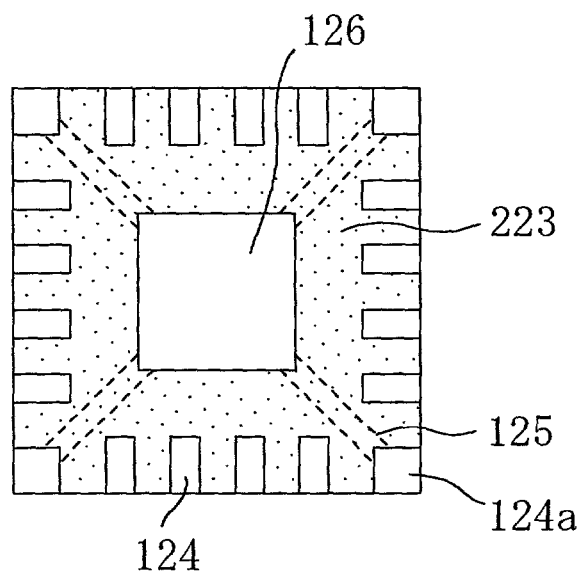
Figure 28C:
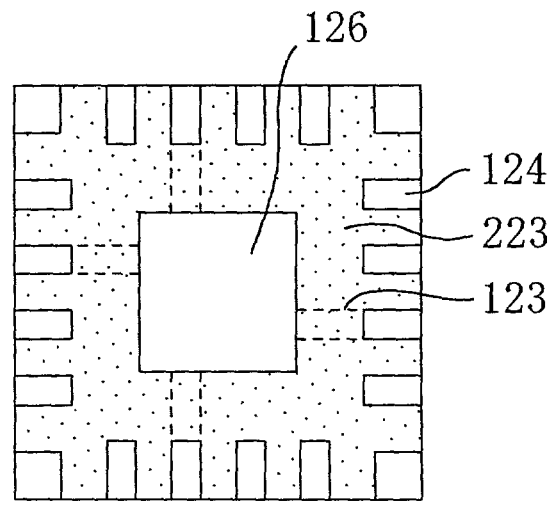

FIGS. 28A to 28C are plan views when viewed from the bottom, illustrating the position of the ground connection leads in the resin-encapsulated semiconductor device of this embodiment.

As shown in FIG. 28A, in the resin-encapsulated semiconductor device of this embodiment, the ground connection lead 123 can be provided between two signal leads 122 without providing the suspended leads 125. Alternatively, as shown in FIG. 28B, the suspended leads 125 can be provided to serve also as ground connection leads. Alternatively, as shown in FIG. 28C, the suspended leads 125 and the ground connection leads 123 are provided as discrete components. It is also possible to allow the suspended leads 125 to serve also as the ground connection leads 123 and to provide the ground connection leads 123 between the signal leads 122.

Next, a method for processing of the lead frame used in the resin-encapsulated semiconductor device of this embodiment will be described. Since in the HQFN, the lower surface of the die pad 126 is exposed on the bottom surface, it is necessary to perform processing for raising the portion near the connection portion with the die pad 126 of the ground connection leads 123 in order to raise the mounting position of the semiconductor chip 221 higher than the upper surface of the signal leads.

Figure 29A:
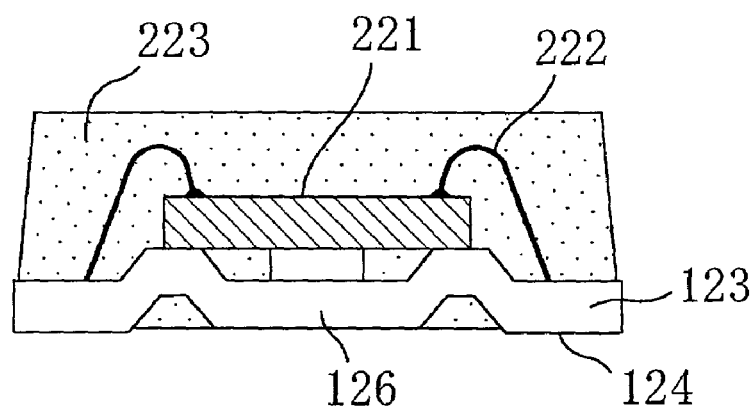
FIG. 29A is a cross-sectional view showing the resin-encapsulated semiconductor device of the second embodiment employing a lead frame that has been subjected to tapered step processing.
Figure 29B:
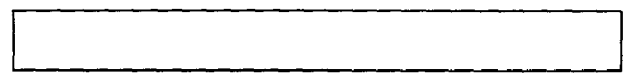
FIGS. 29B and 29C are cross-sectional views showing the processing process of the lead frame.
Figure 29C:
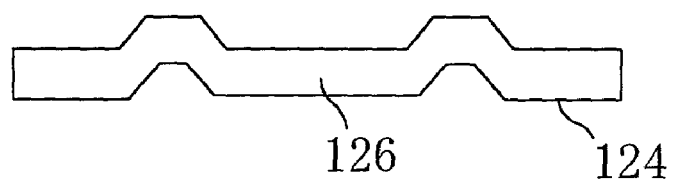

FIG. 29A is a cross-sectional view showing the resin-encapsulated semiconductor device of this embodiment employing the lead frame that has been subjected to tapered step processing. FIGS. 29B and 29C are cross-sectional views showing the processing process of the lead frame. FIG. 29A shows the cross section taken along line XXIX-XXIX shown in FIG. 28A.

As shown in FIGS. 29B and 29C, the portion near the connection portion with the die pad 126 of the ground connection leads 123 can be lifted with a pressing apparatus. In this case, how much that portion is lifted can be set freely to some extent.

Figure 30A:
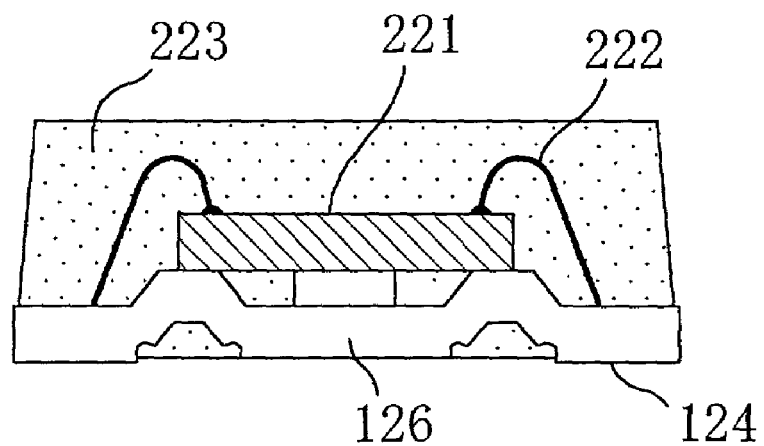
FIG. 30A is a cross-sectional view showing the resin-encapsulated semiconductor device of the second embodiment employing a lead frame that has been subjected to groove processing and tapered step processing.
Figure 30B:
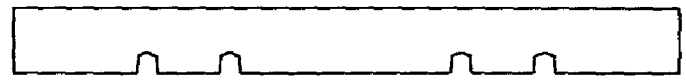
FIGS. 30B and 30C are cross-sectional views showing the processing processes of the lead frame.
Figure 30C:
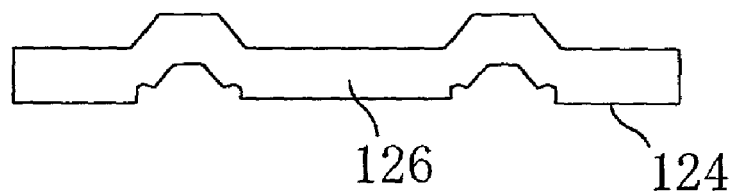

FIG. 30A is a cross sectional view showing the resin-encapsulated semiconductor device of this embodiment employing the lead frame that has been subjected to groove processing and tapered step processing. FIGS. 30B and 30C are cross sectional views showing the processing processes of the lead frame. FIG. 30A shows the cross section taken along line XXIX-XXIX shown in FIG. 28A.

When the lead frame has a sealing tape, the resin can be prevented from penetrating into the gap between the sealing tape and the external terminals 124 at the time of resin encapsulation, by providing grooves on the lower surface of the rising portion at the step. When processing the lead frame, as shown in FIG. 30B, after grooves are formed in a portion that will become a rising portion of the lifted portion, the periphery of the die pad 126 is lifted by press processing, as shown in FIG. 30C.

Figure 31A:
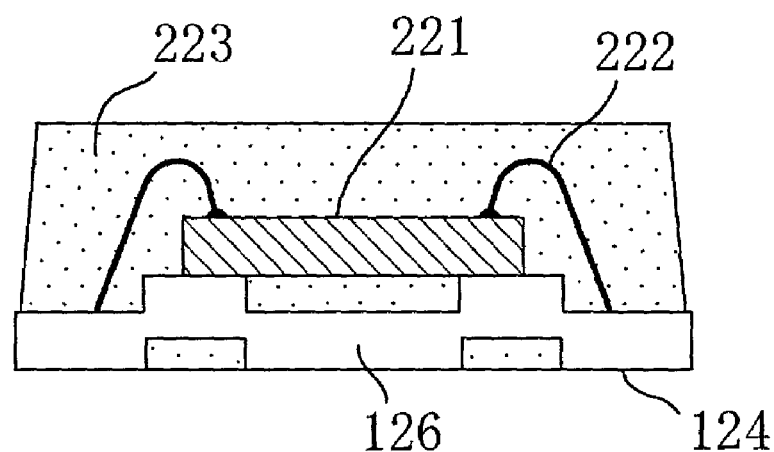
FIG. 31A is a cross-sectional view showing the resin-encapsulated semiconductor device of the second embodiment employing a lead frame that has been subjected to semi-cutting processing.
Figure 31B:
FIGS. 31B and 31C are cross-sectional views showing the processing process of the lead frame.
Figure 31C:
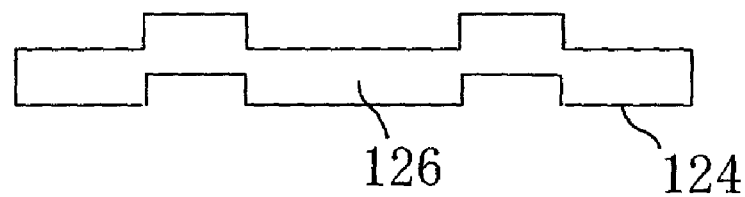

FIG. 31A is a cross sectional view showing the resin-encapsulated semiconductor device of this embodiment employing the lead frame that has been subjected to semi-cutting processing. FIGS. 31B and 31C are cross sectional views showing the processing process of the lead frame.

As shown in FIGS. 31B and 31C, it is also possible to lift the portion near the connection portion with the die pad 126 of the ground connection leads 123 with the thickness of the original lead frame substantially unchanged by performing processing with respect to one semi-cut lead frame. This processing permits processing in the range within the thickness of the lead frame, and can eliminate an "engagement margin", which is required in press processing, so that this processing is used preferably in lead frames for a thin or compact resin-encapsulated semiconductor device.

Figure 32A:
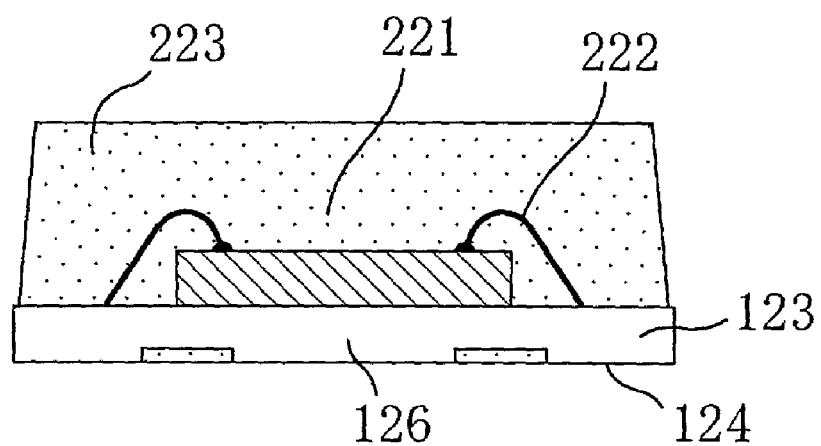
FIG. 32A is a cross-sectional view showing the resin-encapsulated semiconductor device of the second embodiment employing a lead frame that has been subjected to crushing processing and etching.
Figure 32B:
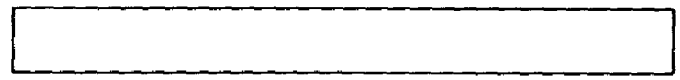
FIGS. 32B and 32C are cross-sectional views showing the processing processes of the lead frame.
Figure 32C:
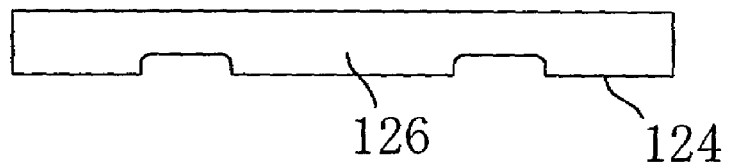

FIG. 32A is a cross sectional view showing the resin-encapsulated semiconductor device of this embodiment employing the lead frame that has been subjected to step processing by crushing processing or etching. FIGS. 32B and 32C are cross sectional views showing the processing process of the lead frame.

As shown in FIGS. 32A to 32C, step processing can be performed by crushing processing or etching. Furthermore, the upper surfaces of the ground connection lead 123 and the signal lead can be made thin in the state as shown in FIG. 32C.

Figure 33A:
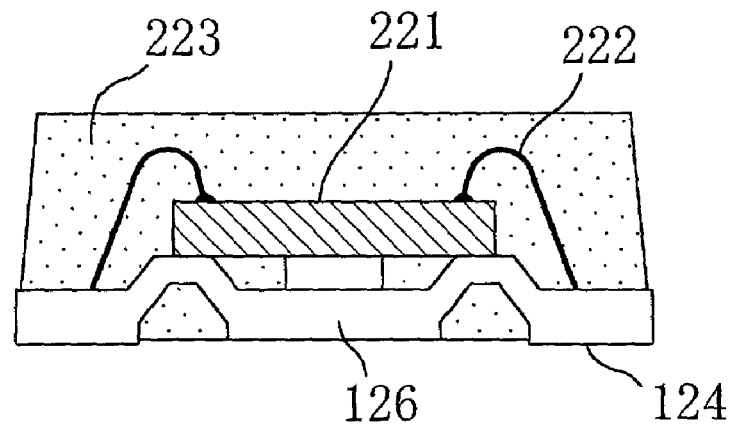
FIG. 33A is a cross-sectional view showing the resin-encapsulated semiconductor device of the second embodiment employing a lead frame that has been subjected to processing combining crushing processing or etching and tapered step processing.
Figure 33B:
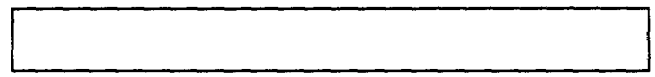
FIGS. 33B to 33D are cross-sectional views showing the processing process of the lead frame.

FIG. 33A is a cross sectional view showing the resin-encapsulated semiconductor device of this embodiment employing the lead frame that has been subjected to crushing processing or etching combined with tapered step processing. FIGS. 33B and 33D are cross sectional views showing the processing process of the lead frame.

Figure 33C:
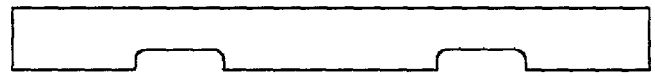
Figure 33D:
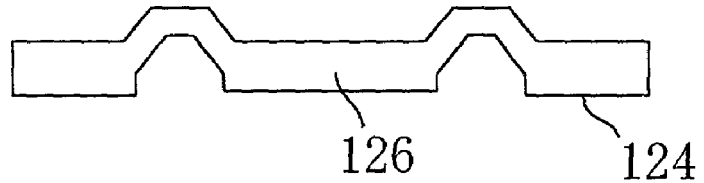

As shown in FIGS. 33B to 33D, a lead frame is first subjected to crushing process or etching to reduce the thickness of the lower portion of the portion near the connection portion with the die pad 126 of the ground connection leads 123, and then a lifted portion can be formed by press processing. According to this method, the height of the lifted portion can be adjusted to an arbitrary height.

When raising at least a portion of the upper surface of the die pad 126 higher than the upper surface of the signal leads 122 by the above-described step processing using semi-cutting processing or etching, it is preferable that the set-up height is 0.03 mm or more and not more than ¾ of the thickness of the lead frame, as in the case of the QFN.

Figure 34A:
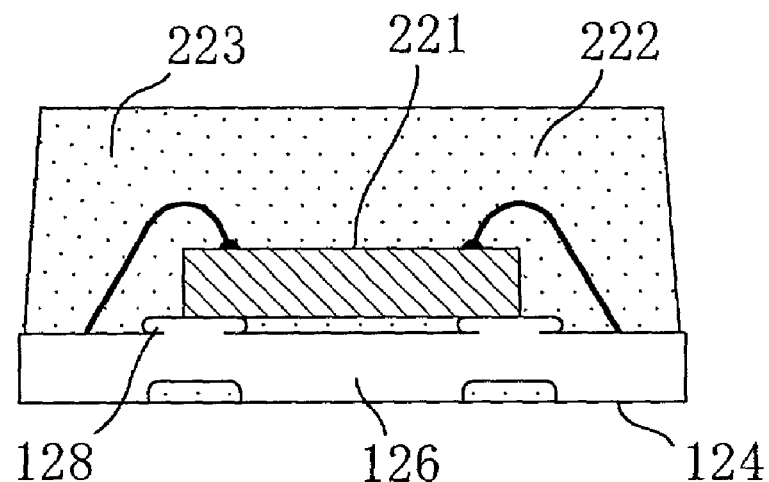
FIG. 34A is a cross-sectional view showing the resin-encapsulated semiconductor device of the second embodiment employing an example of a lead frame that has been subjected to processing combining tapered step processing and crushing processing.
Figure 34B:
FIGS. 34B and 34C are cross-sectional views showing the processing process of the lead frame.
Figure 34C:
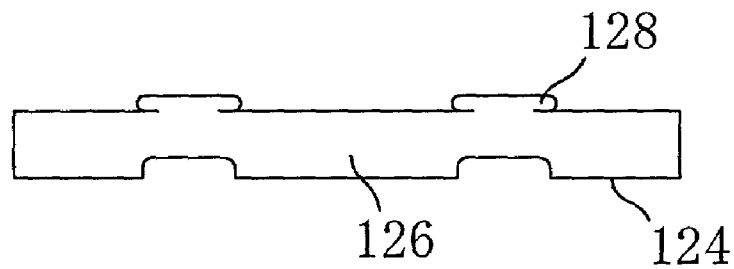
Figure 34D:
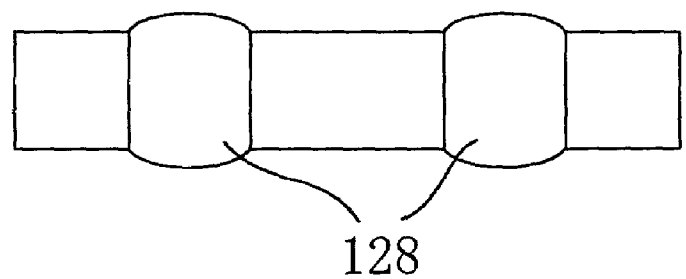
FIG. 34D is a plan view of a projected portion of the lead frame when viewed from the above.

FIG. 34A is a cross sectional view showing the resin-encapsulated semiconductor device of this embodiment employing the lead frame that has been subjected to tapered step processing (press processing) combined with crushing processing. FIGS. 34B and 34C are cross sectional views showing the processing process of the lead frame. FIG. 34D is a plan view of a projected portion of the lead frame when viewed from the above.

As shown in FIGS. 34B to 34D, after the steps are provide in the lead frame by press processing or the like, and then crushing processing is performed from the above while the lower surface is secured, so that a projected portion 128 is formed on the upper surface. If this lead frame is used, the position of the semiconductor chip 221 can be kept higher than the upper surface of the signal leads. As shown in FIG. 34D, the width of the projected portion 128 in the short direction is larger than that of the other portions of the ground connection leads 123 in a plan view. Therefore, engagement with the encapsulating resin 223 can be firm during resin encapsulation, and the adherence with the resin can be improved (so-called "anchor effect"). Thus, peeling or cracks can be prevented from being generated in a thin portion of the resin on the lower surface of the step portion. Herein, the direction in which the ground connection leads 123 are extending toward the die pad 126 is referred to as "longitudinal direction", and the direction that is orthogonal to this direction is referred to as "short direction".

Figure 35A:
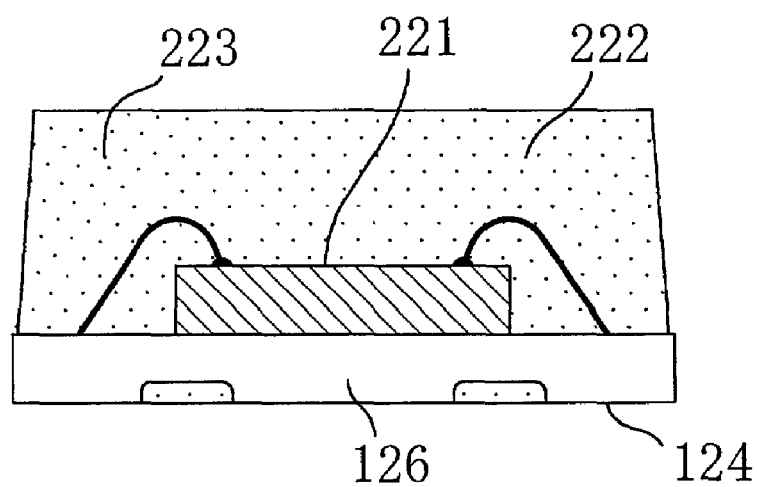
FIG. 35A is a cross-sectional view showing the resin-encapsulated semiconductor device of the second embodiment employing an example of a lead frame that has been subjected to processing combining tapered step processing and crushing processing.
Figure 35B:
FIGS. 35B and 35C are cross-sectional views showing the processing process of the lead frame.
Figure 35C:
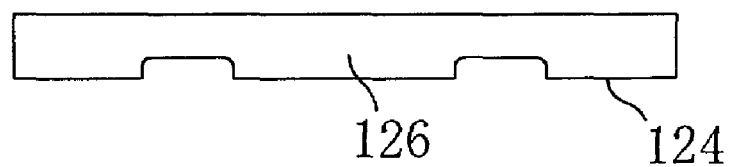
Figure 35D:
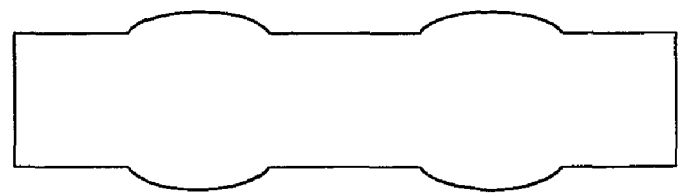
FIG. 35D is a plan view of a projected portion of the lead frame when viewed from the above.

FIG. 35A is a cross sectional view showing the resin-encapsulated semiconductor device of this embodiment employing the lead frame that has been subjected to tapered step processing combined with crushing processing. FIGS. 35B and 35C are cross sectional views showing the processing process of the lead frame. FIG. 35D is a plan view of a projected portion of the lead frame when viewed from the above.

As shown in FIGS. 35B to 35D, similarly to the lead frame shown in FIGS. 34B to 34D, the upper surface of the lead frame can be smooth and the width of only the projected portion can be made larger than that of the other portions of the ground connection leads 123 by combining tapered step processing and crushing processing. Thus, the anchor effect can be obtained in the resin encapsulation.

Third Embodiment

As a third embodiment of the present invention, a resin-encapsulated semiconductor device that is an SON will be described with reference to the accompanying drawings.

Figure 36A:
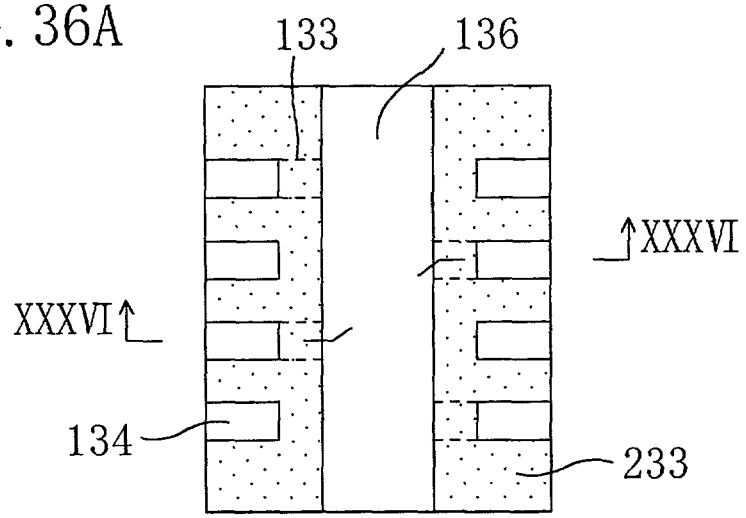
FIG. 36A is a plan view of a resin-encapsulated semiconductor device of a third embodiment of the present invention.
Figure 36B:
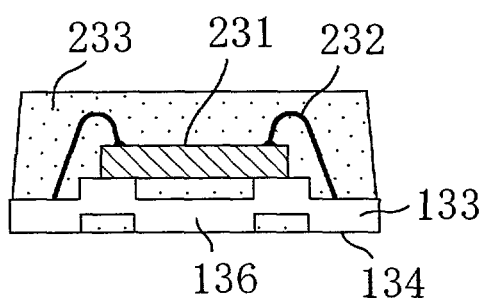
FIGS. 36B to 36D are cross-sectional views taken along line XXXVI-XXXVI of the resin-encapsulated semiconductor devices employing lead frames that have been subjected to different processing.
Figure 36C:
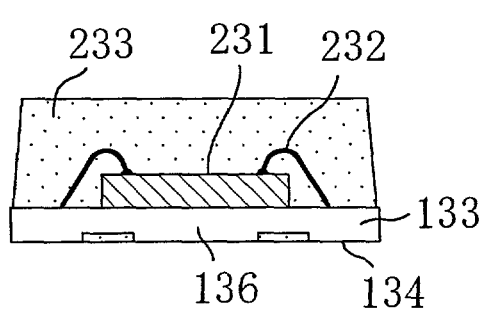
Figure 36D:
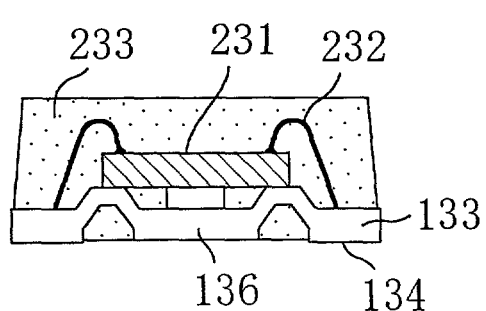

FIG. 36A is a plan view when viewed from the bottom, showing a resin-encapsulated semiconductor device of this embodiment that is HSON (Small Outline Non-leaded Package provided with a heat sink). FIGS. 36B to 36D are cross-sectional views taken along line XXXVI-XXXVI of the resin-encapsulated semiconductor devices employing the lead frames that have been subjected to different processing. In the resin-encapsulated semiconductor device of this embodiment, the entire lower surface of the die pad is exposed, and even among the SONs, this device has the most improved heat release performance.

As shown in FIGS. 36A to 36D, the resin-encapsulated semiconductor device of this embodiment has a quadrangular bottom surface, and includes the die pad 136 whose lower surface is entirely exposed, the signal leads (not shown) provided along the opposite sides of the bottom surface in the longitudinal direction, the ground connection leads 133 connected to the die pad 136 and provided parallel to the signal leads along the opposite sides of the bottom surface in the longitudinal direction, a semiconductor chip 231 mounted on the upper surface of the die pad 136 and having electrode pads, and metal thin wires 232 electrically connecting the electrode pads and the signal leads or the ground connection leads 133, and an encapsulating resin 233 for encapsulating the upper surfaces of the signal leads, the ground connection leads 133 and the die pad, and the semiconductor chip 231. The signal leads and the ground connection leads that are aligned in a row are provided alternately. The lower surfaces of both the signal leads and the ground connection leads 133 serve as external terminals 134. Steps are provided in an area near the die pad 136 of the ground connection leads 133.

The resin-encapsulated semiconductor device of this embodiment is different from the resin-encapsulated semiconductor device that is QFN of the first the second embodiments in that the external terminal 134 are provided only on the two sides of the bottom surface in the longitudinal direction, and thus a space for the opposite end portion of the die pad 136 to be utilized as terminals for grounding and reinforcement can be obtained. Therefore, in the resin-encapsulated semiconductor device of this embodiment, the degree of freedom can be large.

Also in such an HSON, the electrical characteristics are stabilized by providing at least one ground connection lead 133. In addition, the insertion loss can be reduced effectively during operation with high frequency signals by having the signal leads surrounded by the ground connection leads 133 and the die pad 136. In this embodiment as well, it is particularly preferable to provide the signal leads and the ground connection leads 133 alternately for high frequency characteristics. Since in the SONs, the number of the external terminals is limited, compared with the QFNs, whereas the degree of freedom is larger, so that the optimum design to improve the high frequency characteristics easily can be realized.

In this embodiment as well as in the first and the second embodiments, the step processing of the ground connection leads 133 and the die pad 136 can be performed by semi-cutting processing (see FIG. 36B), crushing processing or etching (see FIG. 36C), crushing processing and tapered step processing (see FIG. 36D) or the like.

Next, a variation of the resin-encapsulated semiconductor device of this embodiment that is an SON in which a portion of the lower surface of the die pad 136 is not exposed will be described.

Variation of the Third Embodiment

Figure 37A:
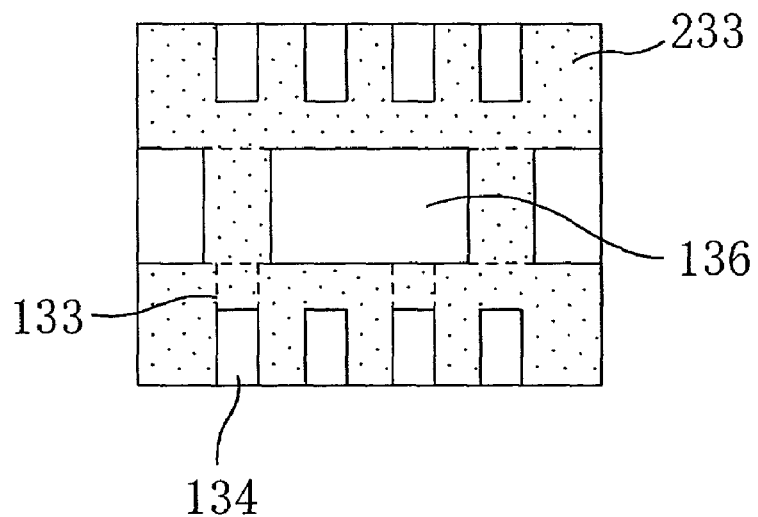
FIG. 37A is a plan view of a first variation of the resin-encapsulated semiconductor device of the third embodiment.
Figure 37B:
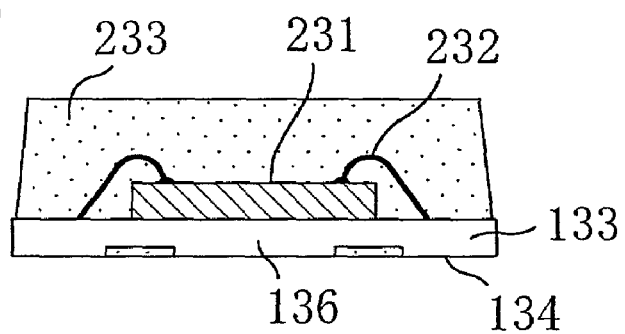
FIG. 37B is a cross-sectional view of the first variation when a lead frame that has been subjected to step processing is used.
Figure 37C:
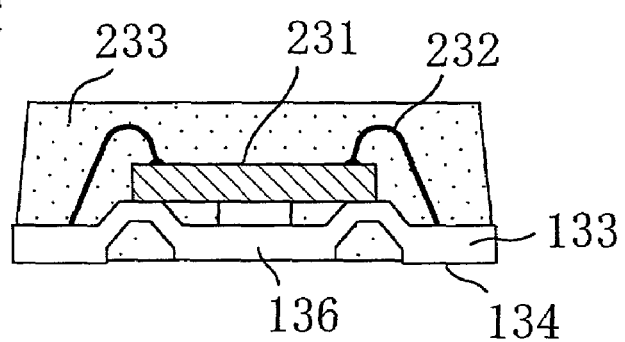
FIG. 37C is a cross-sectional view of the first variation when a lead frame that has been subjected to step processing and tapered step processing is used.

FIG. 37A is a plan view of a first variation of the resin-encapsulated semiconductor device of this embodiment when viewed from the bottom. FIG. 37B is a cross-sectional view of the first variation when a lead frame that has been subjected to step processing is used. FIG. 37C is a cross-sectional view of the first variation when a lead frame that has been subjected to step processing and tapered step processing is used. FIGS. 37B and 37C show the cross sections passing through the die pad 136 and taken along the longitudinal direction.

As shown in FIG. 37A, this variation, which is an SON, has substantially the same structure as that of a HQFN, but is different from the HQFN in that the portions between the central portion and the opposite end portions of the die pad 136 are not exposed. Also in such an embodiment, the electrical characteristics can be stabilized by providing the ground connection leads 133. In addition, the high frequency characteristics can be improved effectively by having the signal leads surrounded by the ground connection leads 133 and the die pad 136.

The lead frame that has been subjected to step processing by crushing processing or etching as shown in FIG. 37B or the lead frame that has been subjected to taper step processing after crushing processing or etching as shown in FIG. 37C can be used in this variation.

Figure 38A:
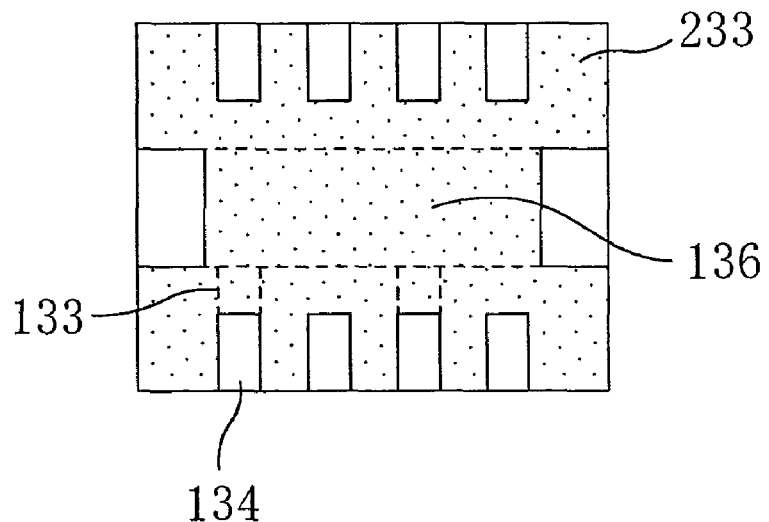
FIG. 38A is a plan view of a second variation of the resin-encapsulated semiconductor device of the third embodiment.
Figure 38B:
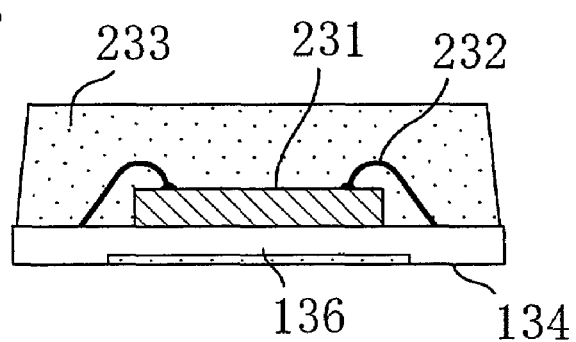
FIG. 38B is a cross-sectional view of the second variation when a lead frame that has been subjected to step processing is used.
Figure 38C:
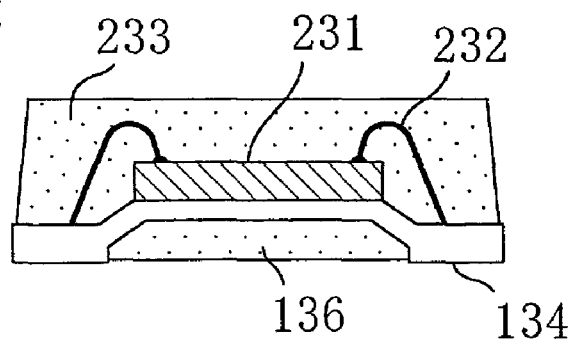
FIG. 38C is a cross-sectional view of the second variation when a lead frame that has been subjected to step processing and tapered step processing is used.
Figure 39A:
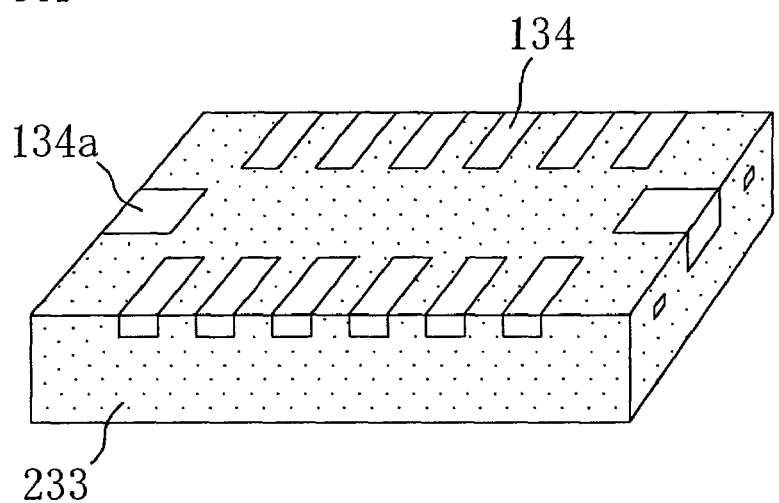
FIG. 39A is a perspective view showing an appearance of the second variation of the resin-encapsulated semiconductor device of the third embodiment.

Next, FIG. 38A is a plan view of a second variation of the resin-encapsulated semiconductor device of this embodiment when viewed from the bottom. FIG. 38B is a cross-sectional view of the second variation when a lead frame that has been subjected to step processing is used. FIG. 38C is a cross-sectional view of the second variation when a lead frame that has been subjected to step processing and tapered step processing is used. FIG. 39A is a perspective view showing the appearance of the second variation of the resin-encapsulated semiconductor device of this embodiment, and FIG. 39B shows a plan view showing the inner portion of the second variation and a cross sectional view taken along a line passing through the die pad.

As shown in FIG. 38A, also in the SON in which only the opposite end portion of the die pad 136 are exposed on the bottom surface, the electrical characteristics can be stabilized and the high frequency characteristics can be improved by providing the ground connection leads 133.

The lead frame that has been subjected to step processing by crushing processing or etching as shown in FIG. 38B or the lead frame that has been subjected to taper step processing, in addition to crushing processing or etching, as shown in FIG. 38C can be used in this variation.

Figure 39B:
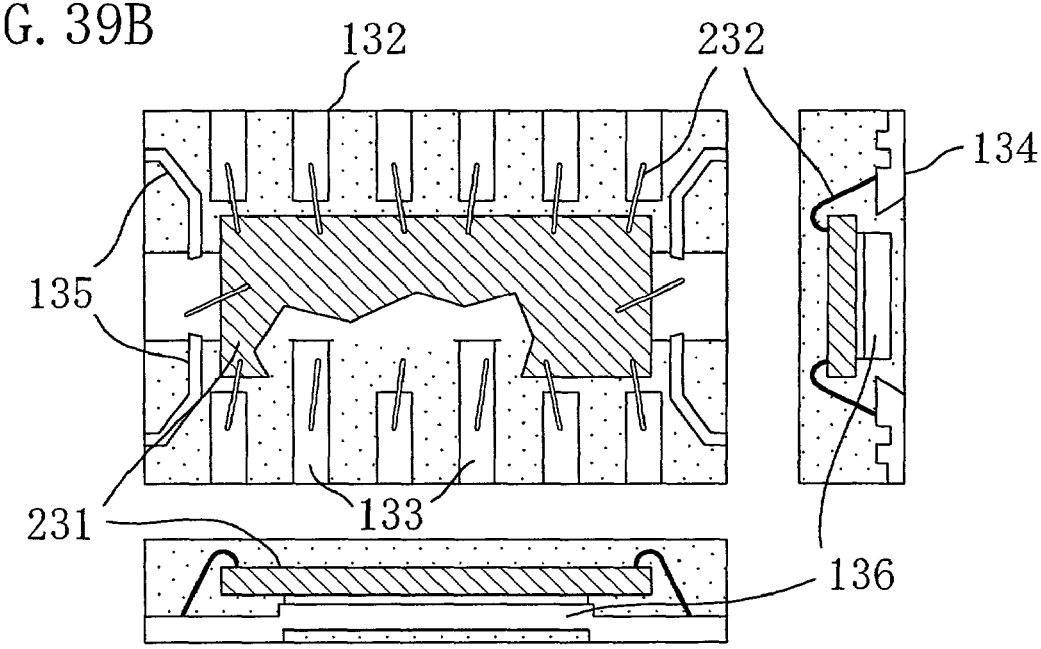
FIG. 39B shows a plan view showing the inside of the second variation, and a cross-sectional view taken along a line passing through the die pad.

In FIG. 39B, suspended leads 135 for supporting the die pad 136 are shown, but the suspended leads 135 are not necessarily provided, because the opposite end portion of the die pad 136 and the ground connection leads 133 support the die pad 136.

Fourth Embodiment

As a fourth embodiment of the present invention, a resin-encapsulated semiconductor device that is an LGA will be described below.

FIGS. 40A and 40B are a cross-sectional view showing the left half of a lead frame of a conventional LGA, and a plan view showing a quarter of the lead frame of the conventional LGA, respectively, and FIGS. 40C and 40D are a cross-sectional view showing the left half of a lead frame used in the resin-encapsulated semiconductor device of this embodiment, and a plan view showing a quarter of the lead frame used in the resin-encapsulated semiconductor device of this embodiment, respectively. FIGS. 40A and 40C show the cross sections passing through the signal leads or the ground connection leads and the die pad. In order to make the structure of the resin-encapsulated semiconductor device provided with this lead frame clear, the members other than the lead frame are shown by dotted lines.

As shown in FIGS. 40C and 40D, the lead frame of this embodiment includes a substantially quadrangular die pad 146, a plurality of signal leads 142 connected to a framing portion (not shown), a plurality of ground connection leads 143 connected to the framing portion and the die pad 146, and suspended leads 145 that supports the die pad 146 and functions as a reinforcing land in the resin-encapsulated semiconductor device. The area of the head portion (on the side of the die pad) of the signal leads 142 and the upper surface of the portion near the die pad 146 of the ground connection leads 143 is larger than that of the base portion (on the side of framing portion) and also the thickness thereof is also larger.

As seen from the comparison between FIGS. 40A and 40B and FIGS. 40C and 40D, the lead frame of this embodiment is different from the conventional lead frame in that the ground connection leads 143 are provided. In this example, the lower surface of the die pad 146 is smooth, but the central portion on the lower surface may be recessed upward.

The processing of the lead frame of this embodiment is performed by etching.

Figure 41A:
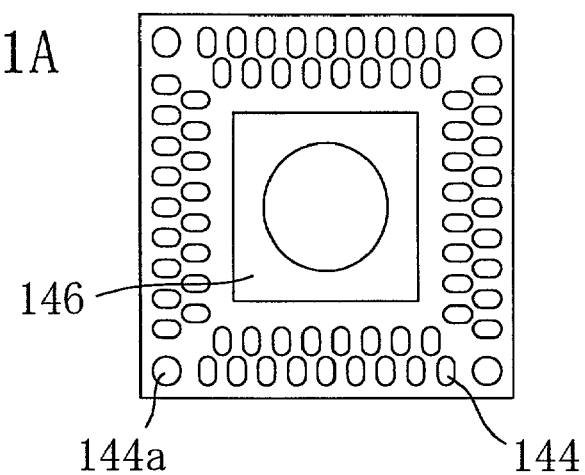
FIG. 41A is a plan view showing the resin-encapsulated semiconductor device of the fourth embodiment.
Figure 41B:
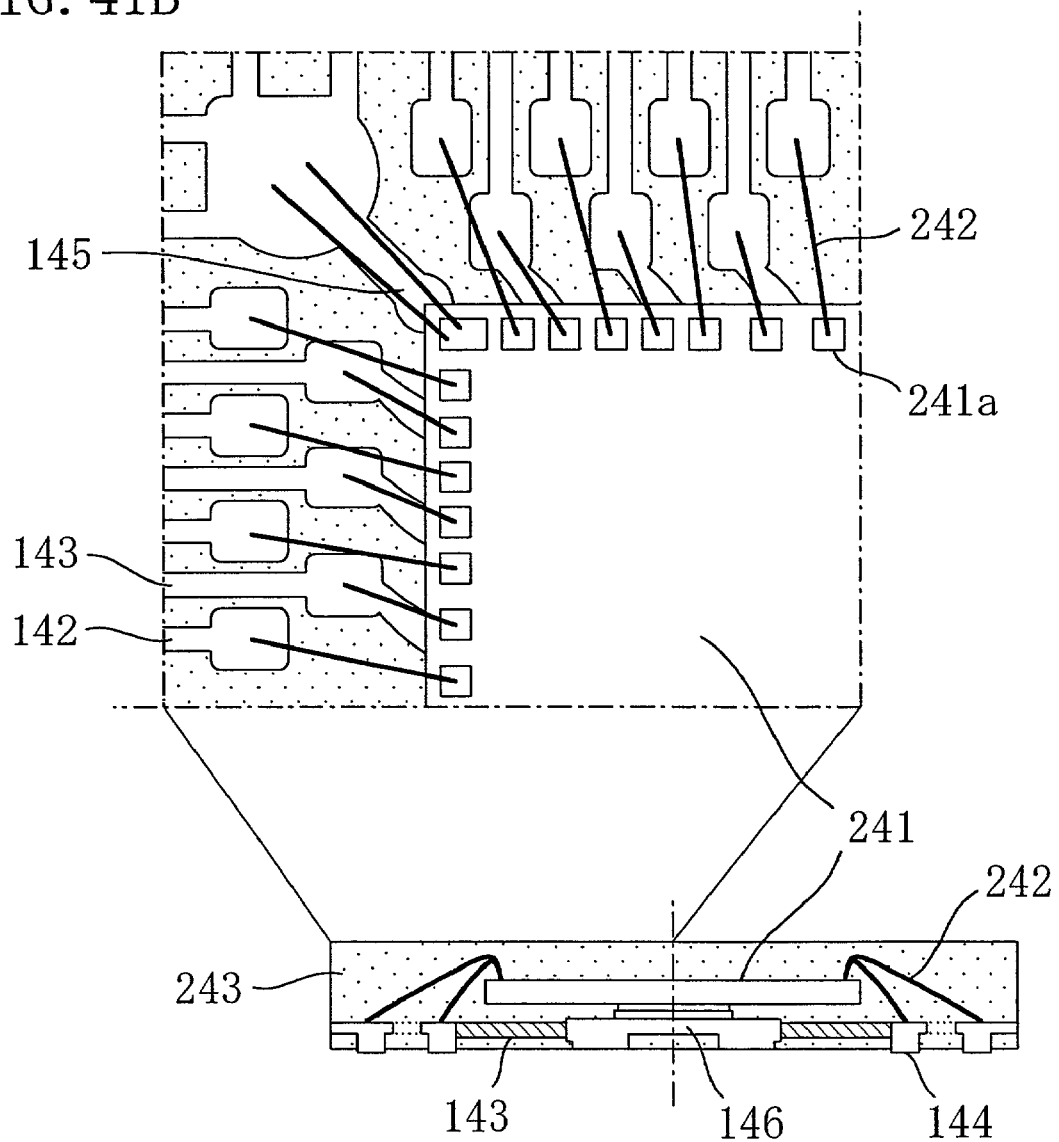
FIG. 41B shows a perspective plan view and a cross-sectional view showing the resin-encapsulated semiconductor device.

Next, FIG. 41A is a plan view of the resin-encapsulated semiconductor device of this embodiment when viewed from the bottom. FIG. 41B shows a transparent plan view and a cross-sectional view showing the resin-encapsulated semiconductor device of this embodiment. Herein, in the plan view of FIG. 41B, the signal leads 142, the ground connection leads 143, and the semiconductor chip 241 are shown for clarification.

As shown in FIGS. 41A and 41B, the resin-encapsulated semiconductor device of this embodiment has, for example a quadrangular bottom surface, and includes the die pad 146, a semiconductor chip 241 mounted on the upper surface of the die pad 146 and having electrode pads 241a, the signal leads 142 arranged around the die pad 146, the ground connection leads 143 arranged around the die pad 146 and connected to the die pad 146, and metal thin wires 242 connecting the electrode pads 241a and the signal leads 142 and the electrode pads 241a for grounding and the ground connection leads 143, suspended leads 145 supporting the die pad 146, and an encapsulating resin 243 for encapsulating the die pad 146, the semiconductor chip 241, the metal thin wires 242 and the suspended leads 145 in such a manner that at least a portion of the lower surfaces of the signal leads 142 and the ground connection leads 143 is exposed as external terminals 144. On the bottom surface of the resin-encapsulated semiconductor device of this embodiment, two rows of external terminals are exposed while surrounding the die pad 146, and the appearance thereof is the same as that of a conventional LGA. At least a portion of the lower portions of the suspended leads 145 is exposed on the bottom surface of the device, and serves as a reinforcement land 144a having a larger area than that of the external terminal 144. The reinforcement land 144a is provided for reinforcement so as to prevent peeling when connecting the external terminal 144 of this embodiment to a terminal of a mother substrate. Furthermore, in this embodiment, the electrode pads 241a for grounding are connected to the suspended leads 145 via the metal thin wires 242, and the suspended leads 145 serve also as the ground connection leads. The signal leads 142 and the ground connection leads 143 are arranged alternately. In this embodiment, since it is necessary to ensure a space in which the metal thin wires are extended, the die pad should not overlap the external terminals on the second row (inner side) in a plan view.

In the resin-encapsulated semiconductor device of this embodiment, the electrical characteristics are stabilized by providing the ground connection leads for grounding.

In the resin-encapsulated semiconductor device of this embodiment, since in LGAs as well as in QFNs or SONs, the length (size in the longitudinal direction) of the external terminal 144 is basically shorter than that of the metal thin wire 242, the high frequency characteristics are improved. In particular, in this embodiment, the signal leads 142 are surrounded by the ground connection leads 143, the suspended leads 145 and the die pad 146, the interference between high frequency signals can be reduced effectively during operation. As a result, the high frequency characteristics can be improved significantly, compared with the conventional resin-encapsulated semiconductor devices.

As described above, in the resin-encapsulated semiconductor device of this embodiment, the electrical characteristics are stabilized, and the high frequency characteristics are improved, so that it can be used preferably, for example, in equipment for communication systems employing high frequencies.

In this embodiment, the metal thin wires 242 are used as members for connecting the electrode pads 241a and the ground connection leads 143 and the signal leads 142, but metal bumps can be used instead. In this case, the semiconductor chip 241 is mounted in such a manner that the upper surface of the semiconductor chip 241 is opposed to the upper surface of the die pad 146.

In the resin-encapsulated semiconductor device of this embodiment, the lower surface of the portion excluding the central portion of the die pad 146 is exposed on the bottom surface of the device, but the lower surface of the die pad can be entirely exposed, or the entire die pad may not be exposed at all.

In the resin-encapsulated semiconductor device of this embodiment, all the ground connection leads 143 are connected to the electrode pads 241a for grounding, but when the number of the ground connection leads 143 is larger than that of the electrode pads 241a for grounding, extra ground connection leads 103 may be not connected to the electrode pads 241a, which does not affect the electrical characteristics.

In the resin-encapsulated semiconductor device of this embodiment, the ground connection leads 143 and the signal leads 142 are provided alternately, but the ground connection leads 143 may be arranged adjacent to the ground connection leads 143 in some portions. If at least one signal lead 142 is surrounded by the ground connection leads 143 and the die pad 146, the high frequency characteristics can be better than those of the conventional LGAs.

In the resin-encapsulated semiconductor device of this embodiment, the suspended leads 145 serve also as the ground connection leads 143, but the suspended leads 145 may not be connected to the electrode pads 241a for grounding.

In the resin-encapsulated semiconductor device of this embodiment, the bottom surface thereof is substantially quadrangular, but may be of other shapes.

In the resin-encapsulated semiconductor device of this embodiment, the external terminal 144 is elliptic, but can be of other shapes such as substantially a rectangle by changing the shape of the lead frame to be used.

In the resin-encapsulated semiconductor device of this embodiment, as shown in FIG. 26, the high frequency characteristics can be improved by crossing the metal thin wires 242.

—Variation of the Resin-Encapsulated Semiconductor Device of this Embodiment—

A variation of the resin-encapsulated semiconductor device of this embodiment in which the external terminals are arranged in three rows will be described.

FIGS. 42A and 42B are cross-sectional view showing the left half of a variation of a lead frame of a conventional LGA, a plan view showing a quarter of the lead frame of the variation of the conventional LGA, respectively, and FIGS. 42C and 42D are a cross-sectional view showing the left half of a lead frame used in a variation of the resin-encapsulated semiconductor device of this embodiment, and a plan view showing a quarter of the lead frame used in the variation of the resin-encapsulated semiconductor device of this embodiment, respectively. FIGS. 42A and 42C show the cross sections passing through the signal leads or the ground connection leads and the die pad. In order to make the structure of the resin-encapsulated semiconductor device provided with this lead frame clear, the members other than the lead frame are shown by dotted lines.

The lead frame of this variation has substantially the same structure of that of the lead frame of this embodiment, but is different in that the portions that serve as the external terminals 144 for the resin-encapsulated semiconductor device of the bottom portions of the signal leads 142 and the ground connection leads 143 are arranged in three rows. The external terminals on the third row (the nearest to the die pad) are terminals for grounding.

Figure 44A:
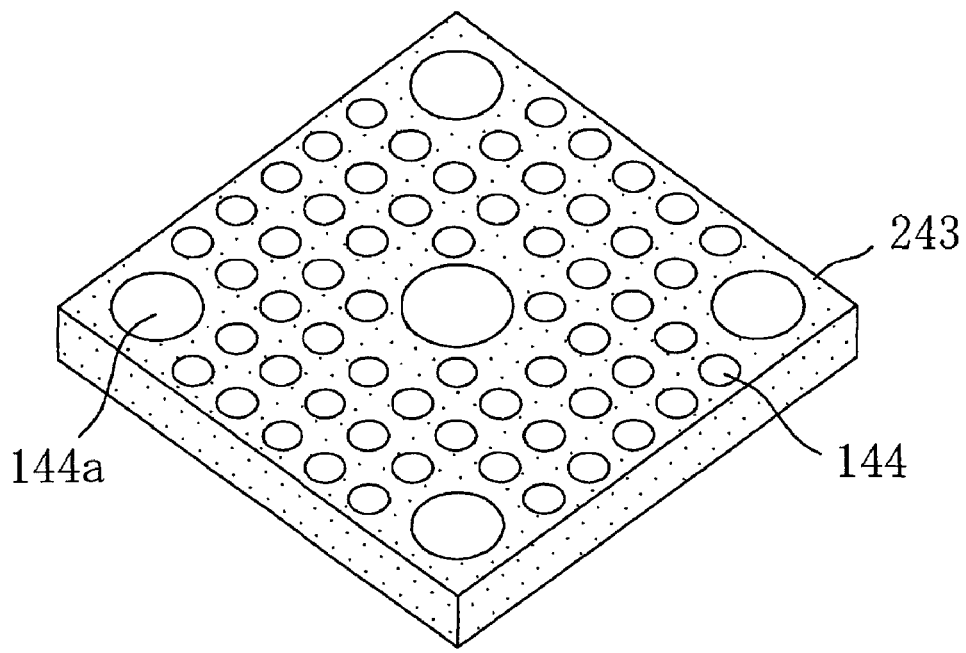
FIGS. 44A and 44B are a perspective view showing an appearance of a variation of the resin-encapsulated semiconductor device of the fourth embodiment and a plan view of the variation, respectively.
Figure 44B:
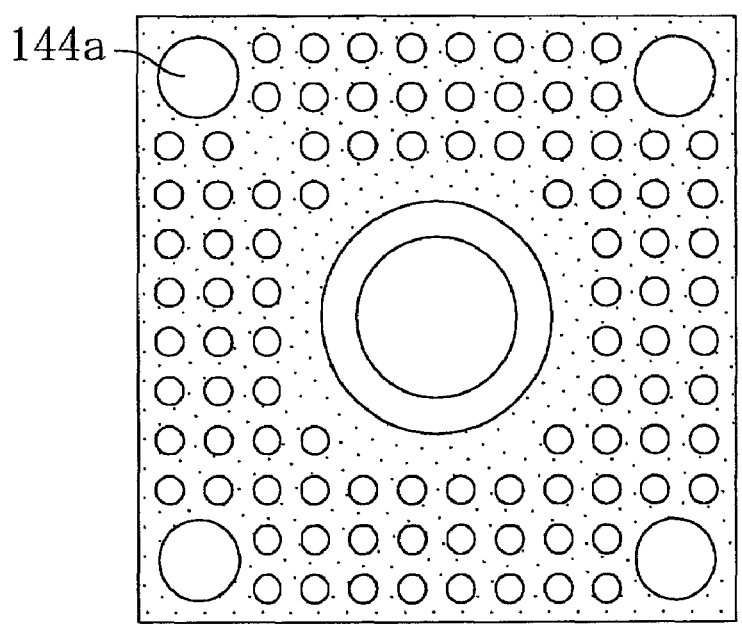
Figure 45A:
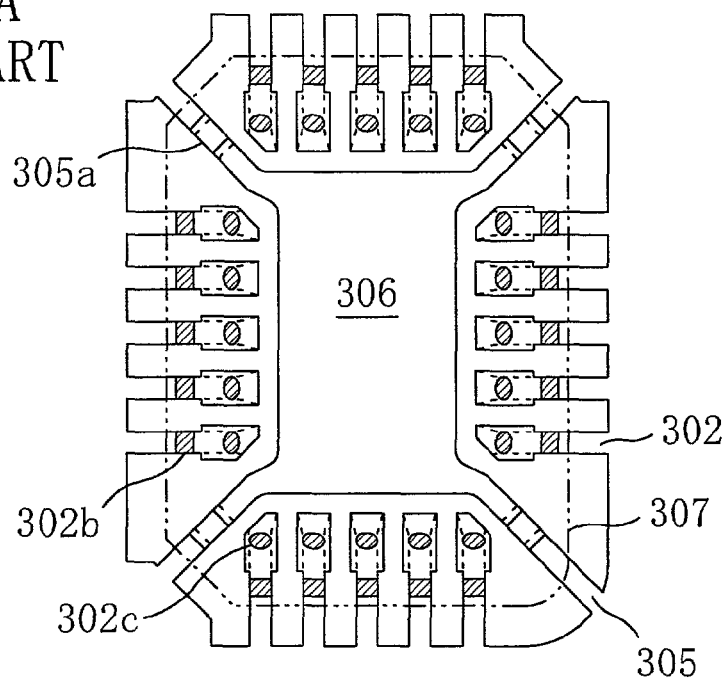
FIGS. 45A and 45B are views showing examples of the lead frame used in a conventional resin-encapsulated semiconductor device.
Figure 45B:
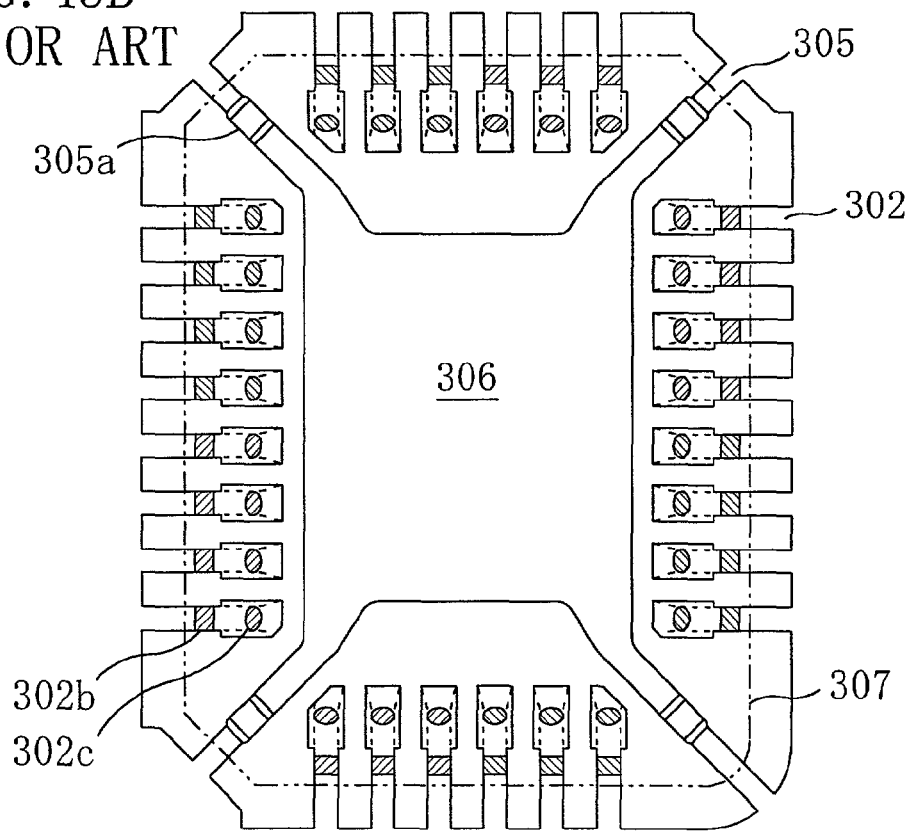
Figure 46A:
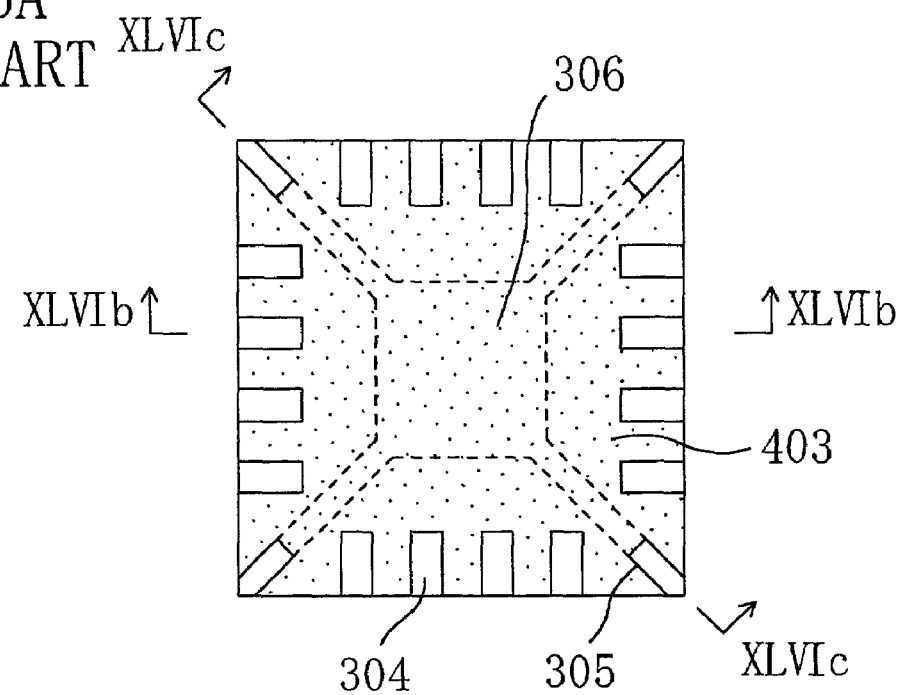
FIG. 46A is a plan view showing a conventional QFN.
Figure 46B:
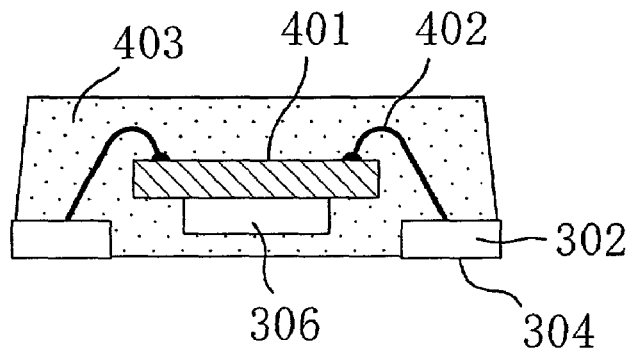
FIG. 46B is a cross-sectional view taken along line XLVIb-XLVIb of the conventional QFN.
Figure 46C:
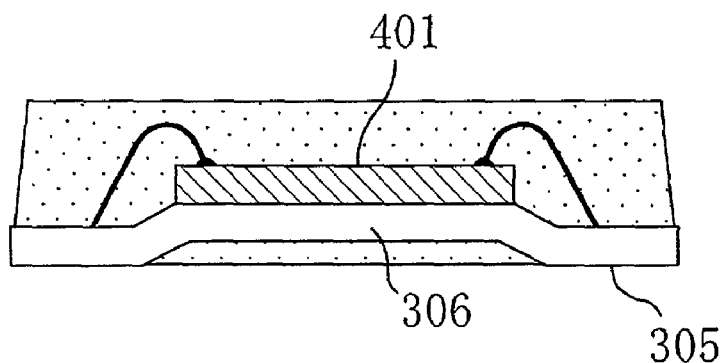
FIG. 46C is a cross-sectional view taken along line XLVIc-XLVIc of the conventional QFN.
Figure 47A:
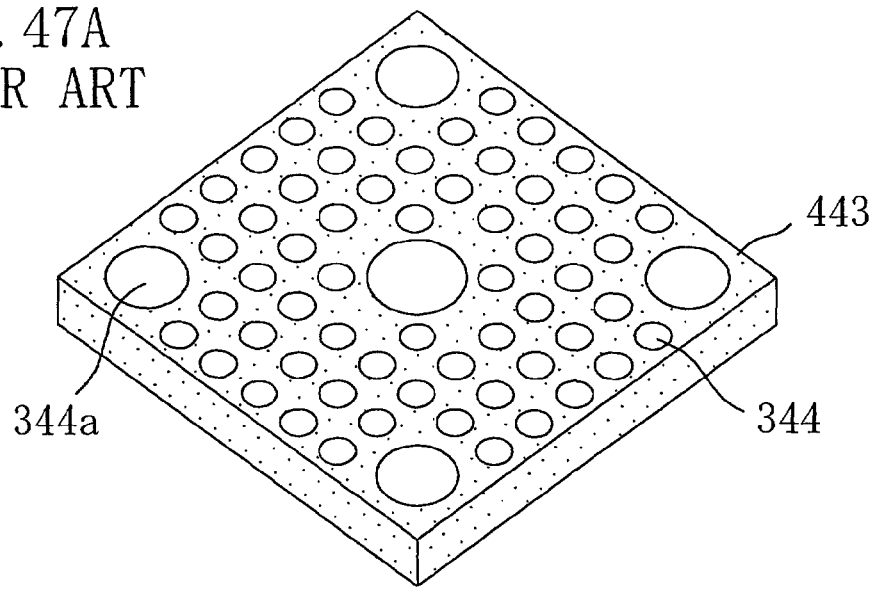
FIG. 47A is a perspective view showing an appearance of a conventional LGA.
Figure 47B:
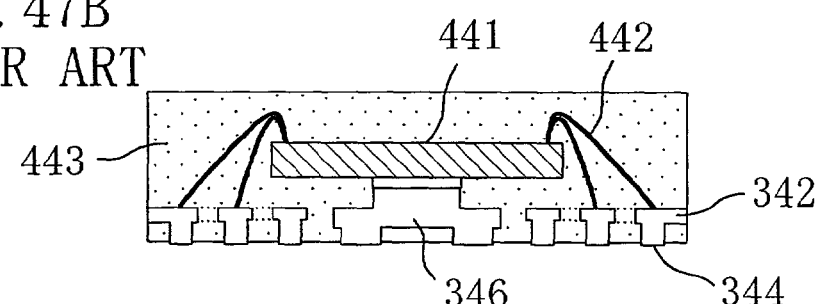
FIG. 47B is a cross-sectional view showing the structure of the conventional LGA.
Figure 47C:
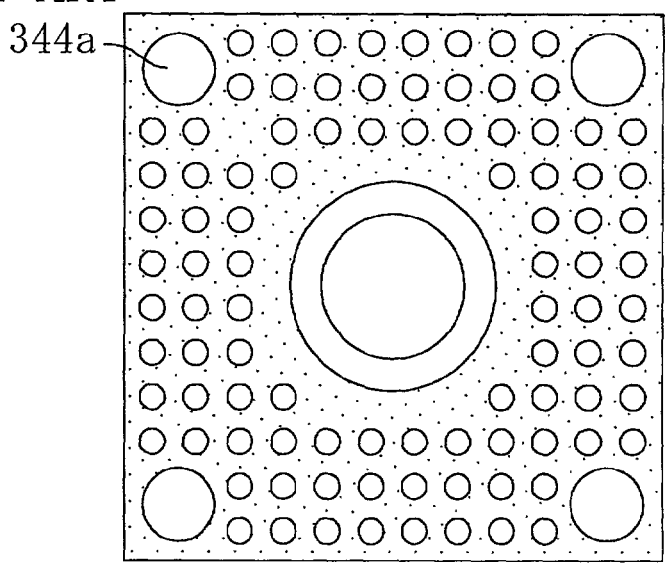
FIG. 47C is a plan view of the conventional LGA.

Next, FIG. 43 shows a plan view of a variation of the resin-encapsulated semiconductor device of this embodiment when viewed from the bottom, and a cross-sectional view of the variation. FIGS. 44A and 44B are a perspective view showing the appearance of the variation of the resin-encapsulated semiconductor device of this embodiment and a plan view of the variation when viewed from the bottom. In the plan view of FIG. 43, the signal leads 142, the ground connection leads 143, the suspended leads and the semiconductor chip 241 are transparently shown for clarification.

This variation is different from the resin-encapsulated semiconductor device of this embodiment in that the external terminals 144 that are arranged around the die pad are provided in three rows. Therefore, when compared with a resin-encapsulated semiconductor device of the same size, more external terminals can be provided in this variation. The structure other than the external terminals is the same as that of the resin-encapsulated semiconductor device of this embodiment shown in FIG. 41, and therefore description thereof will be omitted.

Also in this variation of this embodiment, the semiconductor chip 241 should have such a size that it does not overlap the external terminals 144 in the second row, but it may overlap the external terminals in the third row.

Thus, according to this variation, a resin-encapsulated semiconductor device having stable electrical characteristics, better high frequency characteristics and a large number of external terminals can be realized.

In this variation, the external terminals exposed on the bottom surface of the device are arranged in three rows, but the external terminals can be arranged in four or more rows by changing the shape of the lead frame to be used.

Also in this variation, metal bumps can be used instead of the metal thin wires 242.

What is claimed is:

1. A resin-encapsulated semiconductor device comprising:
a die pad;
a semiconductor chip mounted on an upper portion of the die pad;
first leads provided around the die pad;
at least a second lead supporting the die pad, wherein the number of first leads is greater than the number of second leads;
a metal wire connecting a top surface of one of the first leads and the semiconductor chip; and
an encapsulating resin for encapsulating the semiconductor chip, the die pad, and the first and second leads such that at least a portion of each bottom surface of the first and second leads is exposed from a bottom surface of the resin-encapsulated semiconductor device as first and second external terminals,
wherein on a side of the die pad, the first external terminal is provided parallel to the second external terminal,
the bottom surface of the second lead between the portion to be the second external terminal and the die pad is encapsulated so that each edge line, on the side of the die pad, of the first and second external terminals of the first and second leads forms a straight line,
distance between the second and the first external terminal is constant,
said first and second leads are provided on four sides surrounding the die pad, and at least one second lead is arranged on each of the four sides surrounding said die pad, and
all of each second lead are arranged parallel to an adjacent first lead.

2. The resin-encapsulated semiconductor device according to claim 1, wherein in the second lead, each thickness of portion existing between the portion to be the second external terminal and the die pad is thinner than that of portion to be the second external terminal.

3. The resin-encapsulated semiconductor device according to claim 2, wherein at least a portion of the die pad is exposed.

4. The resin-encapsulated semiconductor device according to claim 1, wherein the first leads are provided so as to sandwich at least one of the second leads.

5. The resin-encapsulated semiconductor device according to claim 1, wherein a width of the second external terminal lead is equal to a total width of a width of two of the first leads and a width between the two of the first leads next to each other.

6. The resin-encapsulated semiconductor device according to claim 1, wherein the resin-encapsulated semiconductor device is a high-frequency semiconductor device.

7. The resin-encapsulated semiconductor device according to claim 1, wherein each side surface of the first and second leads are flush with the side surface of the resin-encapsulated semiconductor device.

8. The resin-encapsulated semiconductor device according to claim 1, wherein the second lead between the portion to be the second external terminal and the die pad is bent upward.

9. The resin-encapsulated semiconductor device according to claim 8, wherein the die pad is located in a position higher than the first leads.

10. The resin-encapsulated semiconductor device according to claim 8, wherein at least a portion of an upper surface of the die pad is higher than an upper surface of the first leads by 0.03 mm or more and not more than ¾ of a thickness of the first leads.

11. The resin-encapsulated semiconductor device according to claim 8, wherein at least a portion of the die pad is exposed.

12. The resin-encapsulated semiconductor device according to claim 8, wherein a groove is formed in a rear portion of a rising portion for bending the second leads upwardly.

13. The resin-encapsulated semiconductor device according to claim 1, further including a second metal wire directly bonded to the top surface of the second lead at a point directly above the second external terminal.

14. A method for manufacturing a resin-encapsulated semiconductor device, the method comprising the steps of:
preparing a lead frame comprising a die pad, first leads provided around the die pad, and at least a second lead supporting the die pad and provided parallel to one of the first leads, wherein a number of first leads is greater than a number of second leads,
mounting a semiconductor chip on the die pad,
connecting a top surface of one of the first leads and the semiconductor chip with a metal wire,
locating the die pad in a position higher than the first leads by bending the second leads upwardly such that each edge line, on a side of the die pad, of first and second external terminals forms a straight line,
encapsulating the semiconductor chip, the die pad, and the first and second leads such that at least a portion of each bottom surface of the first and second leads is exposed at the bottom surface of the resin-encapsulated semiconductor device as first and second external terminals,
said first and second leads are provided on four sides surrounding the die pad, and at least one second lead is arranged on each of the four sides surrounding said die pad, and
all of each second lead are arranged parallel to an adjacent first lead.

15. The method according to claim 14, further including a second metal wire directly bonded to the top surface of the second lead at a point directly above the second external terminal.

16. A resin-encapsulated semiconductor device comprising:
a die pad;
a semiconductor chip mounted on an upper portion of the die pad;
first leads provided around the die pad;
at least a second lead supporting the die pad, wherein the number of first leads is greater than the number of second leads;
a metal wire connecting a top surface of one of the first leads and the semiconductor chip;
an encapsulating resin for encapsulating the semiconductor chip, the die pad, and the first and second leads such that at least a portion of each bottom surface of the first and second leads is exposed from a bottom surface of the resin-encapsulated semiconductor device as a first and second external terminal and each external terminal is flush with the bottom surface of the resin-encapsulated semiconductor device, wherein on a side of the die pad, the first external terminal is provided parallel to the second external terminal, the bottom surface of the second lead between the portion to be the second external terminal and the die pad is encapsulated so that each edge line, on the side of the die pad, of the first and second external terminals of the first and second leads forms a straight line, said first and second leads are provided on four sides surrounding the die pad, and at least one second lead is arranged on each of the four sides surrounding said die pad, and all of each second lead are arranged parallel to an adjacent first lead.

17. The resin-encapsulated semiconductor device according to claim 16, wherein each side surface of the first and second leads are flush with the side surface of the resin-encapsulated semiconductor device.

18. The resin-encapsulated semiconductor device according to claim 16, wherein in the second lead, each thickness of portion existing between the portion to be the first and second external terminals and the die pad is thinner than that of portion to be the second external terminal.

19. The resin-encapsulated semiconductor device according to claim 16, wherein the second lead between the portion to be the second external terminal and the die pad is bent upward.

20. The resin-encapsulated semiconductor device according to claim 16, further including a second metal wire directly bonded to the top surface of the second lead at a point directly above the second external terminal.

* * * * *